United States Patent
Wang et al.

(10) Patent No.: US 11,978,736 B2
(45) Date of Patent: May 7, 2024

(54) SEMICONDUCTOR DEVICE WITH IMPROVED DEVICE PERFORMANCE

(71) Applicant: Taiwan Semiconductor Manufacturing Company, Ltd., Hsin-Chu (TW)

(72) Inventors: Chih-Hao Wang, Baoshan Township (TW); Min Cao, Hsinchu (TW); Shang-Wen Chang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 75 days.

(21) Appl. No.: 17/734,379

(22) Filed: May 2, 2022

(65) Prior Publication Data

US 2022/0262798 A1 Aug. 18, 2022

Related U.S. Application Data

(62) Division of application No. 16/823,792, filed on Mar. 19, 2020, now Pat. No. 11,329,043.

(51) Int. Cl.

| *H01L 21/8238* | (2006.01) |
| *H01L 27/092* | (2006.01) |
| *H01L 29/06* | (2006.01) |
| *H01L 29/66* | (2006.01) |
| *H01L 29/78* | (2006.01) |

(52) U.S. Cl.
CPC .. *H01L 27/0924* (2013.01); *H01L 21/823821* (2013.01); *H01L 21/823878* (2013.01); *H01L 29/0673* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

2019/0214473 A1 7/2019 Xie et al.

OTHER PUBLICATIONS

Non-Final Office Action dated Aug. 20, 2021 for U.S. Appl. No. 16/823,792.
Notice of Allowance dated Jan. 12, 2022 for U.S. Appl. No. 16/823,792.

*Primary Examiner* — Joseph C. Nicely
*Assistant Examiner* — Lamont B Koo
(74) *Attorney, Agent, or Firm* — Eschweiler & Potashnik, LLC

(57) ABSTRACT

Various embodiments of the present disclosure are directed towards an integrated chip (IC). The IC includes a first fin projecting vertically from a semiconductor substrate. A second fin projects vertically from the semiconductor substrate, where the second fin is spaced from the first fin, and where the first fin has a first uppermost surface that is disposed over a second uppermost surface of the second fin. A nanostructure stack is disposed over the second fin and vertically spaced from the second fin, where the nanostructure stack comprises a plurality of vertically stacked semiconductor nanostructures. A pair of first source/drain regions is disposed on the first fin, where the first source/drain regions are disposed on opposite sides of an upper portion of the first fin. A pair of second source/drain regions is disposed on the second fin, where the second source/drain regions are disposed on opposite sides of the nanostructure stack.

20 Claims, 57 Drawing Sheets

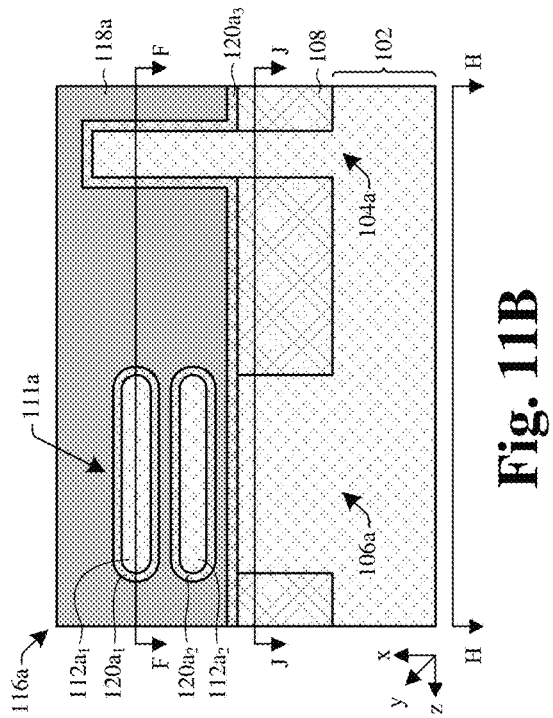
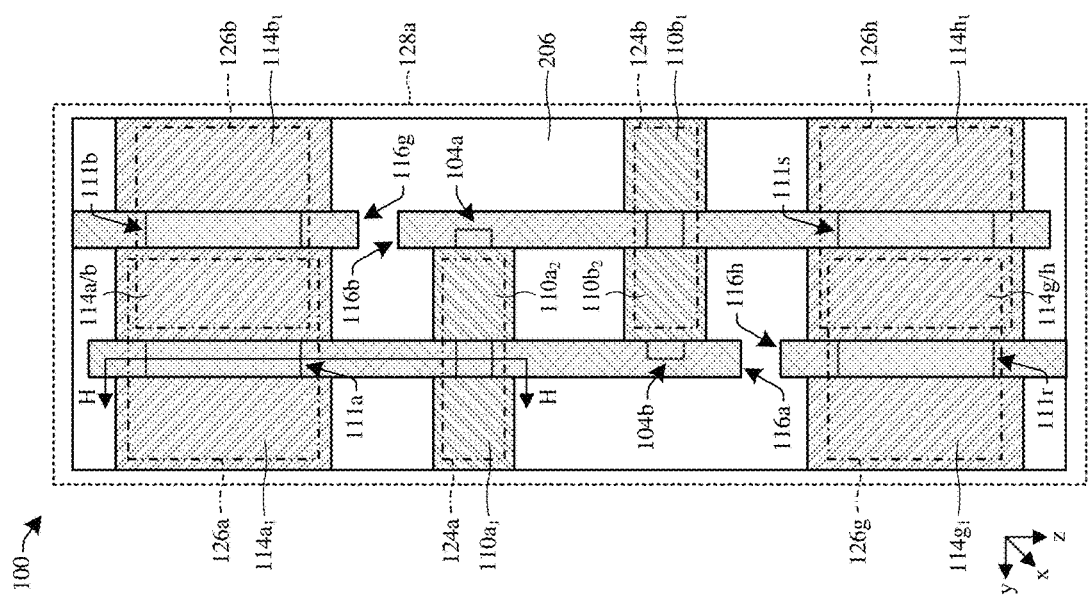
Fig. 11B
Fig. 11A

SEMICONDUCTOR DEVICE WITH IMPROVED DEVICE PERFORMANCE

REFERENCE TO RELATED APPLICATION

This application is a Divisional of U.S. application Ser. No. 16/823,792, filed on Mar. 19, 2020, the contents of which are hereby incorporated by reference in their entirety.

BACKGROUND

The integrated circuit (IC) manufacturing industry has experienced exponential growth over the last few decades. As ICs have evolved, sizes of semiconductor devices (e.g., an area of a complementary metal-oxide-semiconductor (CMOS) inverter) have been scaled down by, for example, reducing minimum feature sizes and/or reducing spacing between components of the semiconductor devices, which has increased device density (e.g., a number of semiconductor devices integrated in a given area). However, as the sizes of semiconductor devices continue to be scaled down, it is becoming increase difficult to improve device performance of the semiconductors devices (e.g., increase switching speed, reduce current imbalance, reduce read/write times, etc.) without negatively affecting the device density. Thus, advancements in the IC manufacturing industry that improve the device performance of the semiconductors devices without negatively impacting device density are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A-11B illustrate various simplified views of some other embodiments of the IC of FIGS. 2A-2C.

DETAILED DESCRIPTION

Figure 1A:
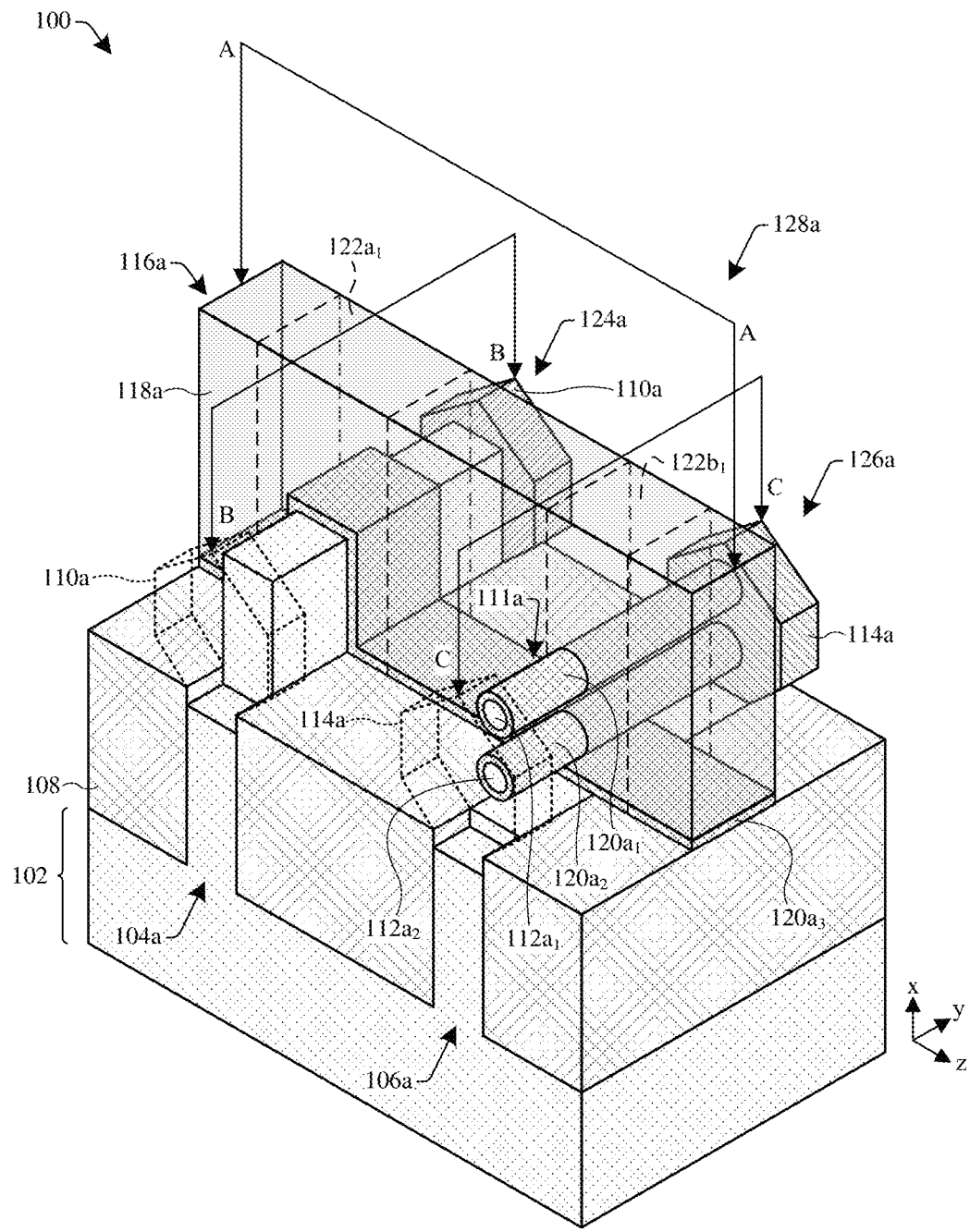
FIGS. 1A-1B illustrates isometric views of some embodiments of an integrated chip (IC) comprising a semiconductor device with improved device performance.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated chip (IC) comprises a semiconductor device (e.g., logic gate, inverter, latch, static random-access memory (SRAM), dynamic random-access memory (DRAM), etc.). The semiconductor device comprises a plurality of field-effect transistors (FETs). The plurality of FETs comprises n-channel FETs and p-channel FETs. The n-channel FETs and the p-channel FET are electrically coupled together in a predefined manner to form the semiconductor device. Typically, the FETs are all of a same technology. For example, all of the FETs of the semiconductor device may be fin field-effect transistor (FinFETs), all of the FETs of the semiconductor device may be gate-all-around FETs (GAAFETs), etc.

One challenge with the above semiconductor device is improving device performance (e.g., increased switching speed, reduced power consumption, reduced current imbalance, reduced read/write times, etc.) without negatively impacting device density and/or introducing unacceptable processing challenges (e.g., random source/drain merging). For example, in embodiments in which all of the FETs of the semiconductor device are GAAFETs, for a given size (e.g., area), the p-channel GAAFET may have a lower "ON" current ($I_{ON}$) (e.g., drain current) than the n-channel GAAFET, thereby resulting in a current imbalance between the p-channel GAAFET and the n-channel GAAFET that negatively impacts the device performance of the semiconductor device.

One partial solution to improve the device performance of the semiconductor device is to increase a width of the semiconductor nanostructures of the p-channel GAAFET in relation to a width of the semiconductor nanostructures of the n-channel GAAFET. However, such a partial solution negatively impacts device density and/or introduces unacceptable processing challenges (e.g., device density is negatively impacted by having to increase a spacing between the p-channel GAAFET and the n-channel GAAFET and/or unacceptable processing challenges are introduced due to having to reduce the spacing between the p-channel GAAFET and the n-channel GAAFET). Another partial solution is decreasing the width of the semiconductor nanostructures of the n-channel GAAFET in relation to the width of the semiconductor nanostructures of the p-channel GAAFET. However, such a partial solution negatively impacts device performance (e.g., decreases switching speed) due to the decreased width of the semiconductor nanostructure of the n-channel GAAFET reducing the $I_{ON}$ of the n-channel GAAFET.

Various embodiments of the present application are directed toward an integrated chip (IC) comprising a semiconductor device (e.g., an inverter) with improved device performance. The semiconductor device comprises a n-channel GAAFET and a p-channel FinFET. The n-channel GAAFET comprises a pair of first source/drain regions disposed over a semiconductor substrate. Further, the n-channel GAAFET comprises a semiconductor nanostructure spaced from the semiconductor substrate and extending between the first source/drain regions, where the semiconductor nanostructure has a first lattice orientation. The p-channel FinFET comprises a pair of second source/drain regions disposed over the semiconductor substrate and spaced from the first source/drain regions. Further, the p-channel FinFET comprises a semiconductor fin disposed over the semiconductor substrate and spaced from the semiconductor nanostructure, where the semiconductor fin extends between the second source/drain regions, and where the semiconductor fin has a second lattice orientation different than the first lattice orientation.

Because the semiconductor device comprises the n-channel GAAFET and the p-channel FinFET, and because the semiconductor nanostructure has the first lattice orientation and the semiconductor fin has the second lattice orientation, the semiconductor device has improved device performance. For example, the semiconductor device may have improved device performance (e.g., reduced current imbalance) due to the p-channel FinFET having a higher $I_{ON}$ than a p-channel GAAFET having a same size (e.g., area) of the p-channel FinFET (e.g., due to the second lattice orientation causing the p-channel FinFET to have a higher $I_{ON}$ than the p-channel GAAFET). Thus, due to the semiconductor device comprising the n-channel GAAFET and the p-channel FinFET, the device performance of the semiconductor device is improved over a semiconductor device having all GAAFETs (or all FinFETs) without negatively impacting device density and/or without introducing unacceptable processing challenges.

Figure 1B:
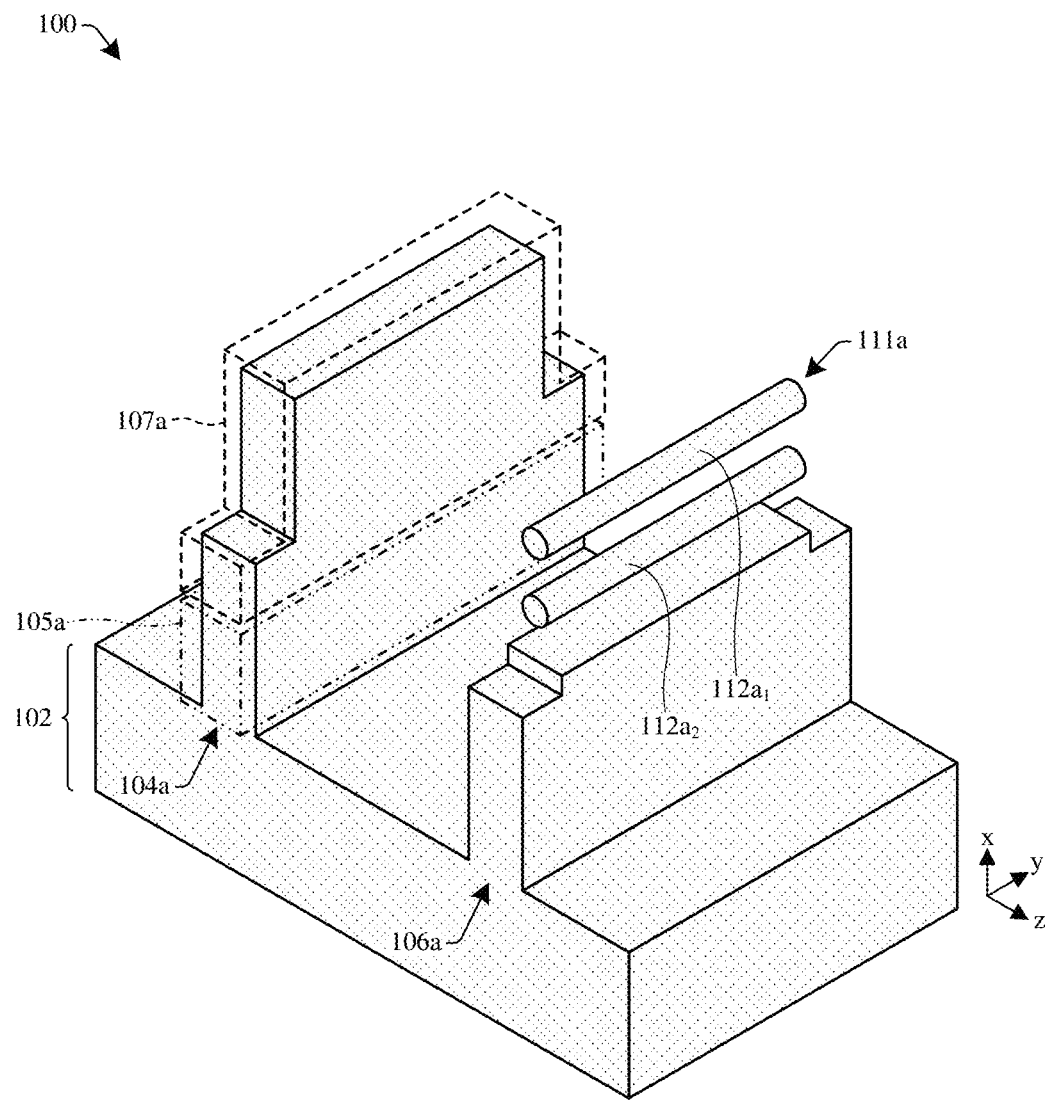

FIGS. 1A-1B illustrates isometric views of some embodiments of an integrated chip (IC) 100 comprising a semiconductor device with improved device performance. FIG. 1A illustrates an isometric view of some embodiments of the IC 100 comprising the semiconductor device with improved device performance. FIG. 1B illustrates an isometric view of the IC of FIG. 1A with various features of the IC of FIG. 1A removed (e.g., the isolation structure 108, the first source/drain regions 110, the second source/drain regions 114, the plurality of gate structures 116, the plurality of gate dielectric structures 120, etc.).

As shown in FIGS. 1A-1B, the IC 100 comprises a semiconductor substrate 102. The semiconductor substrate 102 may comprise any type of semiconductor body (e.g., monocrystalline silicon/CMOS bulk, silicon-germanium (SiGe), silicon on insulator (SOI), etc.). The semiconductor substrate 102 has a first lattice orientation (e.g., a first crystal plane of the semiconductor material of the semiconductor substrate). In some embodiments, the first lattice orientation may be, for example, (100), (110), or the like. In further embodiments, the first lattice orientation may be either (100) or (110).

A plurality of first fins 104 project vertically (in the "x" direction) from the semiconductor substrate 102 and extend laterally (in the "y" direction) across the semiconductor substrate 102. A plurality of second fins 106 also project vertically (in the "x" direction) from the semiconductor substrate 102 and extend laterally (in the "y" direction) across the semiconductor substrate 102. The first fins 104 and/or the second fins 106 may extend in parallel with one another (in the "y" direction). For example, a third fin 104a of the first fins 104 projects vertically (in the "x" direction) from the semiconductor substrate 102 and extends laterally (in the "y" direction) across the semiconductor substrate 102. A fourth fin 106a of the second fins 106 projects vertically (in the "x" direction) from the semiconductor substrate 102 and extends laterally (in the "y" direction) across the semiconductor substrate 102. The third fin 104a and the fourth fin 106a extend laterally in parallel with one another (in the "y" direction).

The first fins 104 may be or comprise, for example, silicon (Si), germanium (Ge), silicon-germanium (SiGe), some other semiconductor material, or a combination of the foregoing. The second fins 106 may be or comprise, for example, Si, Ge, SiGe, some other semiconductor material, or a combination of the foregoing. In some embodiments, the first fins 104 and the second fins 106 may be referred to as semiconductor fins.

An isolation structure 108 is disposed over the semiconductor substrate 102 and between the first fins 104 and the second fins 106. The isolation structure 108 electrically isolations the first fins 104 and the second fins 106 from one another. In some embodiments, the isolation structure 108 may comprise, for example, an oxide (e.g., silicon dioxide ($SiO_2$)), a nitride (e.g., silicon nitride (SiN)), an oxy-nitride (e.g., silicon oxy-nitride ($SiO_XN_Y$)), some other dielectric material, or a combination of the foregoing. The isolation structure 108 may be a multi-layered structure, for example, comprising one or more liner layers.

The first fins 104 extend vertically (in the "x" direction) though the isolation structure 108 and over an upper surface of the isolation structure 108, such that upper surfaces of the first fins 104 are disposed over the upper surface of the isolation structure 108. The second fins 106 extend (in the "x" direction) though the isolation structure 108. In some embodiments, upper surfaces of the second fins 106 and the upper surface of the isolation structure 108 are substantially co-planar. In other embodiments, the upper surfaces of the second fins 106 are disposed above (or below) the upper surface of the isolation structure 108. The upper surfaces of the second fins 106 are disposed below the upper surfaces of the first fins 104. In further embodiments, the upper surface of the first fins 104 correspond to uppermost surfaces of the first fins 104, and/or the upper surfaces of the second fins 106 correspond to uppermost surfaces of the fourth fin 106a.

The first fins 104 have lower portions 105 and upper portions 107. The upper portions 107 are disposed over the lower portions 105. The lower portions 105 extend (in the "x" direction) from the semiconductor substrate 102 to the upper portions 107. The upper portions 107 have a second lattice orientation (e.g., a second crystal plane of the semiconductor material of the upper portions), and the lower portions 105 have a third lattice orientation (e.g., a third crystal plane of the semiconductor material of the lower portions). For example, the third fin 104a has a first lower portion 105a and a first upper portion 107a disposed over the first lower portion 105a. The first lower portion 105a extends (in the "x" direction) from the semiconductor substrate 102 to the first upper portion 107a. The first upper portion 107a has the second lattice orientation, and the first lower portion 105a has the third lattice orientation.

The second lattice orientation may be, for example, (100), (110), or the like. In some embodiments, the second lattice orientation may be either (100) or (110). The second lattice orientation is different than the first lattice orientation. For example, the first lattice orientation is (100) and the second lattice orientation is (110), or vice versa. The third lattice orientation may be, for example, (100), (110), or the like. In some embodiments, the third lattice orientation may be either (100) or (110). In further embodiments, the third lattice orientation is different than the second lattice orientation. In yet further embodiments, the third lattice orientation is the same as the first lattice orientation. For example, both the first lattice orientation and the third lattice orientation are (100).

Pairs of first source/drain regions 110 are disposed on/over the first fins 104. For example, a first pair 110a of the first source/drain regions 110 is disposed on/over the third fin 104a. The first source/drain regions 110 of the first pair 110a are laterally spaced (in the "y" direction) and disposed on opposite sides of the first upper portion 107a. In some embodiments, the first source/drain regions 110 may be or comprise, for example, Si, Ge, SiGe, silicon carbide (SiC), some other semiconductor material, or a combination of the foregoing. In further embodiments, the first source/drain regions 110 may be or comprise an epitaxial semiconductor material (e.g., a semiconductor material formed by an epitaxial process, such as epitaxial Si, epitaxial Ge, epitaxial SiGe, epitaxial SiC, etc.).

A first plurality of selectively-conductive channels (not shown) are disposed in the upper portions 107 of the first fins 104. The first plurality of selectively-conductive channels extend (in the "y" direction) between the pairs of first source/drain regions 110. For example, a first selectively-conductive channel is disposed in the first upper portion 107a and extends (in the "y" direction) between the first source/drain regions 110 of the first pair 110a.

A plurality of nanostructure stacks 111 are disposed over the second fins 106. For example, a first nanostructure stack 111a is disposed over the fourth fin 106a. The nanostructure stacks 111 comprise a plurality of nanostructures 112 that are vertically stacked over one another (in the "x" direction). For example, the first nanostructure stack 111a comprises a first plurality of nanostructures 112a. The first plurality of nanostructures 112a comprises a first nanostructure 112a$_1$ and a second nanostructure 112a2. The first nanostructure 112a$_1$ is disposed over the fourth fin 106a, and the second nanostructure 112a$_2$ is disposed over the fourth fin 106a and between the first nanostructure 112a$_1$ and the fourth fin 106a. The first nanostructure 112a$_1$ is vertically stacked (in the "x" direction) over the second nanostructure 112a2.

In some embodiments, the nanostructure stacks 111 are spaced (in the "x" direction) from the second fins 106. In further embodiments, the nanostructures of the plurality of nanostructures 112 are spaced from one another (in the "x" direction). For example, the first nanostructure stack 111a is spaced (in the "x" direction) from the upper surface of the fourth fin 106a, and the first nanostructure 112a$_1$ is spaced from the second nanostructure 112a$_2$ (in the "x" direction).

In some embodiments, the plurality of nanostructures 112 comprises between two and twenty nanostructures. For example, the first plurality of nanostructures 112a comprises two nanostructures (the first nanostructure 112a$_1$ and the second nanostructure 112a2). The plurality of nanostructures 112 may be or comprise, for example, Si, Ge, SiGe, some other semiconductor material, or a combination of the foregoing. In further embodiments, the nanostructures of the plurality of nanostructures 112 may be referred to as semiconductor nanostructures.

The plurality of nanostructures 112 have a fourth lattice orientation (e.g., a fourth crystal plane of the semiconductor material of the nanostructures). For example, the first nanostructure 112a$_1$ has the fourth lattice orientation, and the second nanostructure 112a$_2$ has the fourth lattice orientation. The fourth lattice orientation may be, for example, (100), (110), or the like. In some embodiments, the fourth lattice orientation may be either (100) or (110). The fourth lattice orientation is different than the second lattice orientation. In further embodiments, the fourth lattice orientation is the same as the first lattice orientation and/or the third lattice orientation. For example, the first lattice orientation is (100), the second lattice orientation is (110), the third lattice orientation is (100), and the fourth lattice orientation is (100). In other embodiments, the first lattice orientation is (110), the second lattice orientation is (100), the third lattice orientation is (110), and the fourth lattice orientation is (110).

Pairs of second source/drain regions 114 are disposed on/over the second fins 106. For example, a second pair 114a of the second source/drain regions 114 is disposed on/over the fourth fin 106a. The second source/drain regions 114 of the second pair 114a are laterally spaced (in the "y" direction) and disposed on opposite sides of the first plurality of nanostructures 112a. For example, the second source/drain regions 114 of the second pair 114a are disposed on opposite sides of the first nanostructure 112a$_1$ and opposite sides of the second nanostructure 112a2.

The second source/drain regions 114 may be or comprise, for example, Si, Ge, SiGe, SiC, some other semiconductor material, or a combination of the foregoing. In some embodiments, the second source/drain regions 114 may be or comprise an epitaxial semiconductor material (e.g., a semiconductor material formed by an epitaxial process, such as epitaxial Si, epitaxial Ge, epitaxial SiGe, epitaxial SiC, etc.). In further embodiments, the second source/drain regions 114 may be or comprise a same (or different) semiconductor material than the first source/drain regions 110.

A second plurality of selectively-conductive channels (not shown) are disposed in the nanostructures of the plurality of nanostructures 112. The second plurality of selectively-conductive channels extend (in the "y" direction) between the pairs of second source/drain regions 114. For example, a second selectively-conductive channel is disposed in the first nanostructure 112a$_1$, and a third selectively-conductive channel is disposed in the second nanostructure 112a$_2$. The second selectively-conductive channel and the third selectively-conductive channel extend (in the "y" direction) between the second source/drain regions 114 of the second pair 114a.

A plurality of gate structures 116 are disposed over the isolation structure 108, the first fins 104, and the second fins 106. The gate structures 116 are disposed between the pairs of the first source/drain regions 110 and/or the pairs of the second source/drain regions 114. The gate structures 116 engage the first fins 104 and/or the nanostructure stacks 111. In some embodiments, the gate structures 116 may engage the upper surfaces of the second fins 106. In further embodiments, the gate structures 116 extend continuously (in the "z" direction) across the isolation structure 108, over the first fins 104, over the second fins 106, and around the plurality of nanostructures 112. In further embodiments, the gate structures 116 extends continuously (in the "z" direction) between the pairs of first source/drain regions 110 and the pairs of second source/drain regions 114.

For example, a first gate structure 116a of the gate structures 116 is disposed over the isolation structure 108, the third fin 104a, and the fourth fin 106a. The first gate structure 116a engages three sides of the third fin 104a (e.g., opposite sidewalls and the upper surface of the third fin 104a), engages the upper surface of the fourth fin 106a, and engages the first nanostructure stack 111a. The first gate structure 116a extends continuously (in the "z" direction) across the isolation structure 108, over the third fin 104a, over the fourth fin 106a, and around the nanostructures of the first plurality of nanostructures 112a. The first gate structure 116a extends continuously (in the "z" direction) between the first source/drain regions 110 of the first pair 110a and the second source/drain regions 114 of the second pair 114a.

The gate structures 116 comprise a plurality of gate electrode structures 118 and a plurality of gate dielectric structures 120. The gate electrode structures 118 are disposed over the gate dielectric structures 120. The gate dielectric structures 120 separate the gate electrode structures 118 from the first fins 104 and the plurality of nanostructures 112. In some embodiments, the gate dielectric structures 120 separate the gate electrode structures 118 from the second fins 106. In further embodiments, the gate electrode structures 118 extend continuously (in the "z" direction) over the first fins 104, over the second fins 106, and around the nanostructures of the plurality of nanostructures 112.

For example, the first gate structure 116a comprises a first gate electrode structure 118a of the gate electrode structures 118 and a first gate dielectric structure 120a of the gate dielectric structures 120. The first gate electrode structure 118a is disposed over the first gate dielectric structure 120a. The first gate electrode structure 118a extends continuously (in the "z" direction) over the third fin 104a, over the fourth fin 106a, and around the nanostructures of the first plurality of nanostructures 112a. The first gate dielectric structure 120a separates the first gate electrode structure 118a from the third fin 104a, the fourth fin 106a, and the nanostructures of the first plurality of nanostructures 112a. The first gate dielectric structure 120a contacts the third fin 104a, the fourth fin 106a, and the nanostructures of the first plurality of nanostructures 112a.

In some embodiments, the first gate dielectric structure 120a comprises a first portion $120a_1$ of the first gate dielectric structure 120a, a second portion $120a_2$ of the first gate dielectric structure 120a, and a third portion $120a_3$ of the first gate dielectric structure 120a. The first portion $120a_1$ of the first gate dielectric structure 120a wraps continuously around the first nanostructure $112a_1$ and separates the first gate electrode structure 118a from the first nanostructure $112a_1$. In some embodiments, the first portion $120a_1$ of the first gate dielectric structure 120a extends continuously (in the "y" direction) between the second source/drain regions 114 of the second pair 114a.

The second portion $120a_2$ of the first gate dielectric structure 120a wraps continuously around the second nanostructure $112a_2$ and separates the first gate electrode structure 118a from the second nanostructure 112a2. In some embodiments, the second portion $120a_2$ of the first gate dielectric structure 120a extends continuously (in the "y" direction) between the second source/drain regions 114 of the second pair 114a. In further embodiments, first portion $120a_1$ and the second portion $120a_2$ of the first gate dielectric structure 120a are spaced from one another (in the "x" direction). In such embodiments, a first section of the first gate electrode structure 118a is disposed between the first portion $120a_1$ and the second portion $120a_2$ of the first gate dielectric structure 120a. In other embodiments, the first portion $120a_1$ and the second portion $120a_2$ of the first gate dielectric structure 120a may contact one another (or merge together) between the first nanostructure $112a_1$ and the second nanostructure 112a2. In such embodiments, the first portion $120a_1$ and the second portion $120a_2$ of the first gate dielectric structure 120a may be regions of a fourth portion of the first gate dielectric structure 120a.

The third portion $120a_3$ of the first gate dielectric structure 120a extends continuously (in the "z" direction) between the first nanostructure stack 111a and the fourth fin 106a, across the isolation structure 108, and up and over the third fin 104a. In some embodiments, the third portion $120a_3$ of the first gate dielectric structure 120a engages the third fin 104a on three sides. The third portion $120a_3$ of the first gate dielectric structure 120a separates the first gate electrode structure 118a from the isolation structure 108, the third fin 104a, and the fourth fin 106a. In some embodiments, the third portion $120a_3$ of the first gate dielectric structure 120a contacts the upper surface of the fourth fin 106a.

In some embodiments, the third portion $120a_3$ of the first gate dielectric structure 120a is spaced (in the "x" direction) from the second portion $120a_2$ of the first gate dielectric structure 120a. In such embodiments, a second section of the first gate electrode structure 118a is disposed between the second portion $120a_2$ and the third portion $120a_3$ of the first gate dielectric structure 120a. In other embodiments, the third portion $120a_3$ and the second portion $120a_2$ of the first gate dielectric structure 120a may contact one another (or merge together) between the second nano structure $112a_2$ and the fourth fin 106a. It will be appreciated that, in some embodiments, each of the gate dielectric structures 120 may each comprise a first portion, a second portion, and/or a third portion. It will further be appreciated that the first portions, the second portions, and the third portions of each of the gate dielectric structures 120 may comprise similar features (e.g., structural features) as the first portion $120a_1$, the second portion 120a2, and the third portion $120a_3$ of the first gate dielectric structure 120a.

The gate structures 116 comprise a plurality of gates 122. The plurality of gates 122 comprises one or more first gates 122a and/or one or more second gates 122b. The first gates 122a comprise portions of the gate structures 116 disposed between a pair of the first source/drain regions 110. The second gates 122b comprise portions of the gate structures 116 disposed between a pair of the second source/drain regions 114.

For example, the first gate structure 116a comprises a third gate 122$a_1$ and a fourth gate 122b1. The third gate 122$a_1$ is one of the first gates 122a, and the fourth gate 122b1 is one of the second gates 122b. The third gate 122$a_1$ comprises a fifth portion of the first gate structure 116a that is disposed between the first source/drain regions 110 of the first pair 110a. More specifically, the third gate 122$a_1$ comprises a third section of the third portion 120$a_3$ of the first gate dielectric structure 120a and a fourth section of the first gate electrode structure 118a, both of which are directly disposed between the first source/drain regions 110 of the first pair 110a. The fourth gate 122b1 comprises a sixth portion of the first gate structure 116a that is disposed between the second source/drain regions 114 of the second pair 114a. More specifically, the fourth gate 122b1 comprises a fifth section of the third portion 120$a_3$ of the first gate dielectric structure 120a and a sixth section of the first gate electrode structure 118a, both of which are directly disposed between the second source/drain regions 114 of the second pair 114a, and comprises the first portion 120$a_1$ and the second portion 120$a_2$ of the first gate dielectric structure 120a.

The third gate 122$a_1$ may be electrically coupled to the fourth gate 122b1 by other portions of the first gate structure 116a. For example, a seventh section of the first gate electrode structure 118a, which continuously extends (in the "z" direction) between the fourth section and the sixth section of the first gate electrode structure 118a, may electrically couple the third gate 122$a_1$ to the fourth gate 122b1. It will be appreciated that, rather than the gate structures 116 comprising the plurality of gates 122, one or more of the gate structures 116 may comprise one gate of the plurality of gates 122 (e.g., one of the first gates 122a or one of the second gates 122b). For example, the first gate structure 116a may comprise the third gate 122$a_1$, and a different gate structure of the gate structures 116 may comprise the fourth gate 122b1. In such embodiments, the first gate structure 116a is separated from the different gate structure of the gate structures 116 by a dielectric structure (e.g., by an interlayer dielectric structure).

The first gates 122a are configured to control a conductivity of the selectively-conductive channels of the first plurality of selectively-conductive channels (e.g., switch between one or more conducting states and a non-conducting state). The second gates 122b are configured to control a conductivity of the selectively-conductive channels of the second plurality of selectively-conductive channels. For example, the third gate 122$a_1$ is configured to control the conductivity of the first selectively-conductive channel, and the fourth gate 122b1 is configured to control the conductivity of the second and third selectively-conductive channels.

Further, the IC 100 comprises a plurality of fin field-effect transistors (FinFETs) 124 and a plurality of gate-all-around field-effect transistors (GAAFETs) 126. The plurality of FinFETs 124 and the plurality of GAAFETs 126 are disposed over the semiconductor substrate 102. For example, the plurality of FinFETs 124 comprises a first FinFET 124a disposed over the semiconductor substrate 102, and the plurality of GAAFETs 126 comprises a first GAAFET 126a disposed over the semiconductor substrate 102.

The plurality of FinFETs 124 comprise the upper portions 107 of the first fins 104, the pairs of the first source/drain regions 110, and the first gates 122a. For example, the first FinFET 124a comprises the first upper portion 107a of the third fin 104a (and thus the first selectively-conductive channel), the first source/drain regions 110 of the first pair 110a, and the third gate 122$a_1$. The plurality of GAAFETs 126 comprise the plurality of nanostructure stacks 111, the pairs of the second source/drain regions 114, and the second gates 122b. For example, the first GAAFET 126a comprises the first nanostructure stack 111a (and thus the second and third selectively-conductive channels), the second source/drain regions 114 of the second pair 114a, and the fourth gate 122b1.

In some embodiments, each of the plurality of FinFETs 124 are a p-channel FinFET and each of the plurality of GAAFETs 126 are a n-channel GAAFET. In such embodiments, the first lattice orientation may be (100). In other embodiments, each of the plurality of FinFETs 124 are a n-channel FinFET and each of the plurality of GAAFETs 126 are a p-channel GAAFETs. In such embodiments, the first lattice orientation may be (110).

A plurality of semiconductor devices 128 are disposed on/over the IC 100. The plurality of semiconductor devices 128 comprise one or more of the plurality of FinFETs 124 and/or one or more of the plurality of GAAFETs 126. The plurality of semiconductor devices 128 may be or comprise, for example, logic gates, inverters, latches, memory devices (e.g., a static random-access memory (SRAM), dynamic random-access memory (DRAM), etc.), some other semiconductor device, or a combination of the foregoing. In some embodiments, the plurality of semiconductor devices 128 may be or comprise complementary metal-oxide-semiconductor (CMOS) devices, such as CMOS inverters, CMOS logic gates, some other CMOS device, or a combination of the foregoing.

For example, a first semiconductor device 128a of the plurality of semiconductor devices 128 is disposed on/over the IC 100. The first semiconductor device 128a comprises the first FinFET 124a and the first GAAFET 126a. In some embodiments, the first FinFET 124a may be electrically coupled to first GAAFET 126a, such that the first semiconductor device 128a is a CMOS device (e.g., CMOS inverter).

Because the first semiconductor device 128a comprises the first FinFET 124a and the first GAAFET 126a, and because the first upper portion 107a of the third fin 104a has the second lattice orientation and the first plurality of nanostructures 112a have the fourth lattice orientation, the semiconductor device 128a has improved device performance (e.g., increased switching speed, reduced power consumption, reduced current imbalance, reduced read/write times, etc.) over a baseline semiconductor device comprising all GAAFETs (or all FinFETs) and having a same size (e.g., area) as the first semiconductor device 128a. For example, the baseline semiconductor device comprises a baseline p-channel field-effect transistor (FET) and a baseline n-channel FET. In comparison to the baseline semiconductor device, the first semiconductor device 128a has better device performance than the baseline semiconductor device.

The first semiconductor device 128a may have improved device performance over the baseline semiconductor device due to an $I_{ON}$ of the first FinFET 124a and an $I_{ON}$ of the first GAAFET 126a being more balanced than an $I_{ON}$ of the baseline p-channel FET and an $I_{ON}$ of the baseline n-channel FET (e.g., having less current imbalance than the baseline semiconductor device). For example, if the first lattice orientation is (100), the first FinFET 124a is a p-channel FinFET, the first GAAFET 126a is an n-channel GAAFET, the baseline p-channel FET is a p-channel GAAFET, and the baseline n-channel FET is an n-channel GAAFET, the first FinFET 124a has a higher $I_{ON}$ than the baseline p-channel FET due to the first upper portion 107a having the second lattice orientation (e.g., due to such a lattice orientation improving the $I_{ON}$ of a p-channel FinFET over a p-channel GAAFET). Thus, the first semiconductor device 128a has improved device performance over the baseline semiconductor device (e.g., less current imbalance than the baseline semiconductor device).

The first semiconductor device 128a may have improved device performance over the baseline semiconductor device due to the $I_{ON}$ of the first GAAFET 126a being greater than the $I_{ON}$ of the baseline n-channel FET (e.g., having faster switching speeds than the baseline semiconductor device). For example, if the first lattice orientation is (100), the first FinFET 124a is a p-channel FinFET, the first GAAFET 126a is an n-channel GAAFET, the baseline p-channel FET is a p-channel FinFET, and the baseline n-channel FET is an n-channel FinFET, the first GAAFET 126a has a higher $I_{ON}$ than the baseline n-channel FET due to the first plurality of nanostructures 112a having the fourth lattice orientation (e.g., due to such a lattice orientation improving the $I_{ON}$ of a n-channel GAAFET over an n-channel FinFET). Thus, the first semiconductor device 128a has improved device performance over the baseline semiconductor device (e.g., faster switching speeds than the baseline semiconductor device).

Further, the first semiconductor device 128a has improved device performance over the baseline semiconductor device without negatively impacting device density and/or without introducing unacceptable processing challenges. For example, to improve the device performance of the baseline semiconductor device, a size (e.g., area) of the p-channel FET may need to be increased in relation to a size of the n-channel FET. However, increasing the size of the p-channel FET negatively impacts device density and/or introduces unacceptable processing challenges (e.g., random source/drain merging). For example, if the size of the p-channel FET is increased while maintaining a same device density, a spacing between the baseline p-channel FET and the baseline n-channel FET would be reduced, thereby causing random source/drain merging that negatively affects yield. If the size of the p-channel FET is increased while maintaining a "safe" spacing between the baseline p-channel FET and the baseline n-channel FET, the space the baseline memory device takes up on an IC will increase, thereby negatively affecting device density. Thus, the first semiconductor device 128a has improved device performance over the baseline semiconductor device without negatively impacting device density and/or without introducing unacceptable processing challenges.

If the first lattice orientation is (110), it will be appreciated that, based on similar reasoning as above, the first semiconductor device 128a has improved device performance over the baseline semiconductor device. For example, if the first lattice orientation is (110), the first FinFET 124a is an n-channel FinFET, the first GAAFET 126a is a p-channel GAAFET, the baseline p-channel FET is a p-channel GAAFET, and the baseline n-channel FET is an n-channel GAAFET, the first FinFET 124a has a higher $I_{ON}$ than the baseline n-channel FET due to the first upper portion 107a having the second lattice orientation (e.g., due to such a lattice orientation improving the $I_{ON}$ of an n-channel FinFET over an n-channel GAAFET). If the lattice orientation is (110), the first FinFET 124a is an n-channel FinFET, the first GAAFET 126a is a p-channel GAAFET, the baseline p-channel FET is a p-channel FinFET, and the baseline n-channel FET is an n-channel FinFET, the first GAAFET 126a has a higher $I_{ON}$ than the baseline p-channel FET due to the first plurality of nanostructures 112a having the fourth lattice orientation (e.g., due to such a lattice orientation improving the $I_{ON}$ of a p-channel GAAFET over a p-channel FinFET).

Figure 2A:
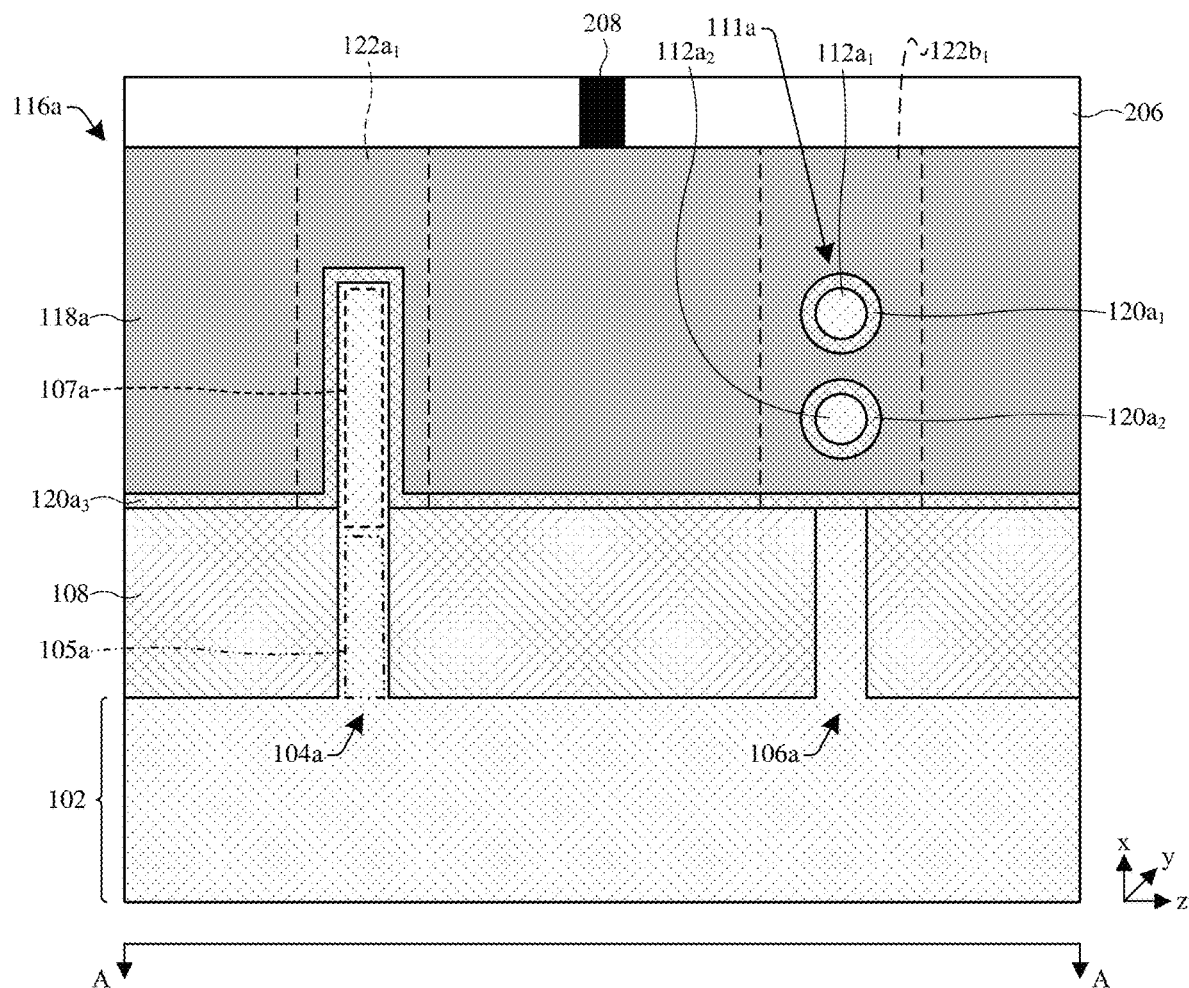
FIGS. 2A-2C illustrate cross-sectional views of some embodiments of the IC of FIGS. 1A-1B.
Figure 2B:
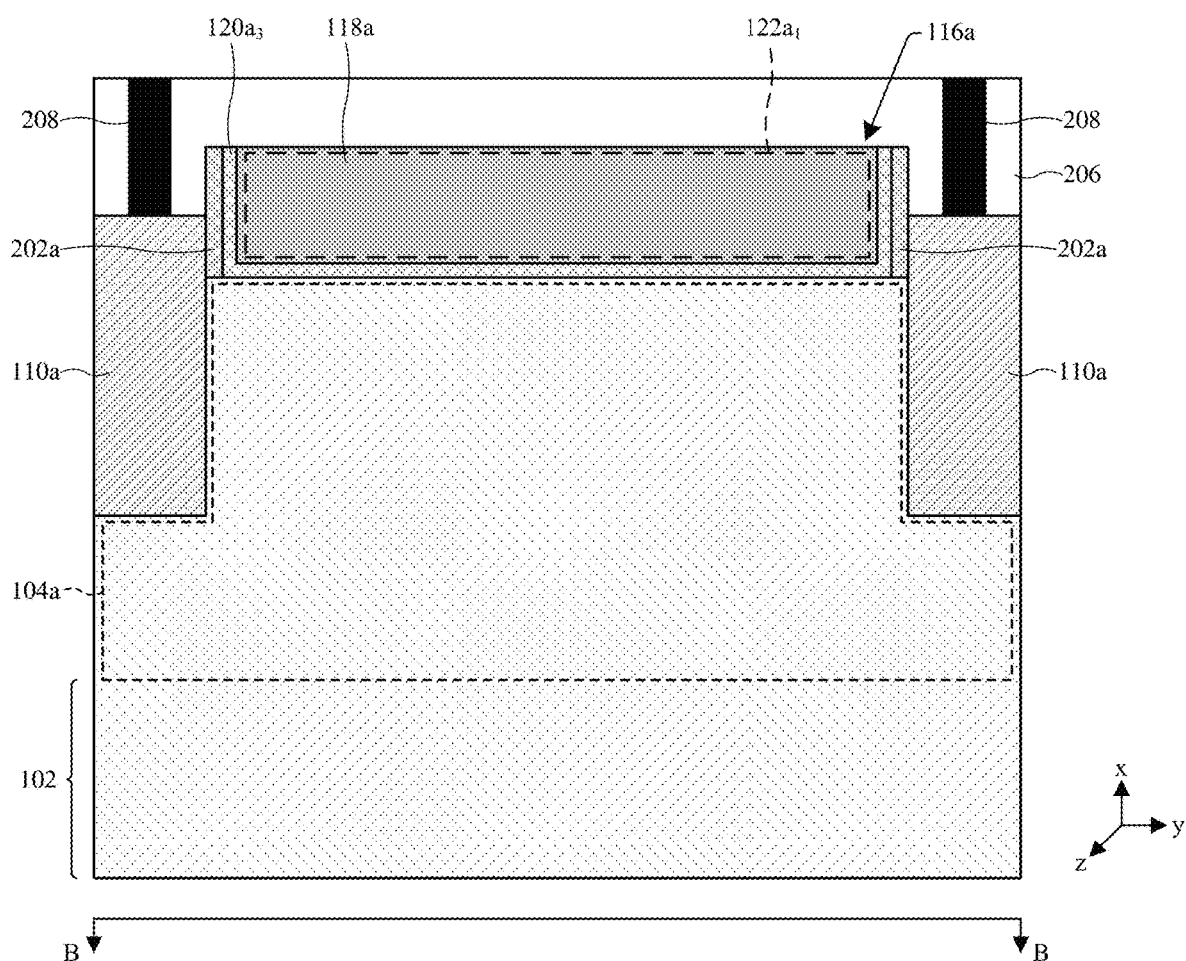
Figure 2C:
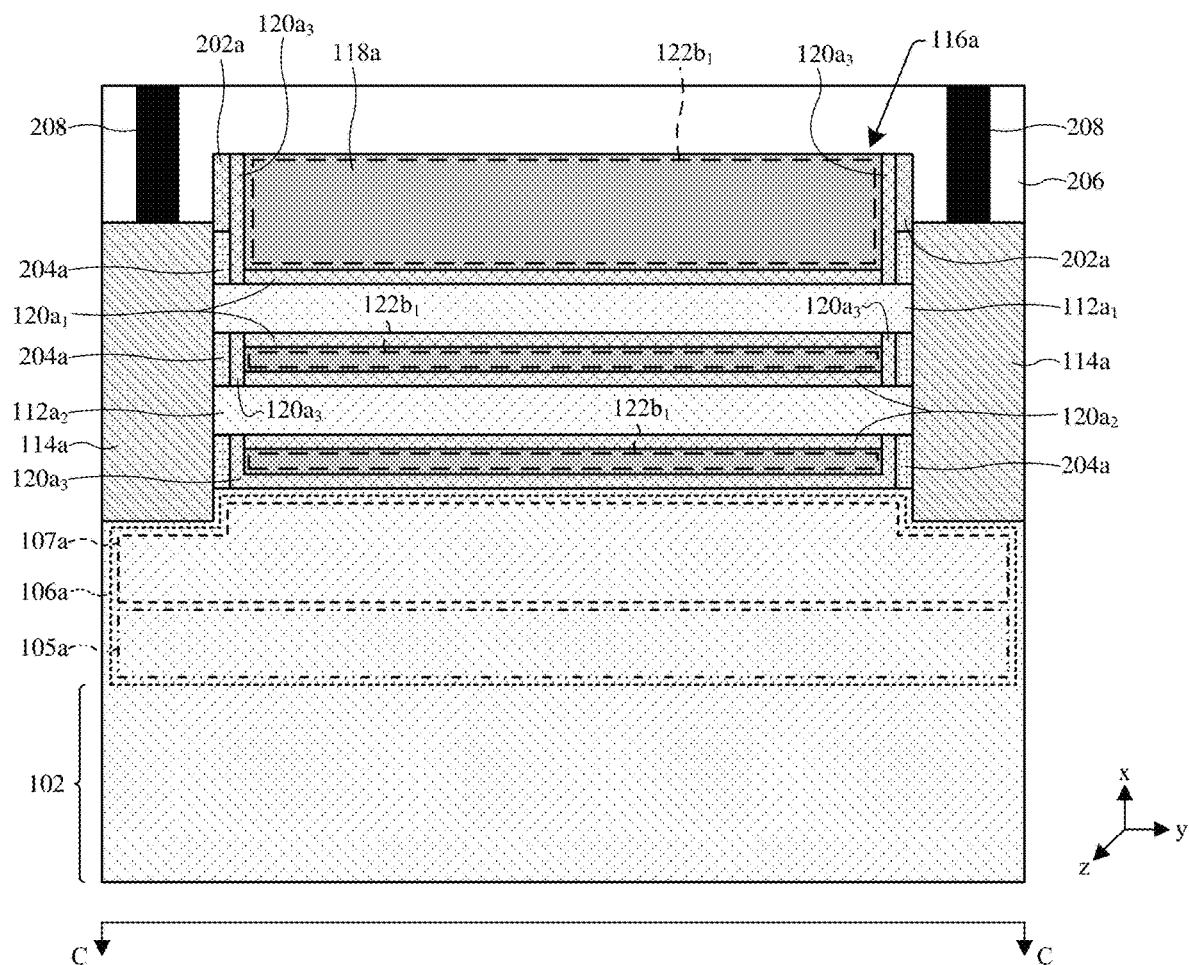

FIGS. 2A-2C illustrate cross-sectional views of some embodiments of the IC 100 of FIGS. 1A-1B. FIG. 2A illustrate a cross-sectional view of some embodiments of the IC of FIG. 1 taken along line A-A of FIG. 1. FIG. 2B illustrate a cross-sectional view of some embodiments of the IC of FIG. 1 taken along line B-B of FIG. 1. FIG. 2C illustrate a cross-sectional view of some embodiments of the IC of FIG. 1 taken along line C-C of FIG. 1.

As shown in FIGS. 2A-2C, a plurality of first sidewall spacers 202 are disposed over the isolation structure 108 and along sidewalls of the gate structures 116. The first sidewall spacers 202 extend from the isolation structure 108 vertically (in the "x" direction) along the sidewalls of the gate structures 116 to upper surfaces of the gate structures 116. In some embodiments, the first sidewall spacers 202 extend continuously (in the "z" direction) over the first fins 104, the second fins 106, and the nanostructure stacks 111. The first sidewall spacers 202 separate the first source/drain regions 110 and the second source/drain regions 114 from the gate structures 116.

For example, the first sidewall spacers 202 comprises a second sidewall spacer 202a. The second sidewall spacer 202a is disposed over the isolation structure 108 and along sidewalls of the first gate structure 116a. The second sidewall spacer 202a extends from the isolation structure 108 vertically (in the "x" direction) along the sidewalls of the first gate structure 116a to the upper surface of the first gate structure 116a. The second sidewall spacer 202a extends continuously (in the "z" direction) over the third fin 104a, the fourth fin 106a, and the first nanostructure stack 111a. The second sidewall spacer 202a separates the first source/drain regions 110 of the first pair 110a and the second source/drain regions 114 of the second pair 114a from the first gate structure 116a. In some embodiments, the first sidewall spacers 202 may be or comprise, for example, an oxide (e.g., $SiO_2$), a nitride (e.g., SiN), an oxy-nitride (e.g., $SiO_xN_y$), some other dielectric material, or a combination of the foregoing. In further embodiments, the first sidewall spacers 202 may be referred to as gate spacers.

A plurality of third sidewall spacers 204 are disposed over the isolation structure 108 and between the second source/drain regions 114 and the gate structures 116. The third sidewall spacers 204 may be disposed along sidewalls of the second source/drain regions 114 and/or sidewalls of the gate dielectric structures 120. The third sidewall spacers 204 comprise one or more groups of the third sidewall spacers. For example, the third sidewall spacers 204 comprises a first group of the third sidewall spacers 204. The first group of the third sidewall spacers 204 comprises a plurality of fourth sidewall spacers 204a. The fourth sidewall spacers 204a are disposed along sidewalls of the second source/drain regions 114 of the second pair 114a and/or sidewalls of the first gate dielectric structure 120a.

The third sidewall spacers 204 are disposed between the upper surfaces of the gate structures 116 and the upper surfaces of the second fins 106. The third sidewall spacers 204 are vertically adjacent to the nanostructures of the plurality of nanostructures 112. The third sidewall spacers 204 separate the second source/drain regions 114 from the portions of the gate structures 116 that wrap around the nanostructures of the plurality of nanostructures 112.

For example, the fourth sidewall spacers 204a are disposed between an upper surface of the first gate structure 116a and the upper surface of the fourth fin 106a. The fourth sidewall spacers 204a are disposed vertically adjacent to (e.g., above or below) the nanostructures of the first plurality of nanostructures 112a. The fourth sidewall spacers 204a are disposed between the second source/drain regions 114 of the second pair 114a and the first gate structure 116a. The fourth sidewall spacers 204a separate the second source/drain regions 114 of the second pair 114a from the portions of the first gate structure 116a that wrap around the nanostructures of the first plurality of nanostructures 112a.

In some embodiments, the third sidewall spacers 204 may be or comprise, for example, an oxide (e.g., $SiO_2$), a nitride (e.g., SiN), an oxy-nitride (e.g., $SiO_XN_Y$), some other dielectric material, or a combination of the foregoing. In further embodiments, the third sidewall spacers 204 may be referred to as inner sidewall spacers. In yet further embodiments, the third sidewall spacers 204 are only disposed along sidewalls of the second source/drain regions 114 and not sidewalls of the first source/drain regions 110. In other words, in some embodiments, no third sidewall spacers 204 are disposed along sidewalls of any of the first source/drain regions 110.

In some embodiments, the gate structures 116 extend continuously (in the "y" direction) between opposite inner sidewalls of the first sidewall spacers 202 and between opposite inner sidewalls of the third sidewall spacers 204. The gate dielectric structures 120 extend (in the "y" direction) between the opposite inner sidewalls of the first sidewall spacers 202 and between the opposite inner sidewalls of the third sidewall spacers 204. In some embodiments, the gate dielectric structures 120 extend (in the "x" direction) along the inner sidewalls of the first sidewall spacers 202 and along the inner sidewalls of the third sidewall spacers 204 to the upper surfaces of the gate structures 116.

For example, the first gate structure 116a extends continuously (in the "y" direction) between opposite inner sidewalls of the second sidewall spacer 202a and between opposite inner sidewalls of the fourth sidewall spacers 204a. The first gate dielectric structure 120a extends (in the "y" direction) between the opposite inner sidewalls of the second sidewall spacer 202a and between the opposite inner sidewalls of the fourth sidewall spacers 204a. The first gate dielectric structure 120a extends (in the "x" direction) along the inner sidewalls of the second sidewall spacer 202a and along the inner sidewalls of the fourth sidewall spacers 204a to the upper surface of the first gate structure 116a.

In some embodiments, the third portion $120a_3$ of the first gate dielectric structure 120a extends (in the "x" direction) along the inner sidewalls of the second sidewall spacer 202a and along the inner sidewalls of the fourth sidewall spacers 204a. In further embodiments, the first portion $120a_1$ and the second portion $120a_2$ of the first gate dielectric structure 120a extend (in the "y" direction) between opposite inner sidewalls of the third portion 120a3. In other embodiments, the first portion $120a_1$ and the second portion $120a_2$ of the first gate dielectric structure 120a extend (in the "y" direction) between the inner sidewalls of the fourth sidewall spacers 204a. In such embodiments, the first portion $120a_1$, the second portion 120a2, and the third portion $120a_3$ of the first gate dielectric structure 120a may contact the inner sidewalls of the fourth sidewall spacers 204a. In further embodiments, the first portion $120a_1$, the second portion 120a2, and the third portion $120a_3$ of the first gate dielectric structure 120a are part of a single continuous gate dielectric structure.

In some embodiments, the gate dielectric structures 120 may be or comprise, for example, an oxide (e.g., $SiO_2$), a high-k dielectric (e.g., a dielectric material with a dielectric constant greater than 3.9), some other dielectric material, or a combination of the foregoing. The gate dielectric structures 120 may be multi-layered structures, for example, comprising one or more interfacial layers. In further embodiments, the gate electrode structures 118 may comprise, for example, polysilicon (e.g., doped polysilicon), a metal (e.g., aluminum (Al), tungsten (W)), some other conductive material, or a combination of the foregoing. The gate electrode structures 118 may be multi-layered structures, for example, comprising a work function metal layer (e.g., titanium nitride (TiN), tantalum nitride (TaN), or the like), a metal fill layer (e.g., W), or the like.

In some embodiments, the nanostructure stacks 111 are disposed between the uppermost surface of the first fins 104 and the uppermost surfaces of the second fins 106. In other embodiments, the nanostructure stacks 111 may be partially disposed over the uppermost surface of the first fins 104. In further embodiments, the nanostructures of the plurality of nanostructures 112 have circular-like shaped profiles along line A-A. The plurality of nanostructures 112 with the circular-like shaped profiles may be referred to as round nanowires.

For example, the third fin 104a has an uppermost surface disposed over an uppermost surface of the fourth fin 106a. The first nanostructure stack 111a is disposed between the uppermost surface of the fourth fin 106a and the uppermost surface of the third fin 104a. The first nanostructure $112a_1$ and the second nanostructure $112a_2$ have circular-like shaped profiles along line A-A. In such embodiments, the first nanostructure $112a_1$ may be referred to as a first round nanowire, and the second nanostructure $112a_2$ may be referred to as a second round nanowire.

In some embodiments, the first source/drain regions 110 have a hexagonal-like shaped profile, a diamond-like shaped profile, or some other geometrically shaped profile when viewed along line A-A. The second source/drain regions 114 may have a hexagonal-like shaped profile, a diamond-like shaped profile, or some other geometrically shaped profile when viewed along line A-A. In further embodiments, the first source/drain regions 110 have a first doping type (e.g., p-type). In yet further embodiments, the second source/drain regions 114 have a second doping type opposite the first doping type (e.g., n-type).

An interlayer dielectric (ILD) structure 206 is disposed over the isolation structure 108, the semiconductor substrate 102, and the plurality of semiconductor devices 128. The ILD structure 206 comprises one or more stacked ILD layers, which may respectively comprise a low-k dielectric (e.g., a dielectric material with a dielectric constant less than about 3.9), an oxide (e.g., ($SiO_2$), or the like. A plurality of conductive contacts 208 (e.g., metal contacts) are disposed in the ILD structure 206.

The conductive contacts 208 extend through the ILD structure 206 (in the "x" direction) from the first source/drain regions 110, the second source/drain regions 114, and/or the gate electrode structures 118. The conductive contacts 208 are electrically coupled to the first source/drain regions 110, the second source/drain regions 114, and/or the gate electrode structures 118. The conductive contacts 208 are part of an interconnect structure (e.g., copper interconnect) embedded in the ILD structure 206 and configured to electrically couple various semiconductor devices of the IC 100 together in a predefined manner. In some embodiments, the conductive contacts 208 may comprise, for example, W, Al, copper (Cu), or the like. In further embodiments, the conductive contacts 208 may be multi-layered structures, for example, comprising a silicide layer, a barrier layer, or the like.

In some embodiments, the conductive contacts 208 may extend laterally (in the "z" direction and/or the "y" direction) through the ILD structure 206. For example, some of the conductive contacts of the conductive contacts 208 are extend laterally (in the "z" direction) through a lower portion of the ILD structure 206, such that the some of the conductive contacts 208 contact (and electrically couple together) one or more first source/drain regions 110 and/or one or more second source/drain regions 114. Some other conductive contacts of the conductive contacts 208 may extend laterally (in the "y" direction) through an upper portion of the ILD structure 206, such that the some other conductive contacts of the conductive contacts 208 contact (and electrically couple together) one or more of the gate structures 116.

FIGS. 3A-3E illustrates cross-sectional views of some other embodiments of the IC 100 of FIGS. 1A-1B taken along line A-A of FIG. 1A.

Figure 3A:
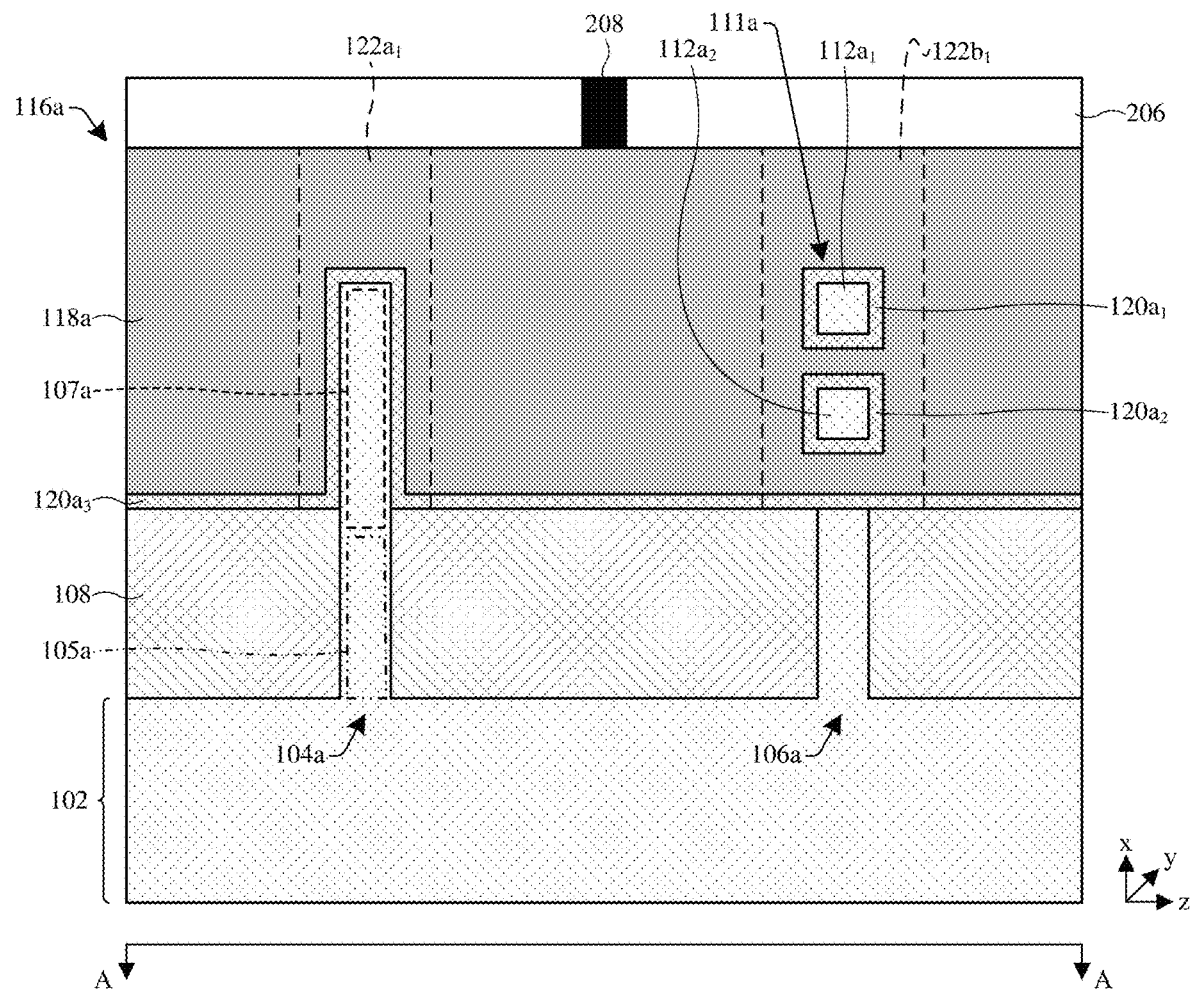
FIGS. 3A-3E illustrates cross-sectional views of some other embodiments of the IC of FIGS. 1A-1B taken along line A-A of FIG. 1A.
Figure 3B:
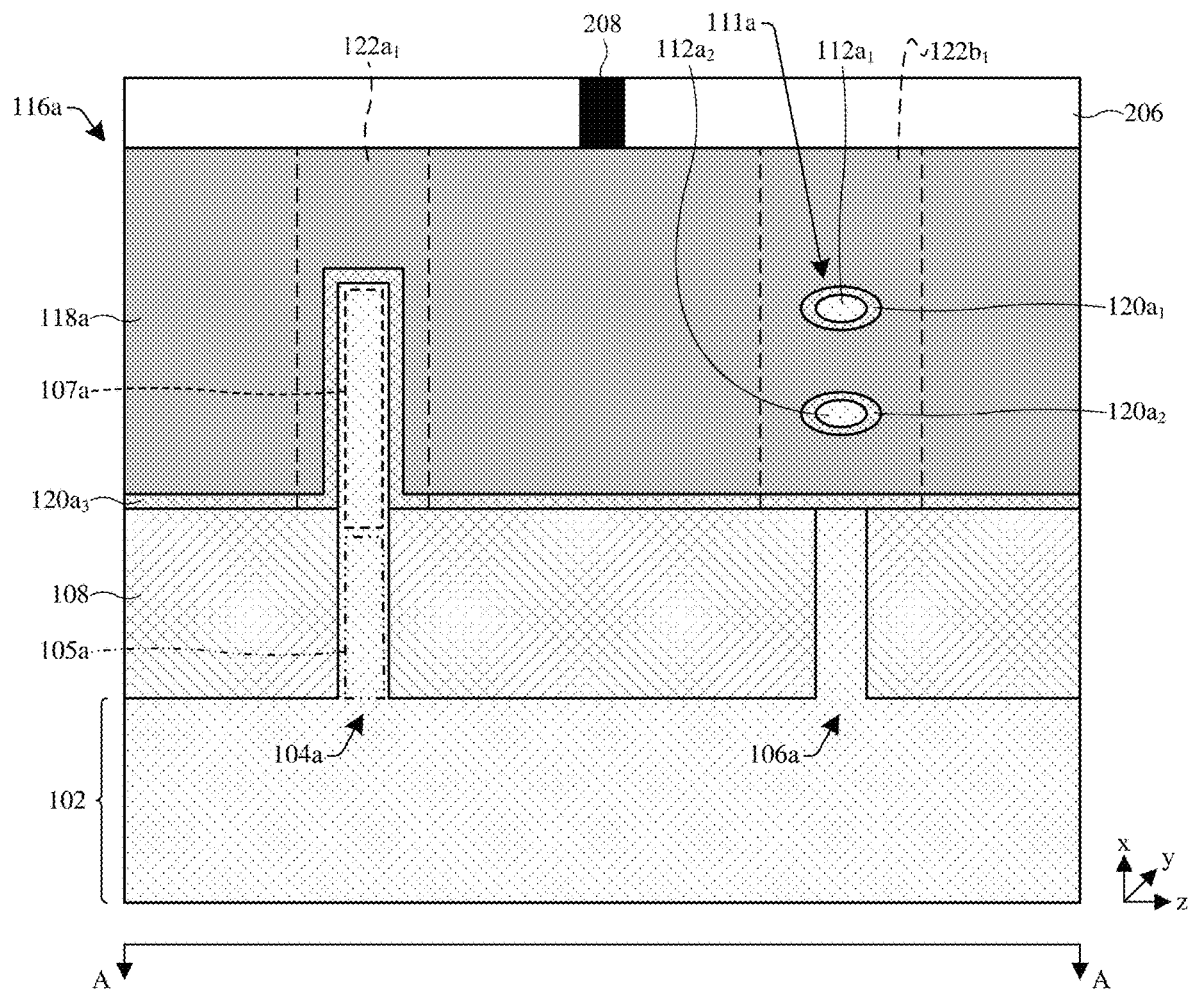

As shown in FIG. 3A, the nanostructures of the plurality of nanostructures 112 have square-like shaped profiles along line A-A. The nanostructures of the plurality of nanostructures 112 with the square-like shaped profiles may be referred to as square nanowires. As shown in FIG. 3B, the nanostructures of the plurality of nanostructures 112 have ellipse-like shaped profiles along line A-A. The nanostructures of the plurality of nanostructures 112 with the ellipse-like shaped profiles may be referred to as nano-rings.

Figure 3C:
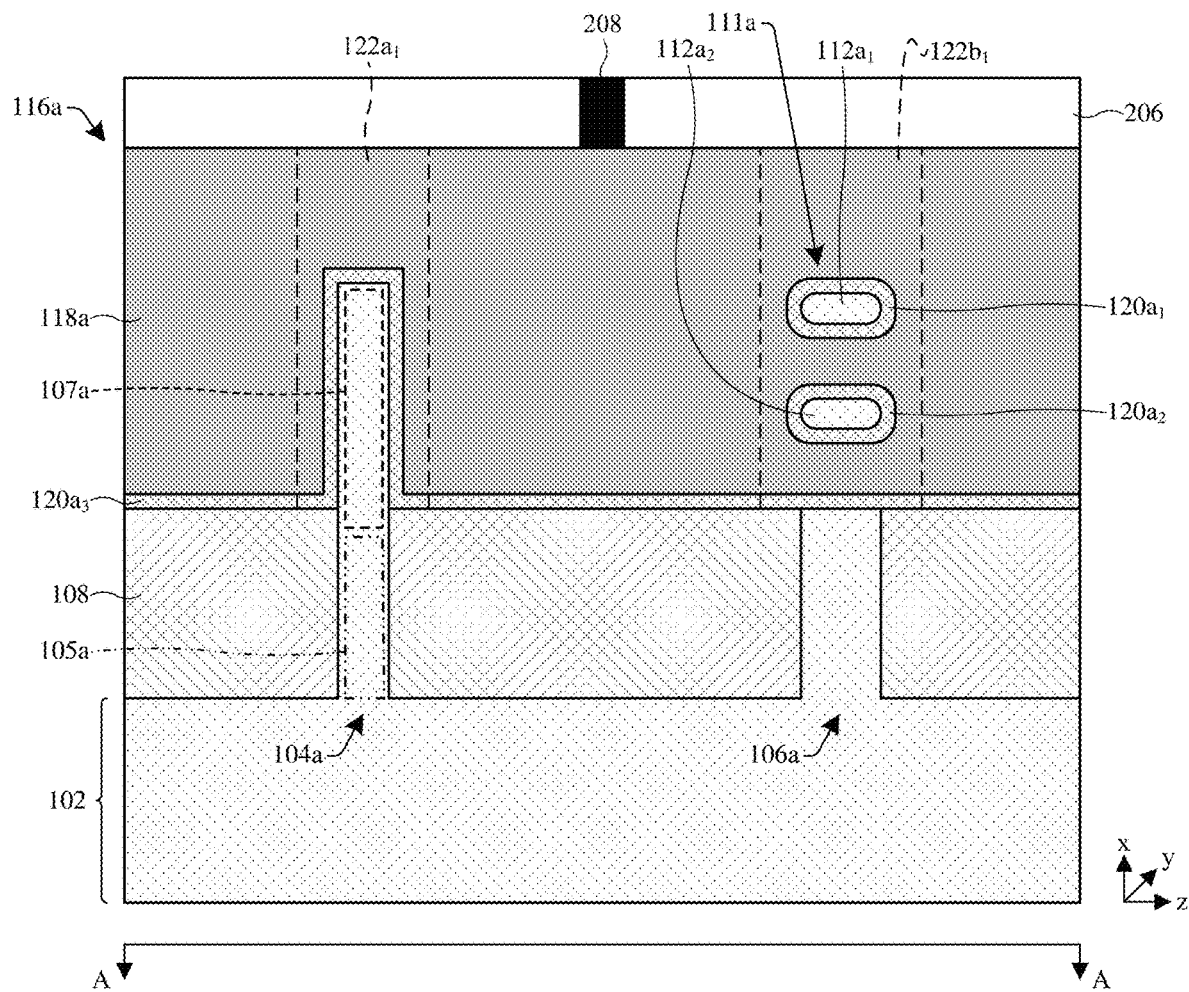
Figure 3D:
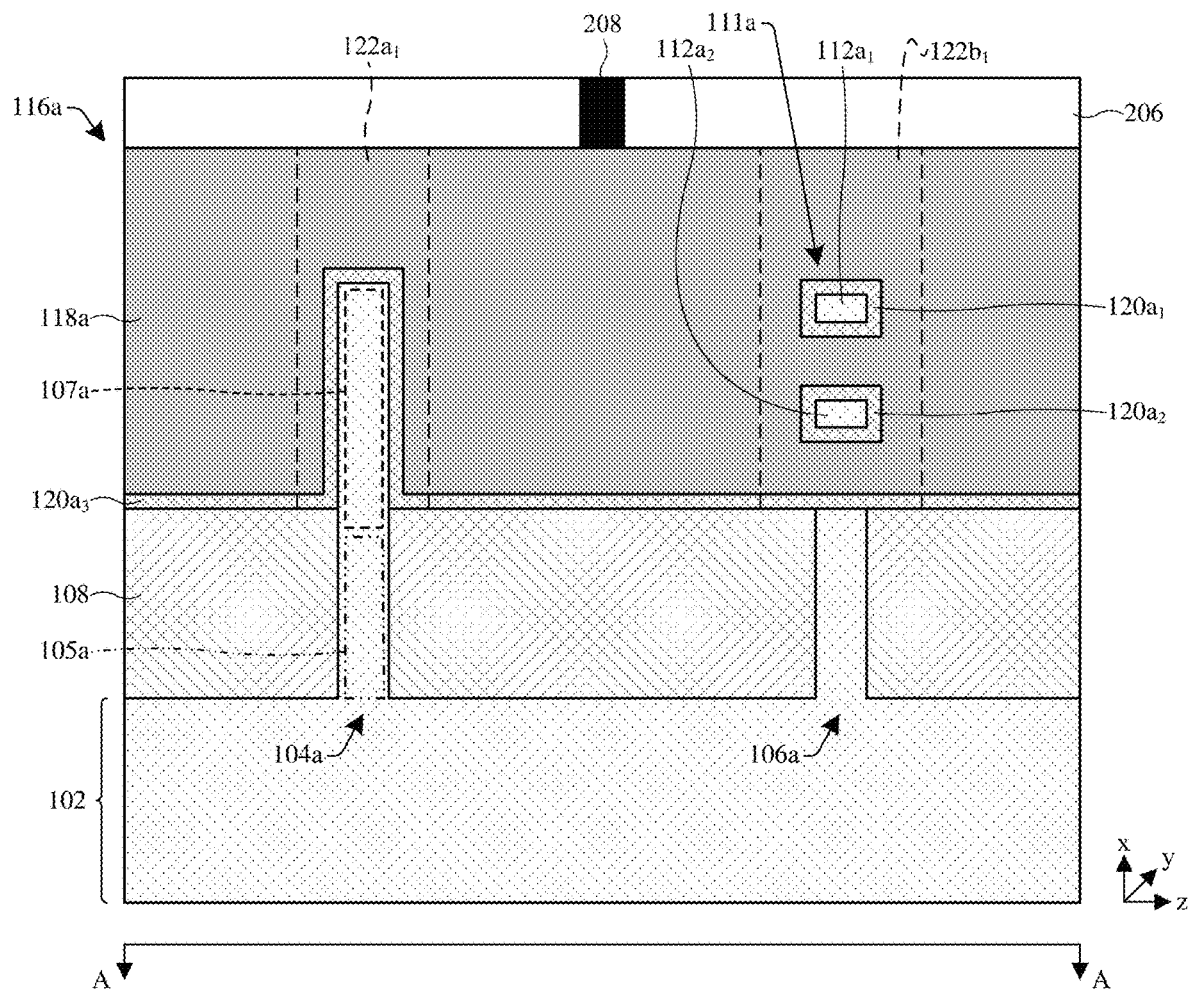

As shown in FIG. 3C, nanostructures of the plurality of nanostructures have stadium-like shaped (e.g., geometric stadium shape) profiles along line A-A. As shown in FIG. 3D, nanostructures of the plurality of nanostructures 112 have rectangular-like shaped profiles along line A-A. The nanostructures of the plurality of nanostructures 112 with the stadium-like shaped profiles may be referred to as horizontal nanosheets or horizontal nanoslabs. The nanostructures of the plurality of nanostructures 112 with the rectangular-like shaped profiles may also be referred to as horizontal nanosheets or horizontal nanoslabs.

Figure 3E:
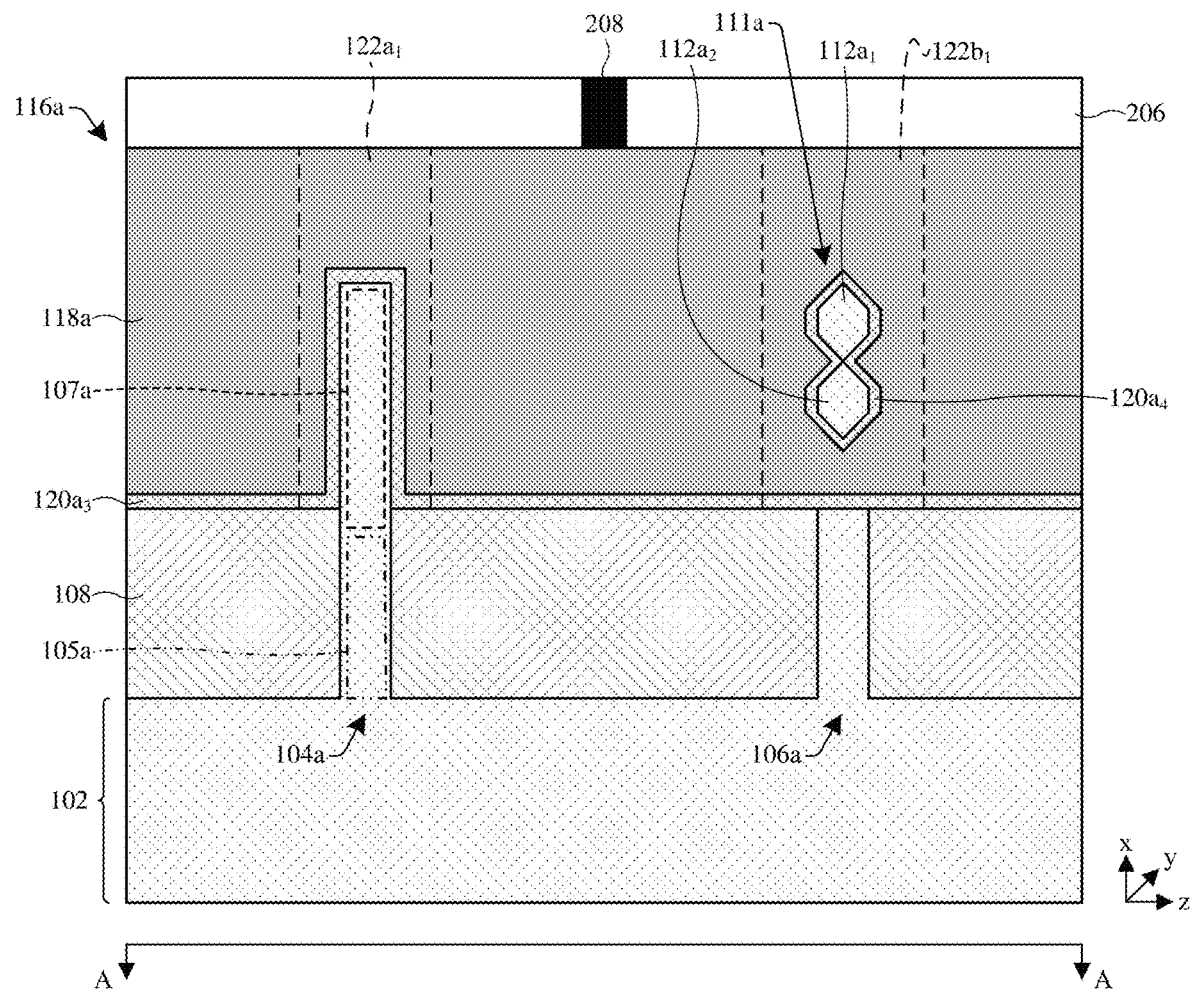

As shown in FIG. 3E, the nanostructures of the plurality of nanostructures 112 have hexagonal-like shaped profiles along line A-A. The nanostructures of the plurality of nanostructures 112 with the hexagonal-like shaped profiles may be referred to as hexagonal nanowires. In some embodiments, a lower point of an upper hexagonal nanowire (e.g., the first nanostructure $112a_1$) may contact (or merge with) an upper point of a lower hexagonal nanowire (e.g., the second nanostructure $112a2$). In such embodiments, the gate dielectric structures 120 may comprise fourth portions that wrap continuously around the nanostructures of the plurality of nanostructures 112 to separate the plurality of nanostructures 112 from the gate electrode structures 118. In other embodiments, the lower point of the upper hexagonal nanowire is spaced (in the "x" direction) from the upper point of the lower hexagonal nanowire.

For example, the first nanostructure $112a_1$ and the second nanostructure $112a_2$ have hexagonal-like shaped profiles along line A-A. A lower point of the first nanostructure $112a_1$ contacts an upper point of the second nanostructure $112a2$. The first gate dielectric structure 120a comprises a fourth portion 120a4 of the first gate dielectric structure 120a. The fourth portion 120a4 of the first gate dielectric structure 120a wraps continuously around the first nanostructure $112a_1$ and the second nanostructure $112a_2$ to separate the first plurality of nanostructures 112a from the first gate electrode structure 118a. In other embodiments, the lower point of the first nanostructure $112a_1$ is spaced (in the "x" direction) from the upper point of the second nanostructure $112a2$. In such embodiments, the first portion $120a_1$ of the first gate dielectric structure 120a wraps continuously around the first nanostructure $112a_1$, and the second portion $120a_2$ of the first gate dielectric structure 120a wraps continuously around the second nanostructure $112a2$.

Figure 4A:
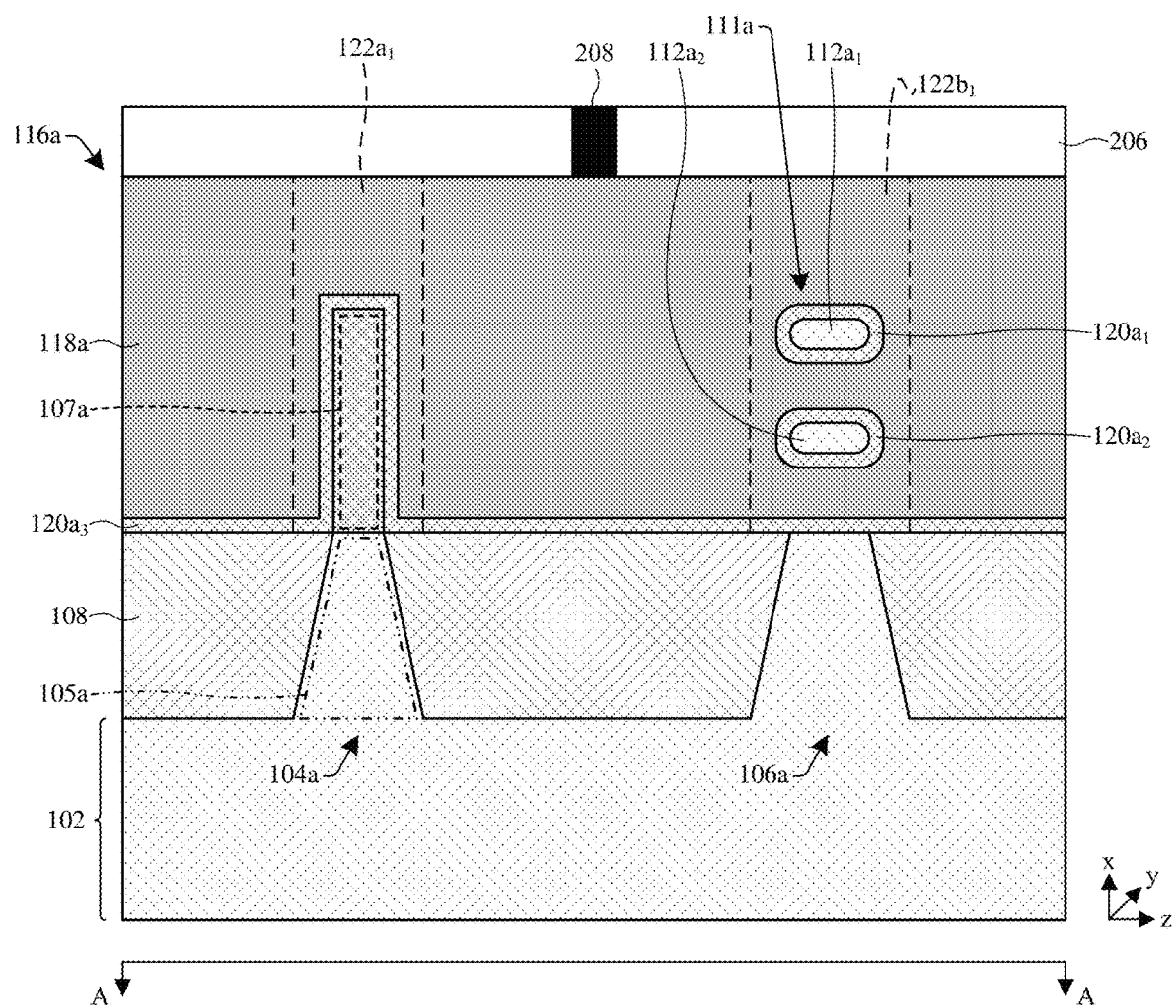
FIGS. 4A-4C illustrates cross-sectional views of some other embodiments of the IC of FIGS. 1A-1B taken along line A-A of FIG. 1A.
Figure 4B:
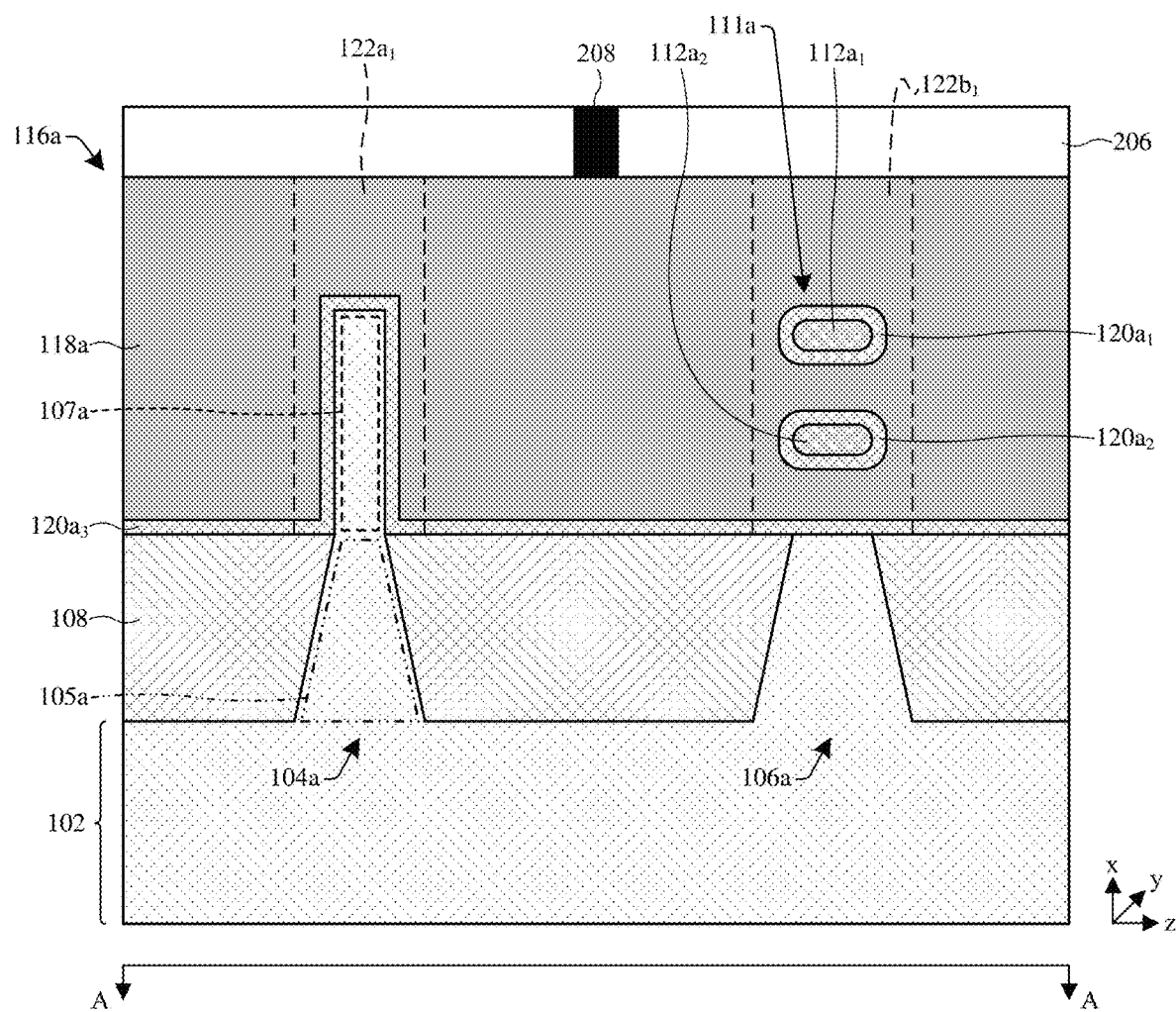
Figure 4C:
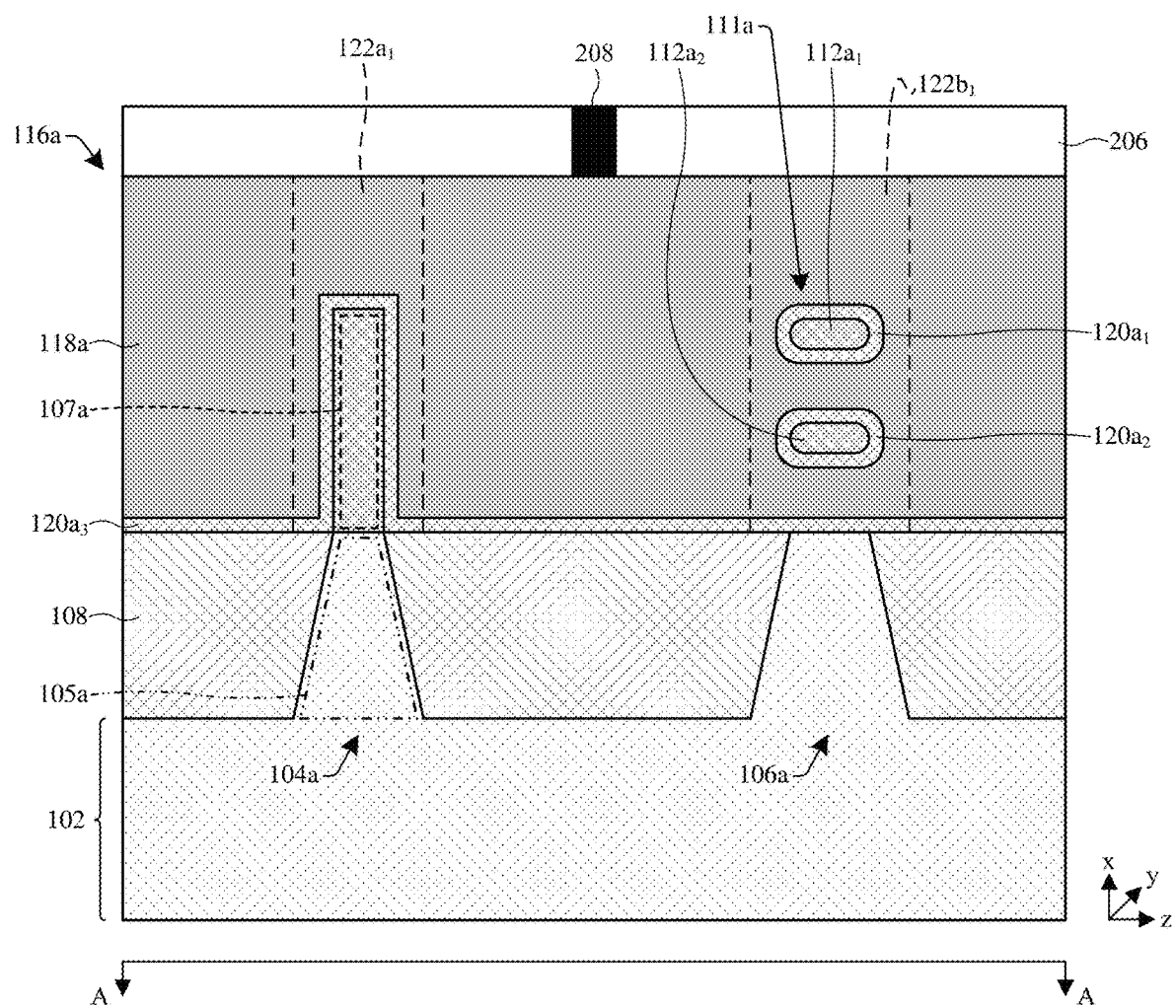

FIGS. 4A-4C illustrates cross-sectional views of some other embodiments of the IC 100 of FIGS. 1A-1B taken along line A-A of FIG. 1A.

As shown in FIGS. 4A-4C, the second fins 106 may have angled sidewalls. The angled sidewalls of the second fins 106 angle inward (e.g., toward center points of the second fins 106) as the second fins 106 extend vertically from the semiconductor substrate 102 (in the "x" direction). The uppermost surfaces of the second fins 106 extend laterally (in the "z" direction) a first distance between opposite uppermost points of the angled sidewalls of the second fins 106. For example, the fourth fin 106a has angled sidewalls that angle inward (e.g., toward a center point of the fourth fin 106a) as the fourth fin 106a extends vertically from the semiconductor substrate 102 (in the "x" direction). The uppermost surface of the fourth fin 106a extends the first distance (in the "z" direction) between the opposite uppermost points of the angled sidewalls of the fourth fin 106a.

In some embodiments, the lower portions 105 of the first fins 104 have angled sidewalls that angle inward (e.g., toward center points of the first fins 104) as the first fins 104 extend from the semiconductor substrate 102 (in the "x" direction). The upper portions 107 of the first fins 104 have sidewalls that extend vertically (in the "x" direction) from the angled sidewalls of the lower portions 105. The sidewalls of the upper portions 107 may be substantially vertical or angled inward. Opposite lowermost points of the sidewalls of the upper portions 107 are spaced apart a second distance (in the "z" direction). In some embodiments, the second distance is different than the first distance. In further embodiments, the second distance is less than the first distance. In other embodiments, the second distance may be substantially the same as the first distance.

For example, the first lower portion 105a of the third fin 104a has angled sidewalls that angled inward (e.g., toward a center point of the third fin 104a) as the first lower portion 105a extends from the semiconductor substrate 102 (in the "x" direction). The first upper portion 107a of the third fin 104a has substantially vertical sidewalls that extend (in the "x" direction) from the angled sidewalls of the first lower portion 105a. Lowermost points of the sidewalls of the first upper portion 107a are spaced apart a second distance (in the "z" direction) that is less than the first distance.

In some embodiments, an uppermost point of the lower portions 105 of the first fins 104 is disposed at (or in-line with) the upper surface of the isolation structure 108. In other embodiments, the uppermost point of the lower portions 105 of the first fins 104 is disposed below the upper surface of the isolation structure 108 (see, e.g., FIGS. 3A-3E). In other embodiments, the uppermost point of the lower portions 105 of the first fins 104 may be disposed over the upper surface of the isolation structure 108.

The semiconductor substrate 102, the second fins 106, and the lower portions 105 of the first fins 104 are or comprise a first semiconductor material. As shown in FIG. 4A, in some embodiments, the plurality of nanostructures 112 are or comprise the first semiconductor material, and the upper portions 107 are or comprise a second semiconductor material different than the first semiconductor material. As shown in FIG. 4B, in other embodiments, the plurality of nanostructures 112 are or comprise the second semiconductor material, and the upper portions 107 are or comprise the first semiconductor material. As shown in FIG. 4C, in other embodiments, the plurality of nanostructures 112 and the upper portions 107 are or comprise the second semiconductor material. In other embodiments, the plurality of nanostructures 112 and the upper portions 107 are or comprise the first semiconductor material (see, e.g., FIGS. 3A-3E).

In some embodiments, the first semiconductor material comprises a first Group IV chemical element (e.g., Si), and the second semiconductor material comprises a second Group IV chemical element (e.g., Ge) that is different than the first Group IV chemical element. For example, the first semiconductor material is Si and the second semiconductor material is Ge, SiGe, or the like. In further embodiments, the second semiconductor material may not comprise the first Group IV chemical element. For example, the first semiconductor material is Si and the second semiconductor material is Ge.

Figure 5A:
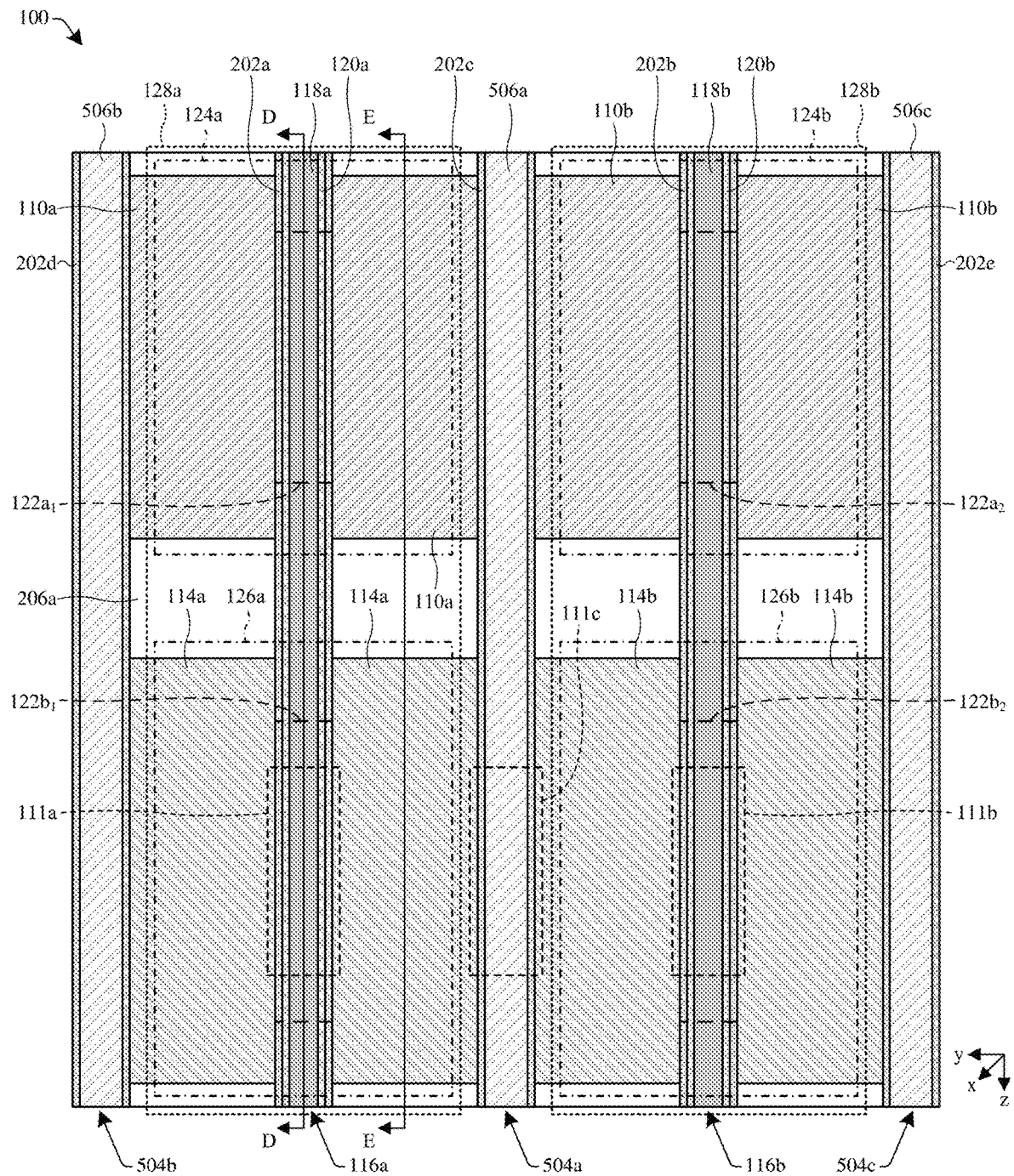
FIGS. 5A-5C illustrate various views of some other embodiments of the IC of FIGS. 2A-2C.
Figure 5B:
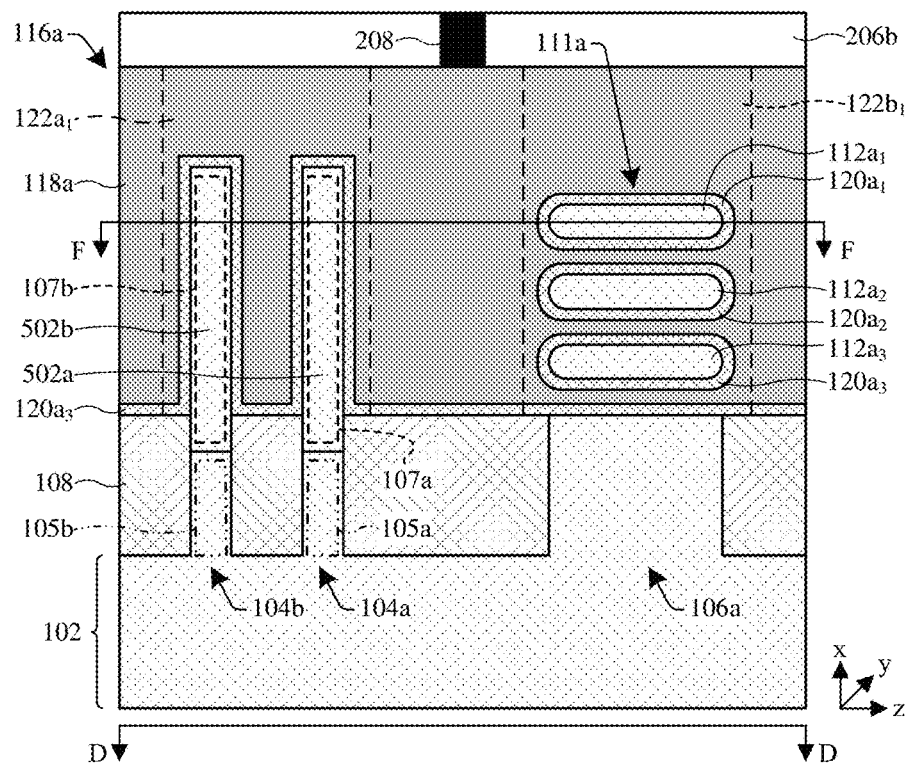
Figure 5C:
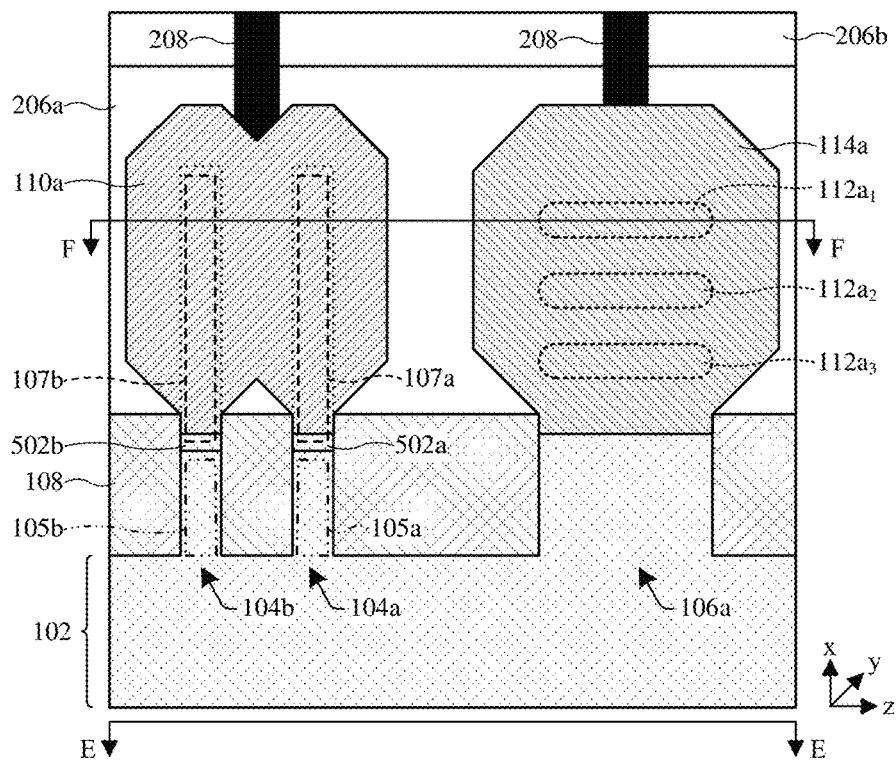

FIGS. 5A-5C illustrate various views of some other embodiments of the IC 100 of FIGS. 2A-2C. FIG. 5A illustrates a cross-sectional view of some other embodiments of the IC 100 of FIGS. 2A-2C taken along line F-F of FIG. 5A and FIG. 5B. FIG. 5B illustrates a cross-sectional view of some embodiments of the IC of FIG. 5A taken along line D-D of FIG. 5A. FIG. 5C illustrates a cross-sectional view of some embodiments of the IC of FIG. 5A taken along line E-E of FIG. 5A.

As shown in FIGS. 5A-5C, the IC 100 comprises the first semiconductor device 128a and a second semiconductor device 128b. It will be appreciated that, in some embodiments, the second semiconductor device 128b comprises similar features (e.g., structural features) as the first semiconductor device 128a. In some embodiments, the first semiconductor device 128a and the second semiconductor device 128b are a same type of device (e.g., both a CMOS inverter). In other embodiments, the first semiconductor device 128a may be a different type of device than the second semiconductor device 128b.

The first FinFET 124a is a multi-fin FinFET. The first FinFET 124a is a multi-fin FinFET due to the first FinFET 124a comprising two or more of the first fins 104 that extend between the first source/drain regions 110 of the first pair 110a. More specifically, the first FinFET 124a is a multi-fin FinFET due to the first FinFET 124a comprising two or more upper portions 107 of the first fins 104 that extend between the first source/drain regions 110 of the first pair 110a. For example, a fifth fin 104b of the first fins 104 comprises a second upper portion 107b that extends (in the "y" direction) between the first source/drain regions 110 of the first pair 110a. A fourth selectively-conductive channel of the first plurality of selectively-conductive channels is disposed in the second upper portion 107b. The first FinFET 124a comprises the first upper portion 107a (and thus the first selectively-conductive channel), the second upper portion 107b (and thus the fourth selectively conductive channel), the first source/drain regions 110 of the first pair 110a, and the third gate 122a$_1$.

In embodiments in which the first FinFET 124a is a multi-fin FinFET, the first FinFET 124a may comprise any number of the first fins 104 that is greater than or equal to two. For example, the first FinFET 124a may comprise two of the first fins 104, three of the first fins 104, etc. If the first FinFET 124a comprises two of the first fins 104, the first FinFET 124a may be referred to as a two-fin FinFET; if the first FinFET 124a comprises three of the first fins 104, the first FinFET 124a may be referred to as a three-fin FinFET; and so forth. It will be appreciated that, in some embodiments, the first FinFET 124a may be a multi-fin FinFET having two or more of the first fins 104 that extend between first source/drain regions 110 of discrete pairs of the first source/drain regions 110 that are connected together via an overlying conductive feature (e.g., interconnect structure).

In some embodiments, the first fins 104 comprise a first plurality of epitaxial semiconductor structures 502 disposed over the semiconductor substrate 102. For example, the third fin 104a comprises a first epitaxial semiconductor structure 502a of the epitaxial semiconductor structures 502, and the fifth fin 104b comprises a second epitaxial semiconductor structure 502b of the epitaxial semiconductor structures 502. The epitaxial semiconductor structures 502 may be or comprise an epitaxial semiconductor material (e.g., a semiconductor material formed by an epitaxial process, such as epitaxial Si, epitaxial Ge, epitaxial SiGe, etc.). In some embodiments, the upper portions 107 of the first fins 104 are defined by the epitaxial semiconductor structures 502. For example, a size of the first epitaxial semiconductor structure 502a may define a size of the first upper portion 107a.

In some embodiments, bottom surfaces of the epitaxial semiconductor structures 502 are disposed below the upper surface of the isolation structure 108. In other embodiments, the bottom surfaces of the epitaxial semiconductor structures 502 are disposed above the upper surface of the isolation structure 108. In other embodiments, the bottom surfaces of the epitaxial semiconductor structures 502 are substantially co-planar with the upper surface of the isolation structure 108.

In some embodiments, a plurality of dummy gate structures 504 are disposed over the isolation structure 108, the first fins 104, and the second fins 106. The dummy gate structures 504 are disposed between the semiconductor devices 128. The dummy gate structures 504 may extend continuously (in the "z" direction) across the isolation structure 108, over the first fins 104, over the second fins 106, and around some nanostructure stacks of the plurality of nanostructure stacks 111. The dummy gate structures 504 may extend continuously (in the "z" direction) between pairs of source/drain regions that neighbor one another (in the "y" direction). In some embodiments, the dummy gate structures 504 may have a same length (e.g., a distance between opposite sidewalls spaced in the "y" direction) as the plurality gate structures 116. In other embodiments, the dummy gate structures 504 may have a different length the plurality gate structures 116.

For example, the dummy gate structures 504 comprises a first dummy gate structure 504a and a second dummy gate structure 504b that are disposed over the isolation structure 108, the first fins 104, and the second fins 106. The first dummy gate structure 504a is disposed between the first semiconductor device 128a and the second semiconductor device 128b. The first dummy gate structure 504a extends continuously (in the "z" direction) across the isolation structure 108, over the first fins 104, over the second fins 106, and around the nanostructures of a second nanostructure stack 111c of the plurality of nanostructure stacks 111. The first dummy gate structure 504a extends continuously (in the "z" direction) between the first pair 110a of the first source/drain regions 110 and a third pair 110b of the first source/drain regions 110, and between the second pair 114a of the second source/drain regions 114 and the fourth pair 114b of the second source/drain regions 114.

In other embodiments, rather than the dummy gate structures 504 extending continuously (in the "z" direction)

around the some nanostructure stacks of the plurality of nanostructure stacks 111, the dummy gate structures 504 may extend continuously (in the "z" direction) over stacks of semiconductor layers (not shown) (e.g., stacks of alternating layers of SiGe and Si) that are disposed over the second fins 106. In such embodiments, the stacks of semiconductor layers take the place of the some nanostructure stacks of the plurality of nanostructure stacks 111 (e.g., disposed in the same locations as the some nanostructure stacks). In further such embodiments, the stacks of semiconductor layers have a similar layout (e.g., a similar top surface area/shape) as the some nanostructure stacks of the plurality of nanostructure stacks 111. For example, one of the stacks of semiconductor layers (see, e.g., FIGS. 22A-22C—the sixth stack 2202c of semiconductor layers) may take the place of the second nanostructure stack 111c. In such embodiments, the first dummy gate structure 504a extends continuously (in the "z" direction) across the isolation structure 108, over the first fins 104, over the second fins 106, and over the one of the stacks of semiconductor layers. In further such embodiments, the first dummy gate structure 504a may engage an upper surface of the one of the stacks of semiconductor layers and opposite sidewalls of the one of the stacks of semiconductor layers.

Figure 19A:
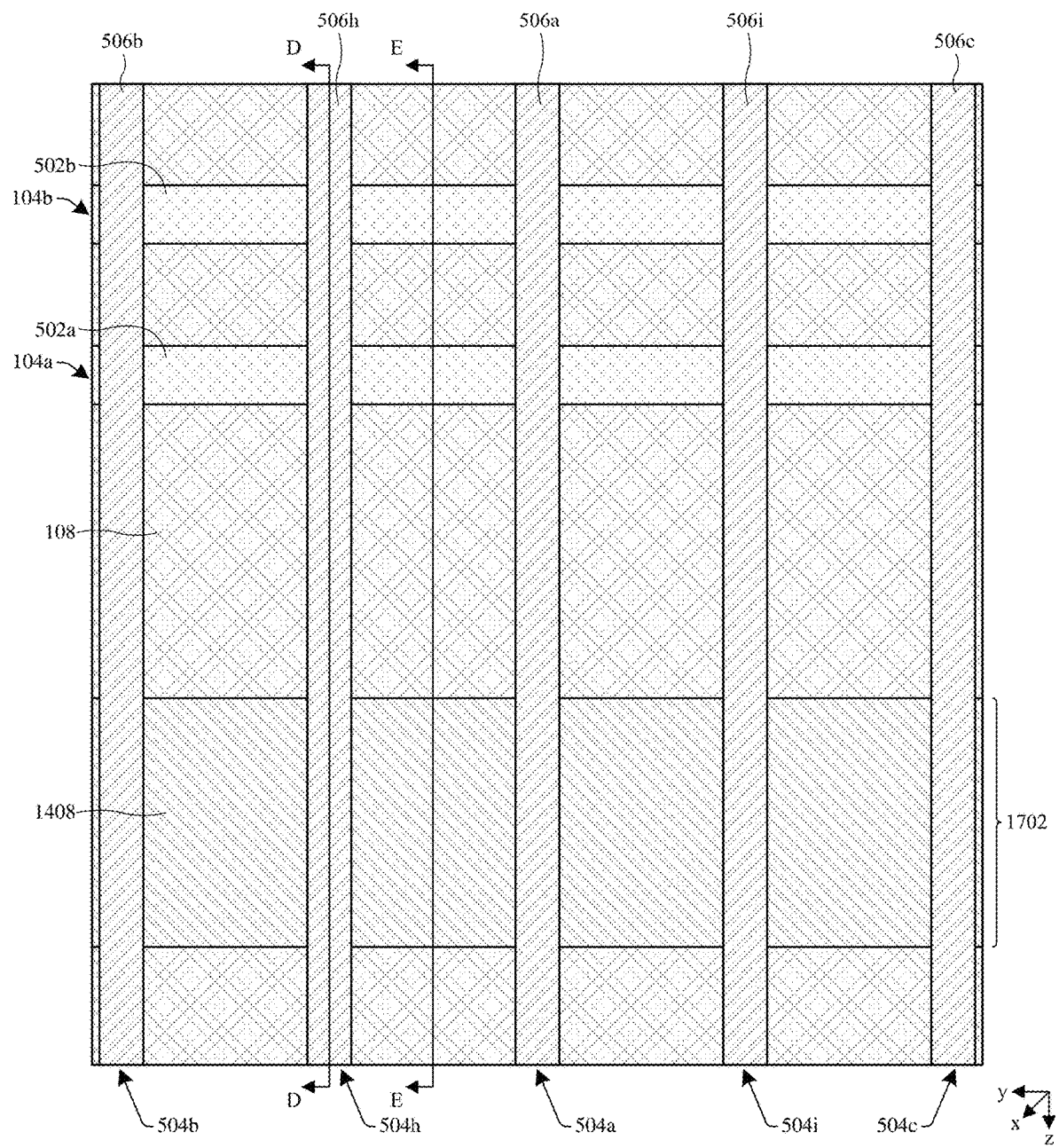
Figure 19B:
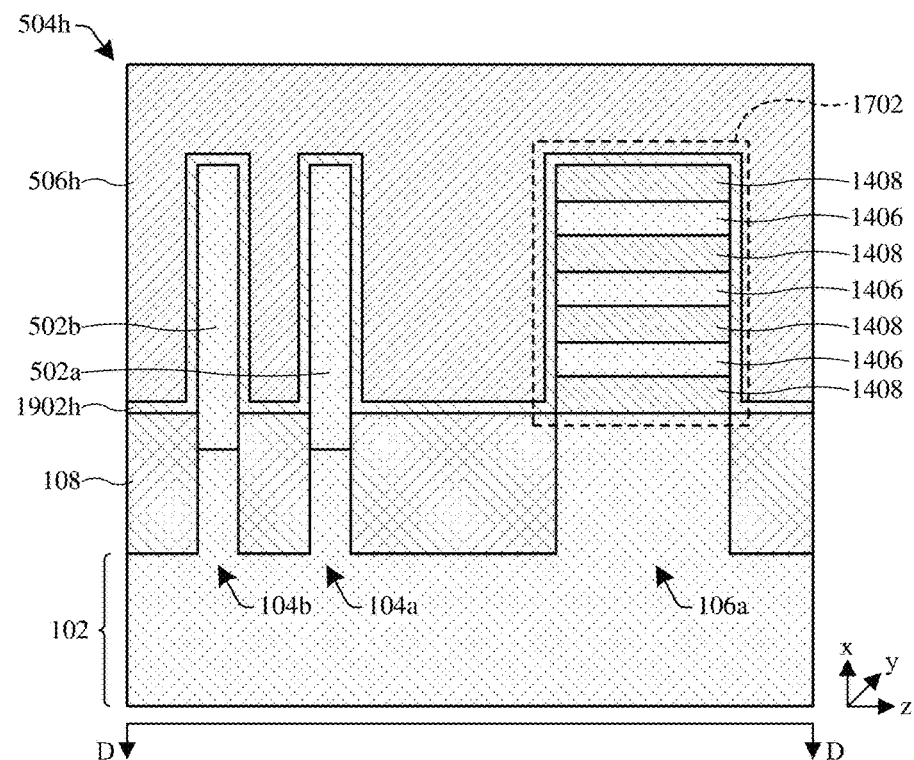
Figure 19C:
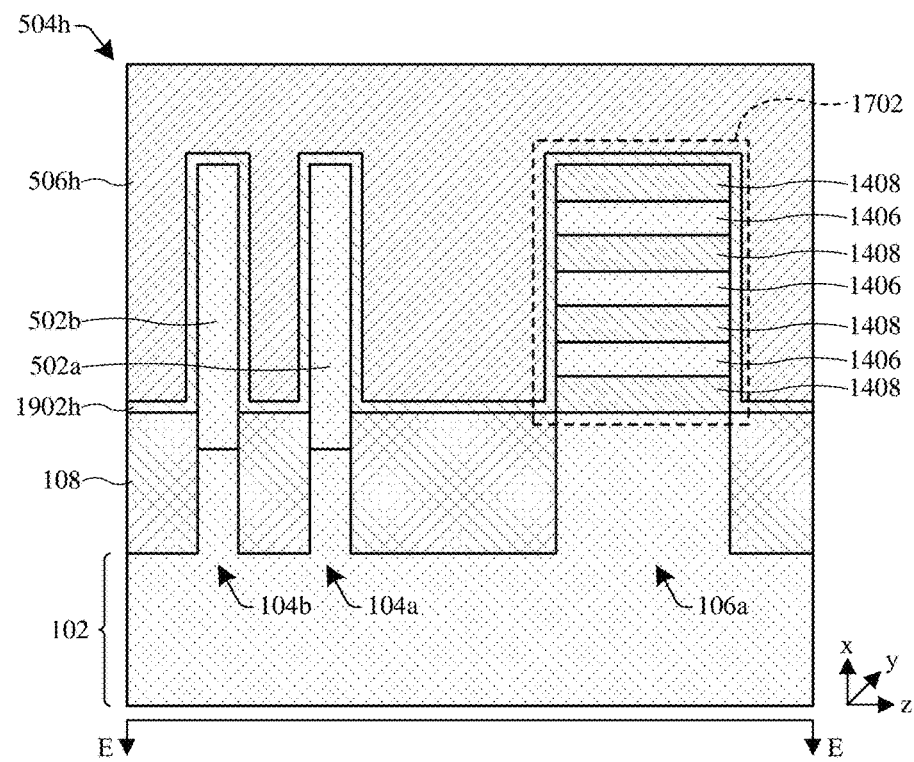

The dummy gate structures 504 comprise dummy gate material structures 506 and dummy gate dielectric structures (not shown) (see, e.g., FIGS. 19A-19C—dummy gate dielectric structures 1902). The dummy gate material structures 506 are disposed over the dummy gate dielectric structures. The dummy gate dielectric structures separate the dummy gate material structures 506 from the isolation structure 108, the first fins 104, the second fins 106, and the nanostructures of the some nanostructure stacks of the plurality of nanostructure stacks 111 (or the stacks of semiconductor layers). In some embodiments, sidewalls of the dummy gate material structures 506 may be aligned with sidewalls of the dummy gate dielectric structures.

For example, the first dummy gate structure 504a comprises a first dummy gate material structure 506a and a first dummy gate dielectric structure (not shown), and the second dummy gate structure 504b comprises a second dummy gate material structure 506b and a second dummy gate dielectric structure (not shown). The first dummy gate material structure 506a is disposed over the first dummy gate dielectric structure. The second nanostructure stack 111c comprises a second plurality of nanostructures (not shown). The first dummy gate dielectric structure separates the first dummy gate material structure 506a from the isolation structure 108, the first fins 104, the second fins 106, and the nanostructures of the second plurality of nanostructures (or a stack of semiconductor layers). In other embodiments, the first dummy gate dielectric structure separates the first dummy gate material structure 506a from the semiconductor layers of the one of the stacks of semiconductor layers. In some embodiments, sidewalls of the first dummy gate material structure 506a are aligned with sidewalls of the first dummy gate dielectric structure.

The dummy gate material structures 506 may be or comprise, for example, amorphous silicon, polysilicon (e.g., undoped polysilicon, doped polysilicon), some other dummy gate material, or a combination of the foregoing. In some embodiments, the dummy gate material structures 506 are or comprise a different material than the gate electrode structures 118. For example, the dummy gate material structures 506 may be or comprise polysilicon and the gate electrode structures 118 may be or comprise a metal. In other embodiments, the dummy gate material structures 506 are or comprise a same material as the gate electrode structures 118. In further embodiments, the dummy gate material structures 506 may have similar features (e.g., structural features) as the gate electrode structures 118. In yet further embodiments, the dummy gate material structures 506 may be multi-layered structures, for example, comprising a work function metal layer, a metal fill layer, or the like.

The dummy gate dielectric structures may be or comprise, for example, an oxide (e.g., $SiO_2$), a high-k dielectric (e.g., a dielectric material with a dielectric constant greater than 3.9), some other dielectric material, or a combination of the foregoing. In some embodiments, the dummy gate dielectric structures are or comprise a different material than the gate dielectric structures 120. For example, the dummy gate dielectric structures may be or comprise $SiO_2$ and the gate electrode structures 118 may be or comprise a high-k dielectric. In other embodiments, the dummy gate dielectric structures may be or comprise a same material as the gate dielectric structures 120. In further embodiments, the dummy gate dielectric structures have similar features (e.g., structural features) as the gate dielectric structures 120. In yet further embodiments, the dummy gate dielectric structures may be multi-layered structures, for example, comprising one or more interfacial layers.

In some embodiments, sidewall spacers of the first sidewall spacers 202 are disposed over the isolation structure 108 and along sidewalls of the dummy gate structures 504. In further embodiments, sidewall spacers of the third sidewall spacers 204 are disposed over the isolation structure 108 and separate the dummy gate structures 504 from the second source/drain regions 114. For example, the first sidewall spacers 202 comprises a fifth sidewall spacer 202c disposed over the isolation structure 108 and along sidewalls of the first dummy gate structure 504a. The third sidewall spacers comprise a second group (not shown) of third sidewall spacers 204 that separate the first dummy gate structure 504a from one of the second source/drain regions 114 of the second pair 114a and one of the second source/drain regions 114 of the fourth pair 114b that neighbors the one of the second source/drain regions 114 of the second pair 114a.

In some embodiments, the dummy gate structures 504 are not electrically coupled to any of the conductive contacts 208 (or any other conductive features that may bias the dummy gate material structures 506). In some embodiments, the ILD structure 206 continuously contacts upper surfaces of the dummy gate material structures 506. In other words, the ILD structure 206 may completely cover the upper surfaces of the dummy gate material structures 506.

In some embodiments, the ILD structure 206 comprises a first ILD layer 206a and a second ILD layer 206b. The second ILD layer 206b is disposed over the first ILD layer 206a. In such embodiments, some of the conductive contacts 208 extend (in the "x" direction) through the first ILD layer 206a and the second ILD layer 206b, and some other of the conductive contacts 208 are disposed over the first ILD layer 206a and extend (in the "x" direction) through the second ILD layer 206b. For example, the conductive contacts 208 that extend from the first source/drain regions 110 and/or the second source/drain regions 114 extend (in the "x" direction) through the first ILD layer 206a and the second ILD layer 206b, and the conductive contacts 208 that extend from the gate electrode structures 118 are disposed over the first ILD layer 206a and extend (in the "x" direction) through the second ILD layer 206b.

Figure 6A:
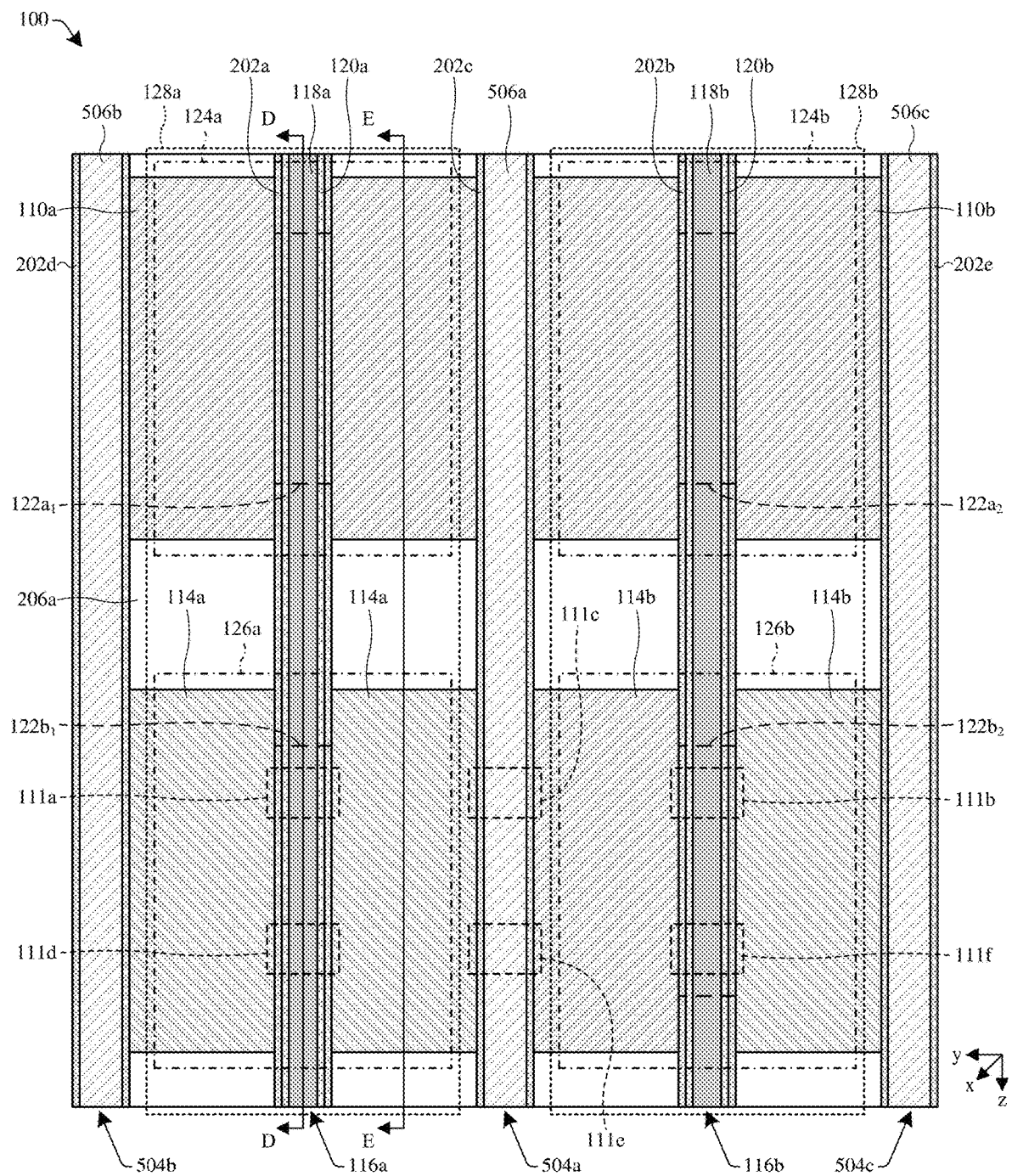
FIGS. 6A-6C illustrate various views of some other embodiments of the IC of FIGS. 2A-2C.
Figure 6B:
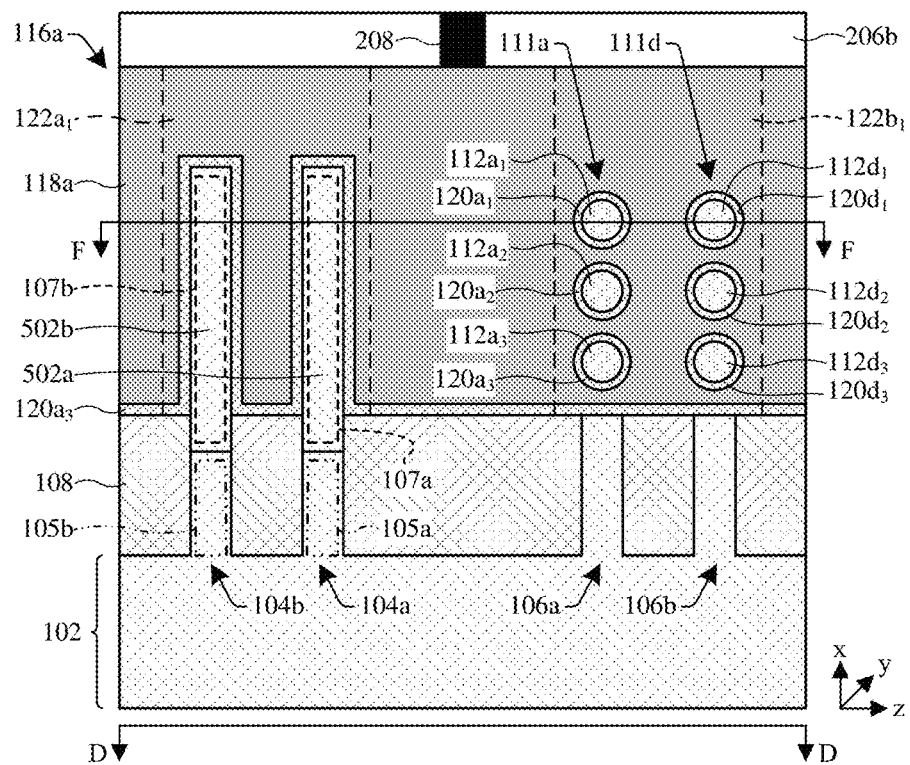
Figure 6C:
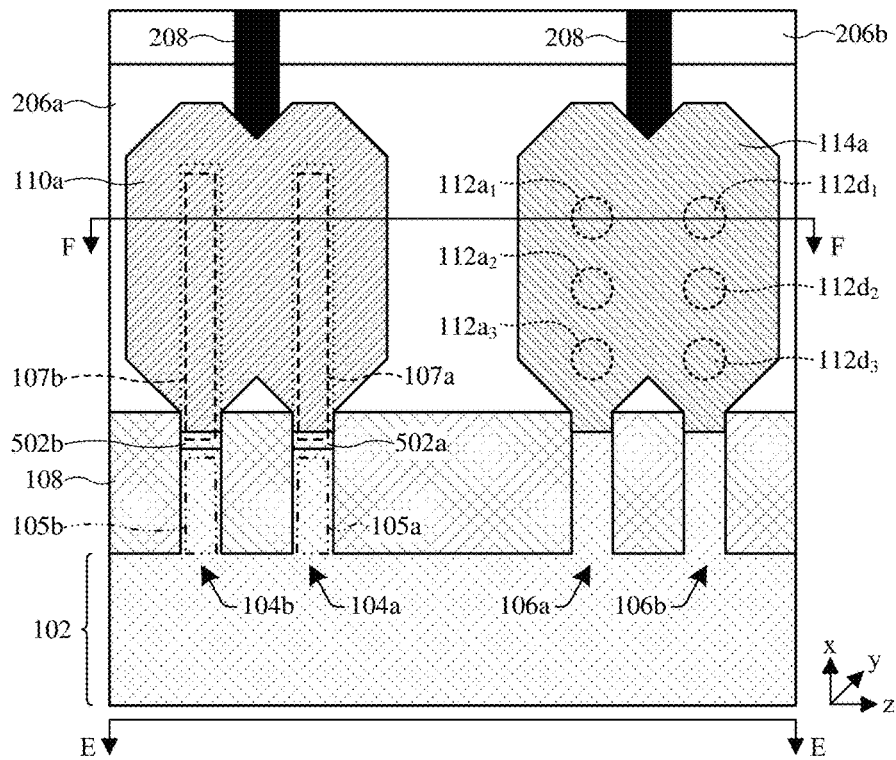

FIGS. 6A-6C illustrate various views of some other embodiments of the IC 100 of FIGS. 2A-2C. FIG. 6A illustrates a cross-sectional view of some other embodiments of the IC 100 of FIGS. 2A-2C taken along line F-F of FIG. 5A and FIG. 5B. FIG. 6B illustrates a cross-sectional view of some embodiments of the IC of FIG. 6A taken along line D-D of FIG. 6A. FIG. 6C illustrates a cross-sectional view of some embodiments of the IC of FIG. 6A taken along line E-E of FIG. 6A.

As shown in FIGS. 6A-6C, the first GAAFET 126a is a multi-nanostructure-stack GAAFET. The first GAAFET 126a is a multi-nanostructure-stack GAAFET due to the first GAAFET 126a comprising two or more nanostructure stacks of the plurality of nanostructure stacks 111 that extend between the second source/drain regions 114 of the second pair 114a. For example, a fourth nanostructure stack 111d of the plurality of nanostructure stacks 111 is disposed over a sixth fin 106b of the second fins 106. The fourth nanostructure stack 111d comprises a fourth plurality of nanostructures 112d. The nanostructures of the fourth plurality of nanostructures 112d extend (in the "y" direction) between the second source/drain regions 114 of the second pair 114a. Corresponding selectively-conductive channels of the second plurality of selectively-conductive channels are disposed in the nanostructures of the fourth plurality of nanostructures 112d. The first GAAFET 126a comprises the first nanostructure stack 111a (and thus the selectively-conductive channels of the second plurality of conductive channels that correspond to the nanostructures of the first nanostructure stack 111a), the fourth nanostructure stack 111d (and thus the selectively-conductive channels of the second plurality of conductive channels that correspond to the nanostructures of the fourth nanostructure stack 111d), the second source/drain regions 114 of the second pair 114a, and the fourth gate 122b1.

In embodiments in which the first GAAFET 126a is a multi-nanostructure-stack GAAFET, the first GAAFET 126a may comprise any number of nanostructure stacks 111 that is greater than or equal to two. For example, the first GAAFET 126a may comprise two of the nanostructure stacks 111, three of the nanostructure stacks 111, etc. If the first GAAFET 126a comprises two of the nanostructure stacks 111, the first GAAFET 126a may be referred to as a two-nanostructure-stack GAAFET; if the first GAAFET 126a comprises three of the nanostructure stacks 111, the first GAAFET 126a may be referred to as a three-nanostructure-stack GAAFET; and so forth. It will be appreciated that, in some embodiments, the first GAAFET 126a may be a multi-nanostructure-stack GAAFET having two or more nanostructure stacks of the plurality of nanostructure stacks 111 that extend between second source/drain regions 114 of discrete pairs of the second source/drain regions 114 that are connected together via an overlying conductive feature (e.g., interconnect structure).

Figure 7A:
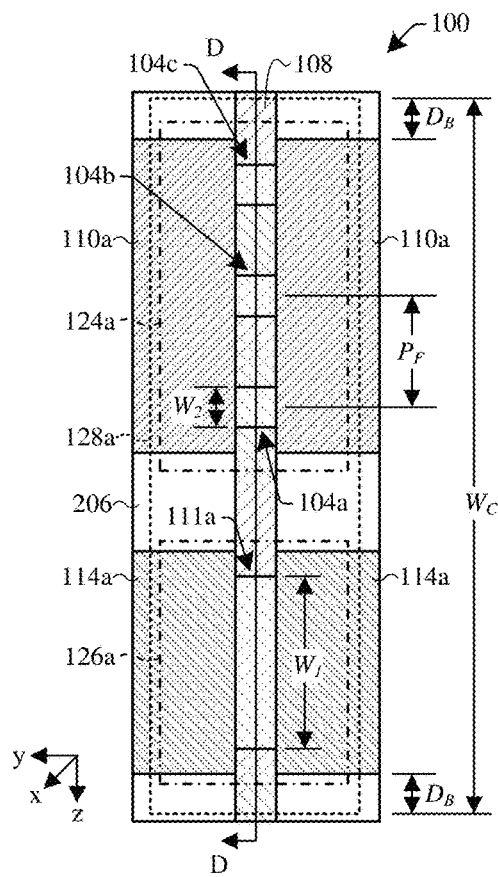
FIGS. 7A-7B illustrate various simplified views of some other embodiments of the IC of FIGS. 2A-2C.
Figure 7B:
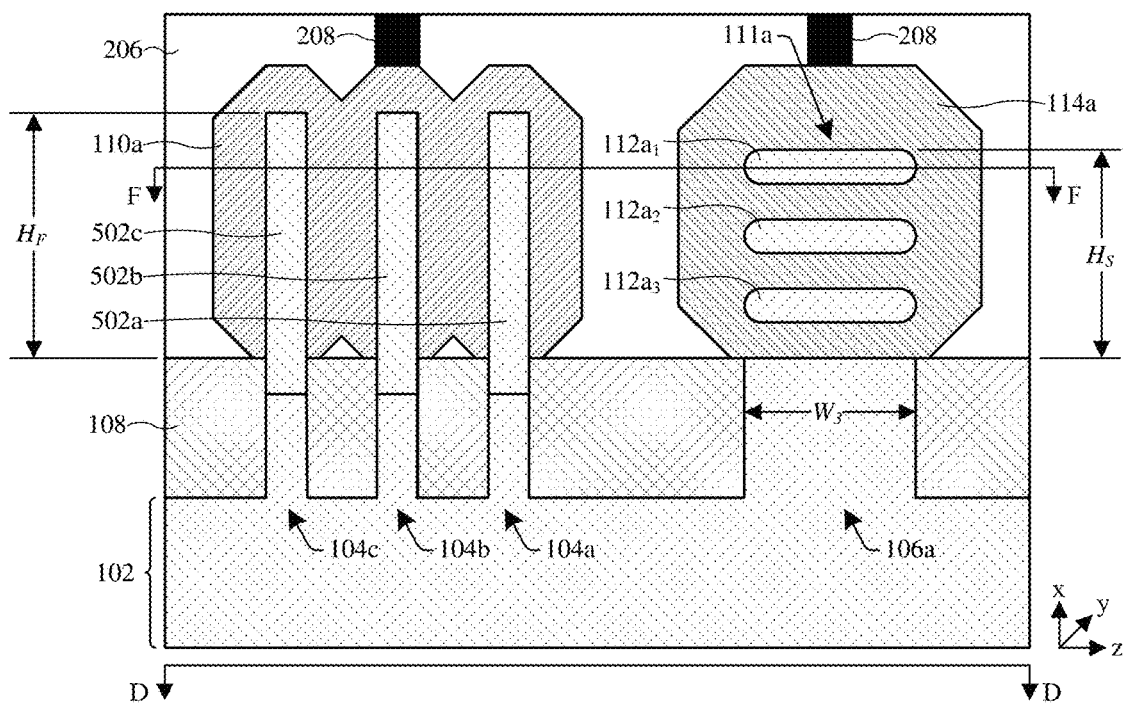

FIGS. 7A-7B illustrate various simplified views of some other embodiments of the IC 100 of FIGS. 2A-2C. FIGS. 7A-7B illustrate "simplified" views because some of the features of FIGS. 2A-2C are not illustrated in FIGS. 7A-7B (e.g., the plurality gate structures 116, the gate dielectric structures 120, the first sidewall spacers 202, the third sidewall spacers 204, etc.). FIG. 7A illustrates a cross-sectional view of some other embodiments of the IC 100 of FIGS. 2A-2C taken along line F-F of FIG. 7A. FIG. 7B illustrates a cross-sectional view of some embodiments of the IC of FIG. 7A taken along line D-D of FIG. 7A.

As shown in FIGS. 7A-7B, each of the nanostructures of the plurality of nanostructures 112 have a first width $W_1$ (e.g., first nanostructure width). The first width $W_1$ may be between 1 nanometer (nm) and 100 nm. Each of the first fins 104 have a second width $W_2$ (e.g., first fin width) that is less than or equal to the first width $W_1$. In some embodiments, the first fins 104 have a fin pitch $P_F$ (e.g., a distance (in the "z" direction) between center points of neighboring first fins) between 10 nm and 50 nm. Each of the second fins 106 have a third width $W_3$ (e.g., second fin width). In some embodiments, the third width $W_3$ is substantially the same as the first width $W_1$. In other embodiments, the first width $W_1$ is less than the third width $W_3$.

Each of the first fins 104 have a fin height $H_F$. The fin height $H_F$ is a distance (in the "x" direction) from uppermost surfaces of the first fins 104 to the upper surface of the isolation structure 108. In some embodiments, the fin height $H_F$ is between 10 nm and 150 nm. Each of the nanostructure stacks 111 have a stack height $H_S$. The stack height $H_S$ is a distance (in the "x" direction) from uppermost surfaces of uppermost nanostructures of the nanostructure stacks 111 to the upper surface of the isolation structure 108. In further embodiments, the stack height $H_S$ is between 10 nm and 150 nm. In yet further embodiments, the stack height $H_S$ is the same as the fin height $H_F$. In other embodiments, the stack height $H_S$ is different than the fin height $H_F$.

Each of the semiconductor devices 128 have a cell width $W_C$ between 50 nm and 500 nm. In some embodiments, the cell width $W_C$ is a distance (in the "z" direction) between outermost edges of outermost features of the semiconductor devices 128 (e.g., a distance (in the "z" direction) between an outermost edge of one of the second source/drain regions 114 of the second pair 114a and an outermost edge of one of the first source/drain regions 110 of the first pair 110a). In further embodiments, the cell width $W_C$ may comprise a predefined buffer distance $D_B$ that extends (in the "z" direction) from the outermost edges of the outermost features of the semiconductor devices 128 away from center points of the semiconductor devices 128. For consistency in the figures, the cell width We is referred to as a width, but it will be appreciated that, in some embodiments, the cell width may be referred to as a cell height.

Figure 8A:
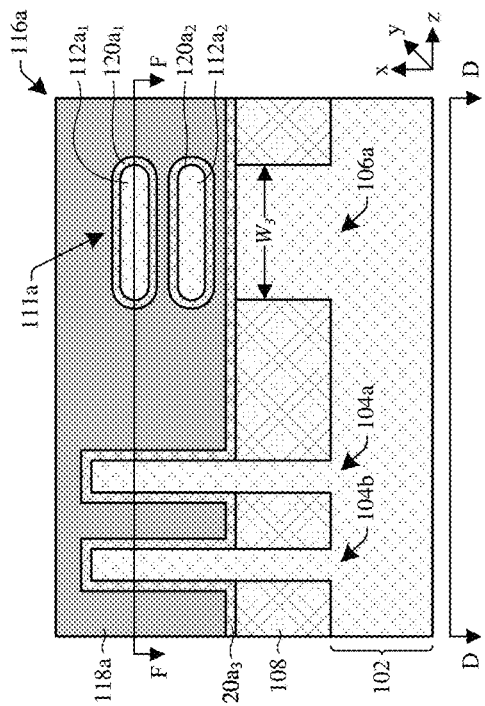
FIGS. 8A-8D illustrate various simplified views of some other embodiments of the IC of FIGS. 2A-2C.
Figure 8B:
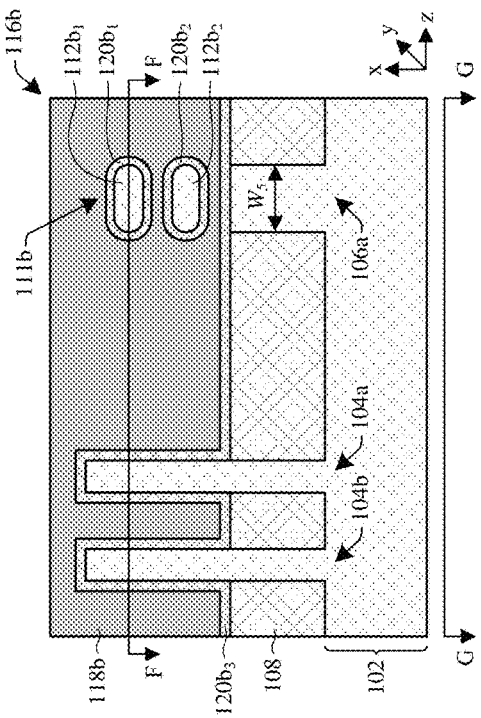
Figure 8C:
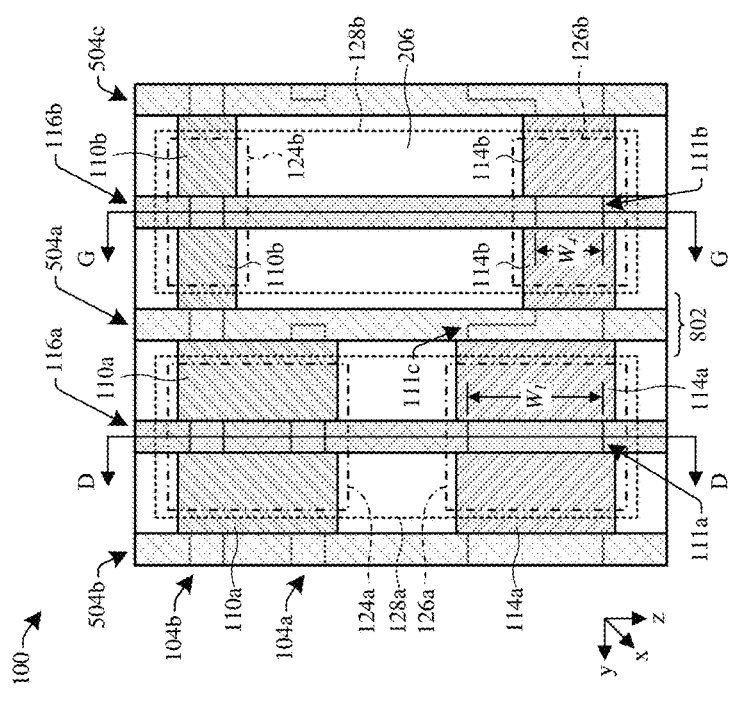
Figure 8D:
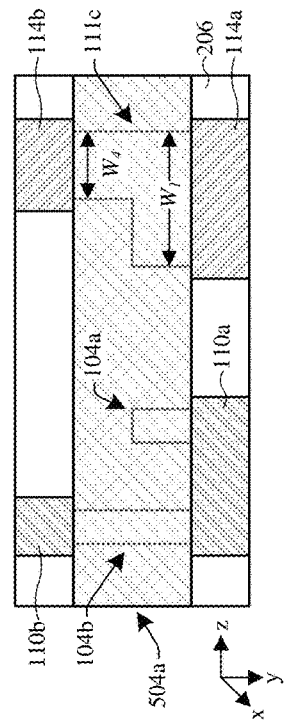

FIGS. 8A-8D illustrate various simplified views of some other embodiments of the IC 100 of FIGS. 2A-2C. FIGS. 8A-8D illustrate "simplified" views because some of the features of FIGS. 2A-2C are not illustrated in FIGS. 8A-8D (e.g., the first sidewall spacers 202, the third sidewall spacers 204, etc.). FIG. 8A illustrates a cross-sectional view of some other embodiments of the IC 100 of FIGS. 2A-2C taken along line F-F of FIG. 8C and FIG. 8D. FIG. 8B illustrates a magnified view of an area 802 of FIG. 8A. FIGS. 8A-8B illustrate the gate structures 116 and the dummy gate structures 504 as transparent. FIG. 8C illustrates a cross-sectional view of some embodiments of the IC of FIG. 8A taken along line D-D of FIG. 8A. FIG. 8D illustrates a cross-sectional view of some embodiments of the IC of FIG. 8A taken along line G-G of FIG. 8A.

As shown in FIG. 8A-8E, the first FinFET 124a and the second FinFET 124b comprise a different number of first fins 104. For example, the first FinFET 124a comprises the third fin 104a and the fifth fin 104b, and the second FinFET 124b only comprises the fifth fin 104b. In other words, the first FinFET 124a is a two-fin FinFET and the second FinFET 124b is a one-fin FinFET. In some embodiments, a sidewall of the third fin 104a is disposed between opposite sidewalls of the first dummy gate structure 504a. In other words, the transition between the number of first fins 104 of the first FinFET 124a and the number of first fins 104 of the second FinFET 124b occurs directly beneath the first dummy gate structure. It will be appreciated that the difference in the number of first fins 104 that the first FinFET 124a comprises and the number of first fins 104 the second FinFET 124b comprises may be any value. For example, the first FinFET 124a may be a three-fin FinFET and the second FinFET 124b may be a one-fin FinFET, the first FinFET 124a may be a three-fin FinFET and the second FinFET 124b may be a two-fin FinFET, the first FinFET 124a may be a one-fin FinFET and the second FinFET 124b may be a three-fin FinFET, etc.

In some embodiments, the width of the nanostructures of the nanostructure stack of the first GAAFET 126a is different than the width of the nanostructures of the nanostructure stack of the second GAAFET 126b. For example, the second GAAFET 126b comprises a third nanostructure stack 111b. The third nanostructure stack 111b comprises a third plurality of nanostructures 112b. The nanostructures of the first plurality of nanostructures 112a have the first width $W_1$, and the nanostructures of the third plurality of nanostructures 112b have a fourth width $W_4$ that is less than the first width $W_1$, or vice versa. Because the nanostructures of the first plurality of nanostructures 112a have the first width $W_1$ and the nanostructures of the third plurality of nanostructures 112b have the fourth width $W_4$, device performance of the IC 100 may be improved (e.g., reduced power consumption).

In some embodiments, a difference between the first width $W_1$ and the fourth width $W_4$ is between 1 nm and 90 nm. If the difference is less than 1 nm, the device performance of the IC 100 may not be sufficiently improved; if the difference is greater than 90 nm, a cost to manufacture the IC 100 may be increased without sufficiently improving the device performance of the IC 100. In further embodiments, the difference between the first width $W_1$ and the fourth width $W_4$ is between 1 nm and 50 nm. If the difference is less than 1 nm, the device performance of the IC 100 may not be sufficiently improved; if the difference is greater than 50 nm, a cost to manufacture the IC 100 may be increased without sufficiently improving the device performance of the IC 100.

In some embodiments, seventh portions of the nanostructures of the second plurality of nanostructures have the first width $W_1$ and eighth portions of the nanostructures of the second plurality of nanostructures have the fourth width $W_4$, or vice versa. In other words, the nanostructures of the second plurality of nanostructures transition from having the first width $W_1$ to having the fourth width $W_4$. In further embodiments, the transition from the first width $W_1$ to the fourth width $W_4$ occurs between opposite sidewalls of the first dummy gate structure 504a. In other words, the transition from the first width $W_1$ to the fourth width $W_4$ occurs directly beneath the first dummy gate structure 504a.

In some embodiments, the widths of the second fins 106 transition in relation to the width transitions of the nanostructures. For example, the fourth fin 106a has the third width $W_3$ directly beneath the first nanostructure stack 111a, and the fourth fin 106a has a fifth width $W_5$ directly beneath the third nanostructure stack 111b that is less than the third width $W_3$, or vice versa. In further embodiments, the transition from the third width $W_3$ to the fifth width $W_5$ occurs between the opposite sidewalls of the first dummy gate structure 504a. In other words, the transition from the third width $W_3$ to the fifth width $W_5$ occurs directly beneath the first dummy gate structure 504a. The fifth width $W_5$ may be substantially the same as the fourth width $W_4$. In other embodiments, the fifth width $W_5$ is less than the fourth width $W_4$. In yet further embodiments, the third width $W_3$ is greater than the fourth width $W_4$.

In other embodiments, the one of the stacks of semiconductor layers may take the place of the second nanostructure stack 111c. In such embodiments, a ninth portion of the one of the stacks of semiconductor layers has the first width $W_1$ (or the third width $W_3$) and a tenth portion of the one of the stacks of semiconductor layers has the fourth width $W_4$ (or the fifth width $W_5$), or vice versa. In other words, the one of the stacks of semiconductor layers transitions from having the first width $W_1$ (or the third width $W_3$) to having the fourth width $W_4$ (or the fifth width $W_5$). In further such embodiments, the widths of the second fins 106 transition in relation to the width transitions of the stacks of semiconductor layers.

Figure 9B:
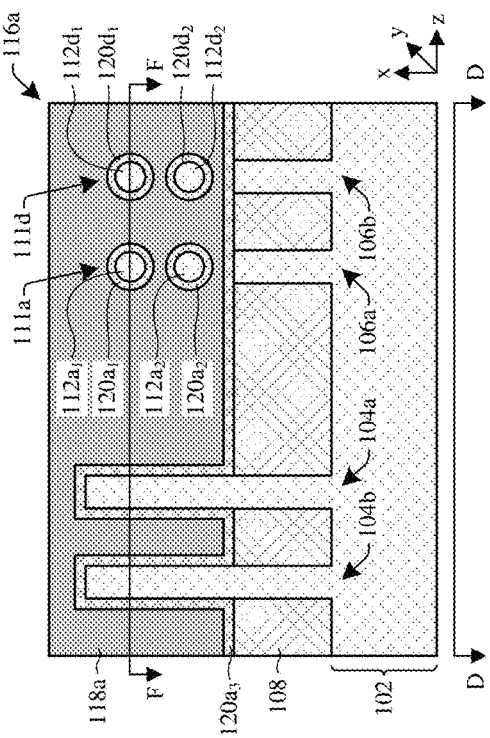
FIGS. 9A-9C illustrate various simplified views of some other embodiments of the IC of FIGS. 2A-2C.
Figure 9C:
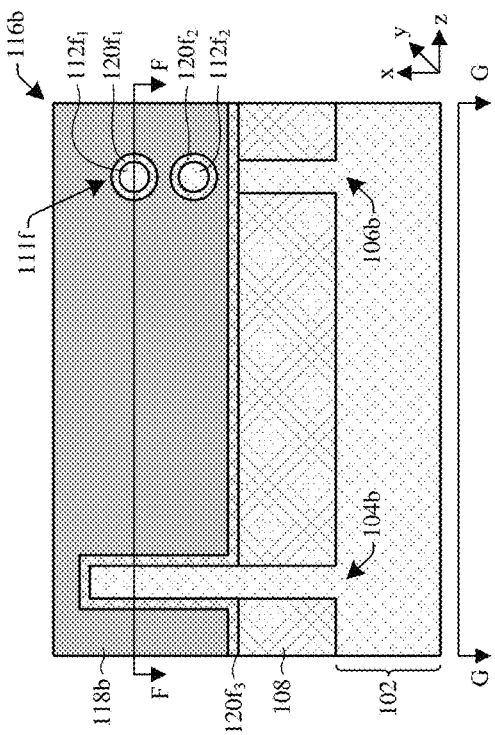
Figure 9A:
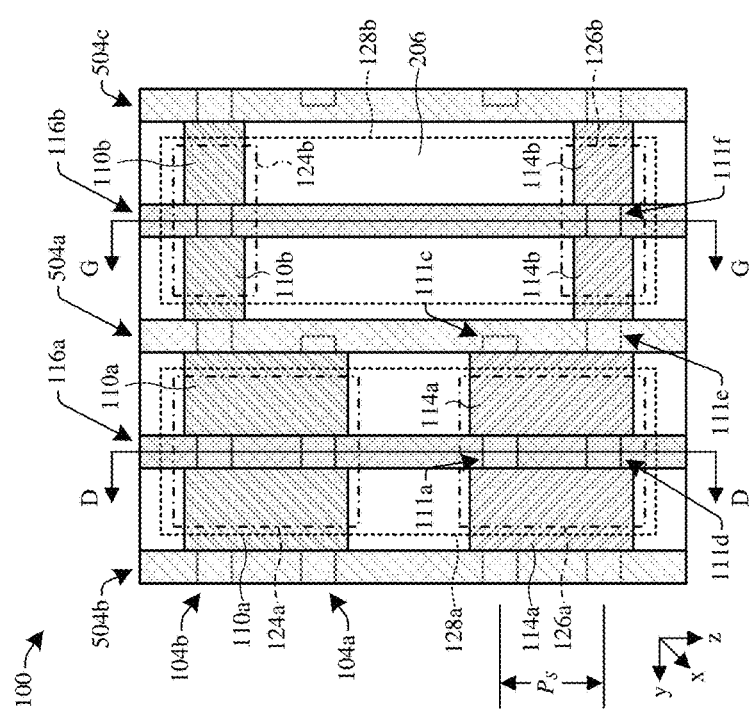

FIGS. 9A-9C illustrate various simplified views of some other embodiments of the IC 100 of FIGS. 2A-2C. FIGS. 9A-9C illustrate "simplified" views because some of the features of FIGS. 2A-2C are not illustrated in FIGS. 9A-9C (e.g., the first sidewall spacers 202, the third sidewall spacers 204, etc.). FIG. 9A illustrates a cross-sectional view of some other embodiments of the IC 100 of FIGS. 2A-2C taken along line F-F of FIG. 9B and FIG. 9C. FIG. 9A illustrates the gate structures 116 and the dummy gate structures 504 as transparent. FIG. 9B illustrates a cross-sectional view of some embodiments of the IC of FIG. 9A taken along line D-D of FIG. 9A. FIG. 9C illustrates a cross-sectional view of some embodiments of the IC of FIG. 9A taken along line G-G of FIG. 9A.

As shown in FIGS. 9A-9C, the first GAAFET 126a has a different number of nanostructure stacks 111 than the second GAAFET 126b. For example, the first GAAFET 126a comprises the first nanostructure stack 111a and the fourth nanostructure stack 111d, and the second GAAFET only comprises a fifth nanostructure stack 111f of the plurality of nanostructure stacks 111. In other words, the first GAAFET 126a is a two-nanostructure-stack GAAFET, and the second GAAFET 126b is a one-nanostructure-stack GAAFET. Because the first GAAFET 126a has a different number of nanostructure stacks 111 than the second GAAFET 126b, device performance of the IC 100 may be improved (e.g., educed power consumption). It will be appreciated that the difference in the number of nanostructure stacks 111 that the first GAAFET 126a comprises and the number of nanostructure stacks 111 the second GAAFET 126b comprises may be any value. For example, the first GAAFET 126a may be a three-nanostructure-stack GAAFET and the second GAAFET 126b may be a one-nanostructure-stack GAAFET, the first GAAFET 126a may be a three-nanostructure-stack GAAFET and the second GAAFET 126b may be a two-nanostructure-stack GAAFET, the first GAAFET 126a may be a one-nanostructure-stack GAAFET and the second GAAFET 126b may be a three-nanostructure-stack GAAFET, etc.

In some embodiments, the nanostructures of the second nanostructure stack 111c may have sidewalls disposed between the opposite sidewalls of the first dummy gate structure 504a. In other words, the transition from two-nanostructure stacks to one-nanostructure stack occurs directly beneath the first dummy gate structure 504a. In some embodiments, the nanostructure stacks 111 have a stack pitch $P_S$ (e.g., a distance (in the "z" direction) between center points of neighboring nanostructure stacks) between 10 nm and 50 nm. In some embodiments, the stack pitch $P_S$ may be the same as the fin pitch $P_F$. In other embodiments, the stack pitch $P_S$ may be different than the fin pitch $P_F$.

Figure 10:
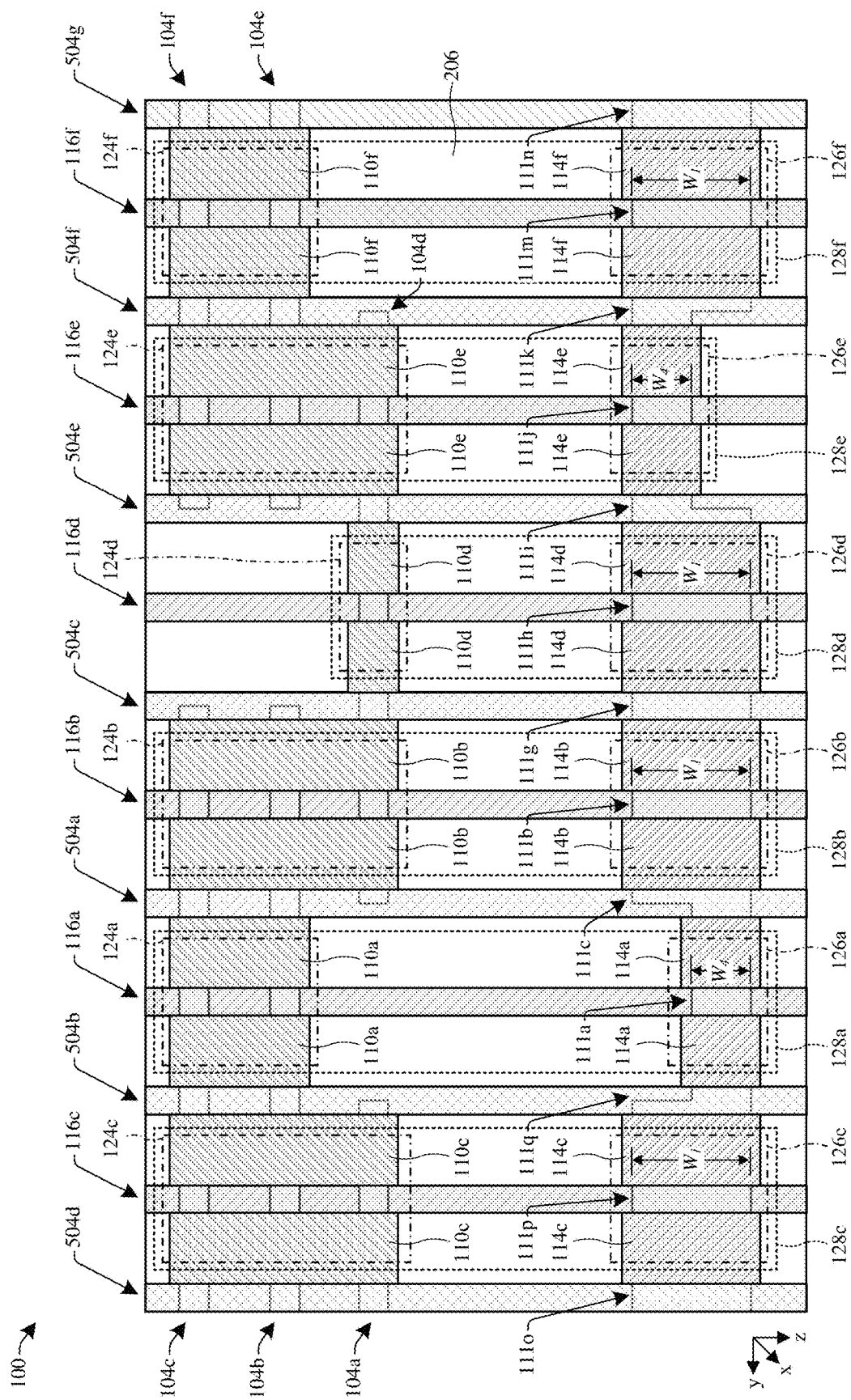
FIG. 10 illustrates a cross-sectional view of some other embodiments of the IC of FIG. 8A taken along line F-F of FIG. 8C and FIG. 8D.

FIG. 10 illustrates a cross-sectional view of some other embodiments of the IC 100 of FIG. 8A taken along line F-F of FIG. 8C and FIG. 8D. FIG. 10 illustrates the gate structures 116 and the dummy gate structures 504 as transparent As shown in FIG. 10, various transitions between the number of first fins 104 of neighboring FinFETs and various transitions between the widths of the nanostructures of neighboring GAAFETs are illustrated. FIG. 10 illustrates a symmetrical transition between the number of first fins 104 of neighboring FinFETs and the widths of the nanostructures of neighboring GAAFETs. For example, the first FinFET 124a and the first GAAFET 126a are disposed in-line (in the "z" direction) with one another. The first FinFET 124a is a two-fin FinFET, the second FinFET 124b is a three-fin FinFET, and a third FinFET 124c is a three-fin FinFET. A first transition between the number of first fins 104 of the second FinFET 124b to the number of first fins 104 of the first FinFET 124a occurs directly beneath the first dummy gate structure 504a, and a second transition between the number of first fins 104 of the second FinFET 124b to the number of first fins 104 of the third FinFET 124c occurs directly beneath the second dummy gate structure 504b. The nanostructures of the first GAAFET 126a have the fourth width $W_4$, the nanostructures of the second GAAFET 126b have the first width $W_1$, and the nanostructures of a third GAAFET 126c have the first width $W_1$. A third transition from the first width $W_1$ to the fourth width $W_4$ occurs directly beneath the second dummy gate structure 504b, and a fourth transition from the fourth width $W_4$ to the first width $W_1$ occurs directly beneath the first dummy gate structure 504a.

Further, FIG. 10 illustrates an asymmetrical transition between the number of first fins 104 of neighboring FinFETs and the widths of the nanostructures of neighboring GAAFETs. For example, a fourth FinFET 124d is disposed in-line (in the "z" direction) with a fourth GAAFET 126d, and a fifth GAAFET 126e is disposed in-line (in the "z" direction) with a fifth FinFET 124e. The second FinFET 124b is a three-fin FinFET, the fourth FinFET 124d is a one-fin FinFET, and the fifth FinFET 124e is a three-fin FinFET. A fifth transition between the number of first fins 104 of the second FinFET 124b to the number of first fins 104 of the fourth FinFET 124d occurs directly beneath a third dummy gate structure 504c, and a sixth transition between the number of first fins 104 of the fourth FinFET 124d to the number of first fins 104 of the fifth FinFET 124e occurs directly beneath a fourth dummy gate structure 504e. The nanostructures of the fifth GAAFET 126e have the fourth width $W_4$, the nanostructures of the fourth GAAFET 126d have the first width $W_1$, and the nanostructures of a sixth GAAFET 126f have the first width $W_1$. A seventh transition from the first width $W_1$ to the fourth width $W_4$ occurs directly beneath the fourth dummy gate structure 504e, and an eight transition from the fourth width $W_4$ to the first width $W_1$ occurs directly beneath a fifth dummy gate structure 504f. In embodiments in which the GAAFETs have different numbers of nanostructure stacks 111 (see, e.g., FIGS. 9A-9C), it will be appreciated that the symmetrical and asymmetrical transitions may apply except with transitions in the number of nanostructure stacks 111, rather than transitions in the widths of the nanostructures.

FIGS. 11A-11B illustrate various simplified views of some other embodiments of the IC 100 of FIGS. 2A-2C. FIGS. 11A-11B illustrate "simplified" views because some of the features of FIGS. 2A-2C are not illustrated in FIGS. 11A-11B (e.g., the first sidewall spacers 202, the third sidewall spacers 204, etc.). FIG. 11A illustrates a cross-sectional view of some other embodiments of the IC 100 of FIGS. 2A-2C taken along line F-F of FIG. 11B. FIG. 11A illustrates the gate structures 116 as transparent. FIG. 11B illustrates a cross-sectional view of some embodiments of the IC of FIG. 11A taken along line H-H of FIG. 11A.

As shown in FIGS. 11A-11B, the first semiconductor device 128a comprises the first FinFET 124a, the second FinFET 124b, the first GAAFET 126a, the second GAAFET 126b, a seventh GAAFET 126g, and an eighth GAAFET 126h. The first GAAFET 126a and the second GAAFET 126b are spaced (in the "z" direction) from the seventh GAAFET 126g and the eighth GAAFET 126h. The first GAAFET 126a is disposed in-line (in the "y" direction) with the second GAAFET 126b, and the seventh GAAFET 126g is disposed in-line (in the "y" direction) with the eighth GAAFET 126h. The first FinFET 124a and the second FinFET 124b are both disposed between the first GAAFET 126a and the seventh GAAFET 126g (in the "z" direction).

In some embodiments, neighboring GAAFETs (and/or neighboring FinFETs) share source/drain region. For example, the first GAAFET 126a and the second GAAFET 126b share a first shared source/drain region 114a/b, which is one of the second source/drain regions 114, and the seventh GAAFET 126g and the eighth GAAFET 126h share a second shared source/drain region 114g/h, which is another one of the second source/drain regions 114. It will be appreciated, that in some embodiments, the first GAAFET 126a and the second GAAFET 126b and/or the seventh GAAFET 126g and the eighth GAAFET 126h may not share a second source/drain region. In such embodiments, the second source/drain regions 114 of the second pair 114a are spaced (in the "y" direction) from the second source/drain regions 114 of the fourth pair 114b, and the second source/drain regions 114 of a fifth pair 114g are spaced (in the "y" direction) from the second source/drain regions 114 of a sixth pair 114h.

In some embodiments, the first semiconductor device 128a is a memory cell (e.g., SRAM cell) of a memory device (e.g., SRAM). More specifically, in some embodiments, the first semiconductor device 128a may be a six-transistor (6T) SRAM cell. For example, the first FinFET 124a may be a first pull-up transistor, the second FinFET 124b may be a second pull-up transistor, the first GAAFET 126a may be a first pull-down transistor, the second GAAFET 126b may be a first access transistor, the seventh GAAFET 126g may be a second access transistor, and the eighth GAAFET 126h may be a second pull-down transistor.

A third source/drain region $114a_1$, which is one of the second source/drain regions 114 of the second pair 114a, and a fourth source/drain region 114h1, which is one of the second source/drain regions 114 of the sixth pair 114h, are electrically coupled to a first voltage (e.g., ground via the interconnect structure). A fifth source/drain region $110a_1$, which is one of the first source/drain regions 110 of the first pair 110a, and a sixth source/drain region 110b1, which is one of the first source/drain regions 110 of the third pair 110b, are electrically coupled to a second voltage (e.g., Vdd via the interconnect structure). A seventh source/drain region 114b1, which is one of the second source/drain regions 114 of the fourth pair 114b, is electrically coupled to a first bit line (e.g., a first set of conductive features of the interconnect structure). An eighth source/drain region 114gi, which is one of the second source/drain regions 114 of the fifth pair 114g, is electrically coupled to a second bit line (e.g., bit line bar (e.g., a second set of conductive features of the interconnect structure)). The first gate structure 116a; the second shared source/drain region 114g/h; and a ninth source/drain region 110b2, which is one of the first source/drain regions 110 of the third pair 110b, are electrically coupled together (e.g., via the interconnect structure). A second gate structure 116b; the first shared source/drain region 114a/b; and a tenth source/drain region 110a2, which is one of the first source/drain regions 110 of the first pair 110a, are electrically coupled together (e.g., via the interconnect structure). A third gate structure 116g and a fourth gate structure 116h are electrically coupled to a word line (e.g., a third set of conductive feature of the interconnect structure).

Figure 12C:
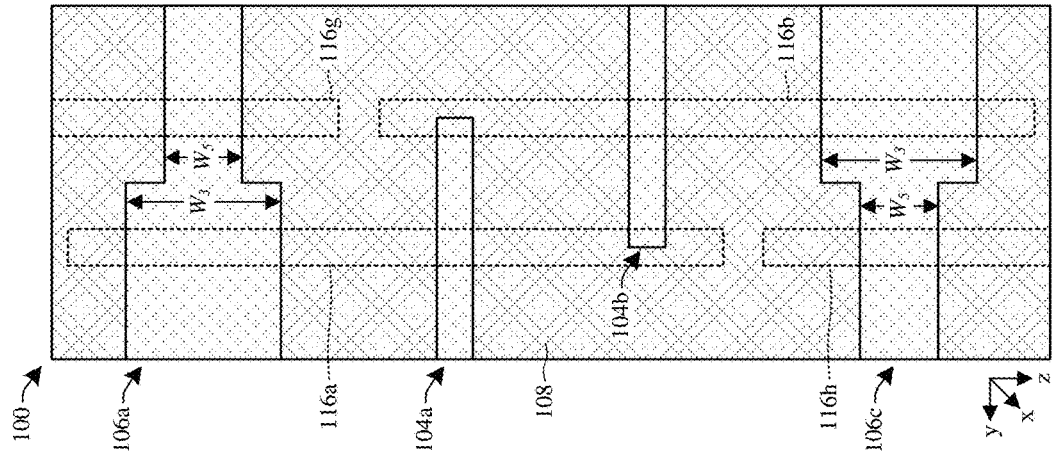
FIGS. 12A-12C illustrate cross-sectional views of some other embodiments of the IC of FIG. 11A taken along line J-J of FIG. 11B.
Figure 12B:
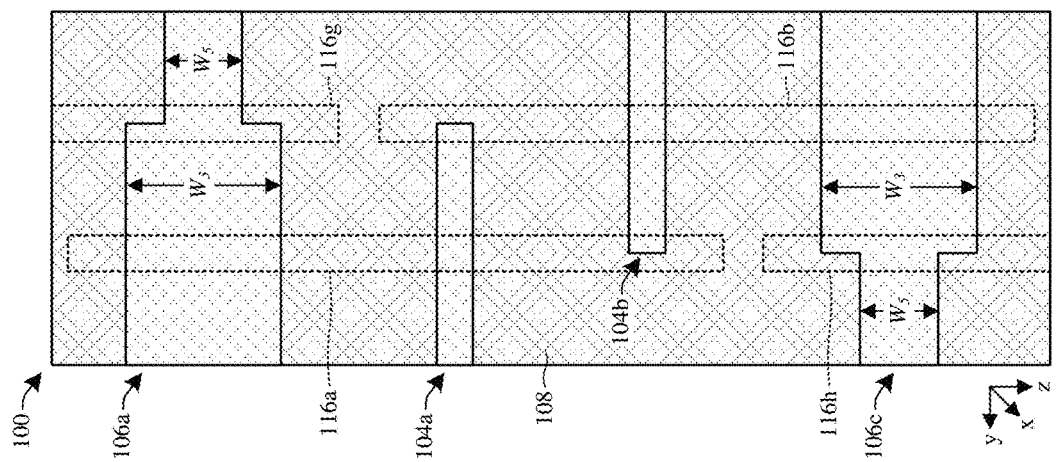
Figure 12A:
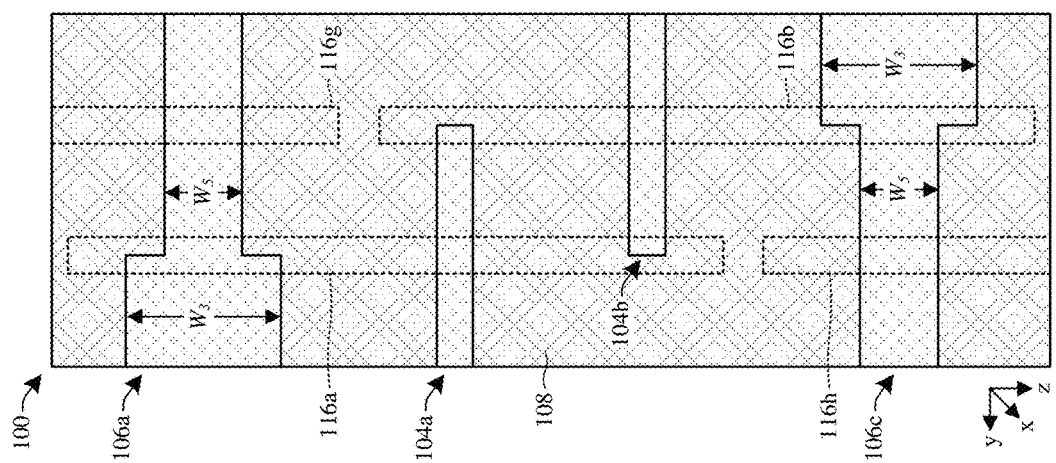

FIGS. 12A-12C illustrate cross-sectional views of some other embodiments of the IC 100 of FIG. 11A taken along line J-J of FIG. 11B. FIGS. 12A-12C illustrate the gate structures 116 in phantom (e.g., with a dashed line).

As shown in FIG. 12A-12C, the fourth fin 106a has the third width $W_3$ and the fifth width $W_5$, and a seventh fin 106c of the second fins 106 has the third width $W_3$ and the fifth width $W_5$. As shown in FIG. 12A, the fourth fin 106a transitions from the third width $W_3$ to the fifth width $W_5$ directly beneath the first gate structure 116a, and the seventh fin 106c transitions from the fifth width $W_5$ to the third width $W_3$ directly beneath the second gate structure 116b. If a variation in the device performances of the first GAAFET 126a and the second GAAFET 126b (and/or the seventh GAAFET 126g and the eighth GAAFET 126h) meets a predefined specification of the IC 100, the width transitions of the fourth fin 106a and the seventh fin 106c may occur directly beneath the first gate structure 116a and directly beneath the second gate structure 116b. As shown in FIG. 12B, the fourth fin 106a transitions from the third width $W_3$ to the fifth width $W_5$ directly beneath the third gate structure 116g, and the seventh fin 106c transitions from the fifth width $W_5$ to the third width $W_3$ directly beneath the fourth gate structure 116h. If a variation in the device performances of the first GAAFET 126a and the second GAAFET 126b (and/or the seventh GAAFET 126g and the eighth GAAFET 126h) meets a predefined specification of the IC 100, the width transitions of the fourth fin 106a and the seventh fin 106c may occur directly beneath the third gate structure 116g and directly beneath the fourth gate structure 116h. More specifically, if a predefined specification of a 6T SRAM cell is met with a relatively large variation in the device performances of the pull-down transistors and/or the access transistors, the width transitions of the fourth fin 106a and the seventh fin 106c may occur directly beneath the gates of the access transistors and/or directly beneath the gates of the pull-down transistors.

As shown in FIG. 12C, the fourth fin 106a transitions from the third width $W_3$ to the fifth width $W_5$ between the first gate structure 116a and the third gate structure 116g, and the seventh fin 106c transitions from the fifth width $W_5$ to the third width $W_3$ between the second gate structure 116b and the fourth gate structure 116h. If a variation in the device performances of the first GAAFET 126a and the second GAAFET 126b (and/or the seventh GAAFET 126g and the eighth GAAFET 126h) does not meet a predefined specification of the IC 100, the width transitions of the fourth fin 106a and the seventh fin 106c may occur between the second gate structure 116b and the fourth gate structure 116h. More specifically, if a predefined specification of a 6T SRAM cell is met with a relatively small variation (e.g., smaller than the relatively large variation) in the device performances of the pull-down transistors and/or the access transistors, the width transitions of the fourth fin 106a and the seventh fin 106c occur between the gates of the access transistors and the gates of the pull-down transistors.

Figure 13:
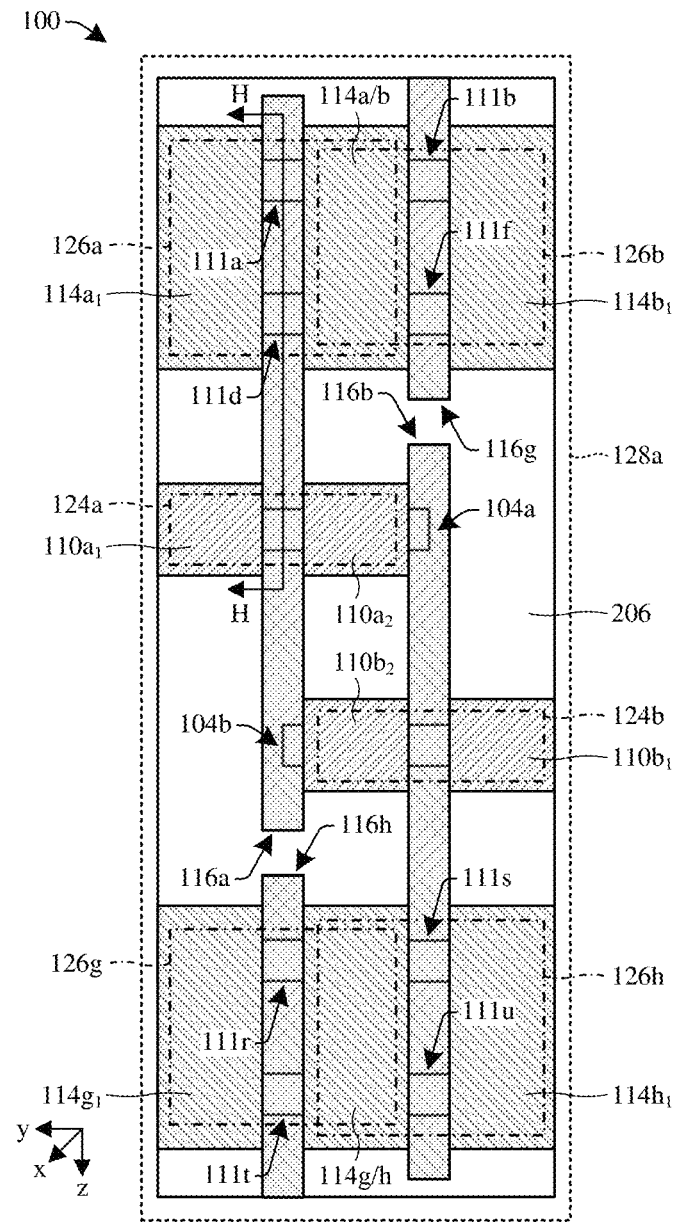
FIG. 13 illustrates a cross-sectional view of some other embodiments of the IC of FIG. 11A taken along line J-J of FIG. 11B.

FIG. 13 illustrates a cross-sectional view of some other embodiments of the IC 100 of FIG. 11A taken along line F-F of FIG. 11B. FIG. 13 illustrates the gate structures 116 as transparent. As shown in FIG. 13, the first GAAFET 126a, the second GAAFET 126b, the seventh GAAFET 126g, and the eighth GAAFET 126h may be multi-nanostructure-stack GAAFETs.

Figure 14A:
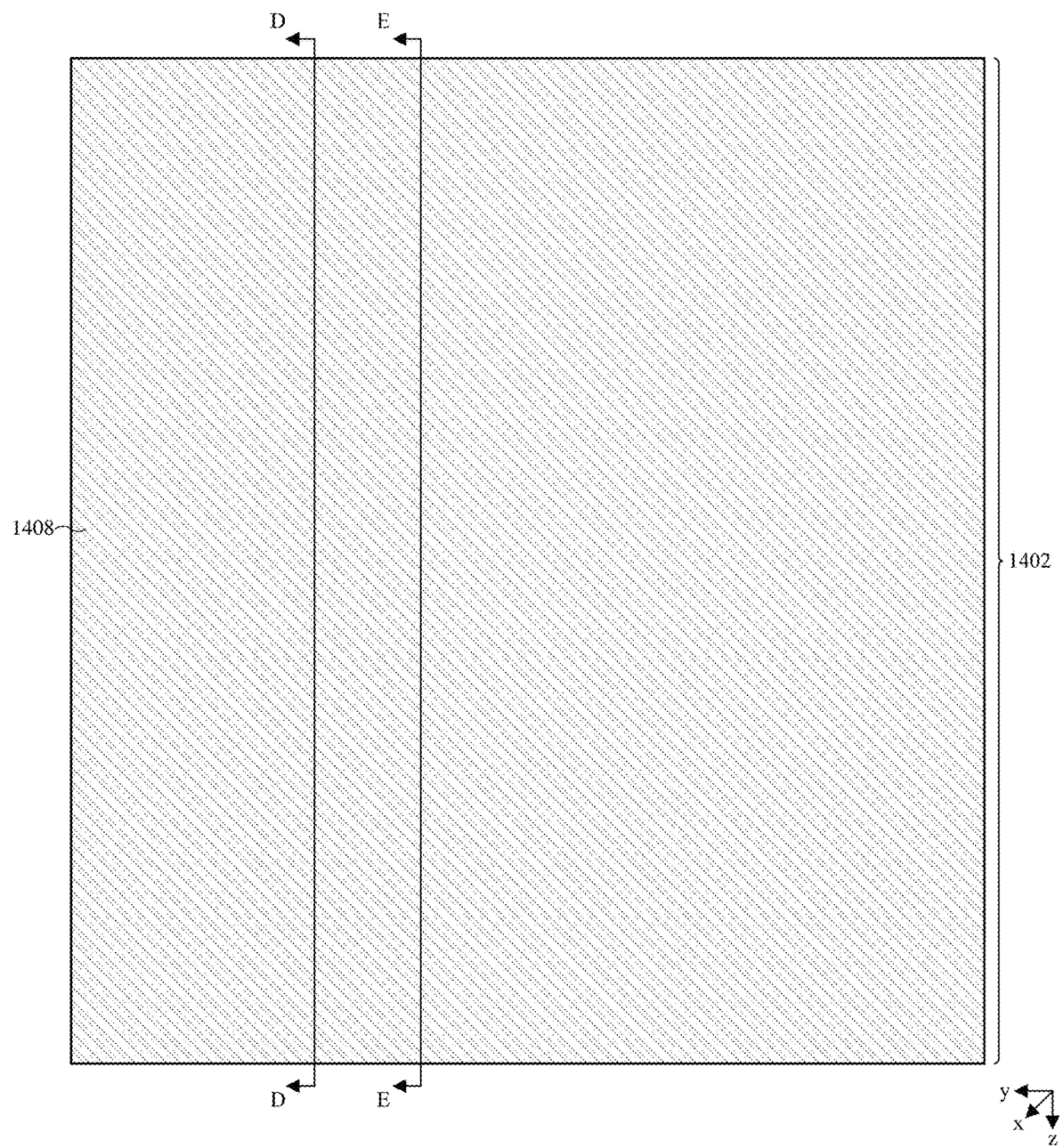
FIGS. 14A-14C through FIGS. 29A-29C illustrate a series of various views of some embodiments of a method for forming some embodiments of the IC of FIGS. 5A-5C.
Figure 14B:
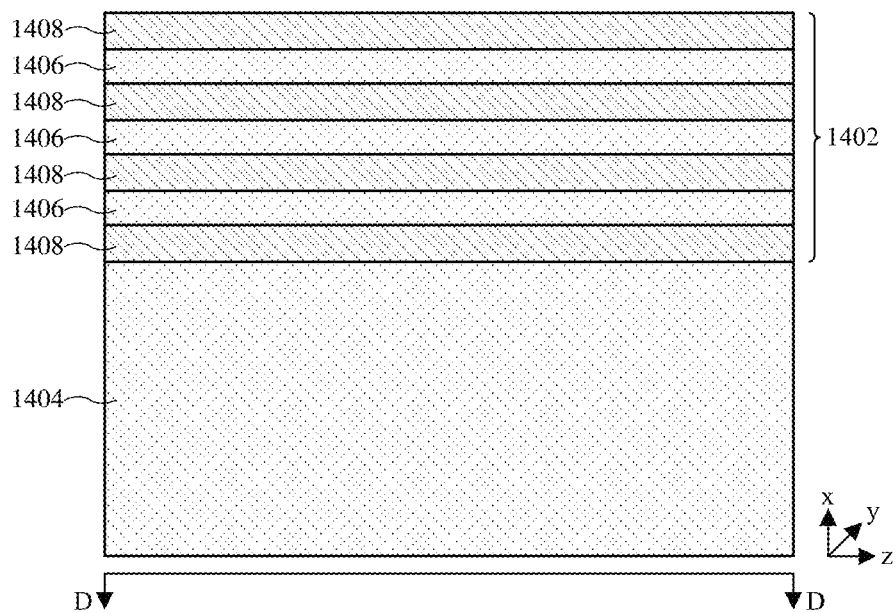
Figure 14C:
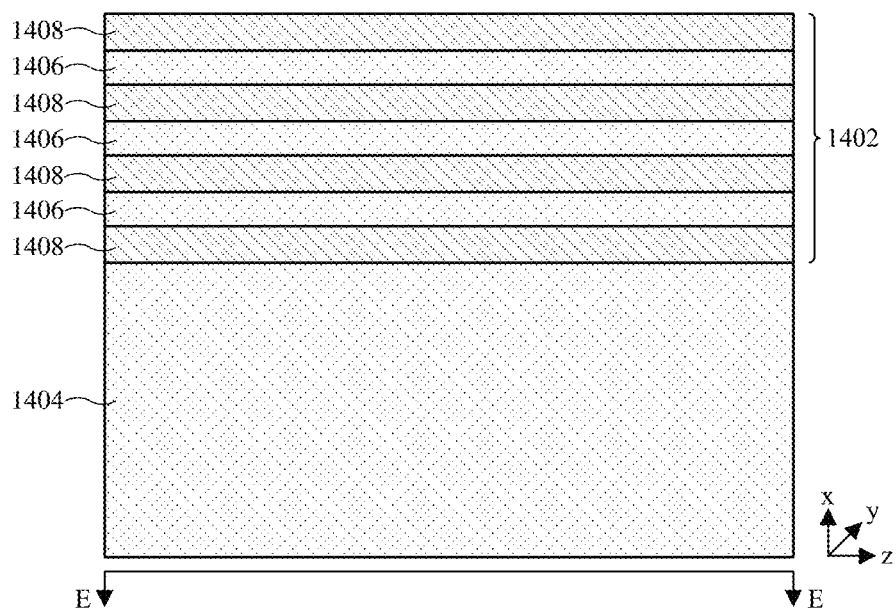

FIGS. 14A-14C through FIGS. 29A-29C illustrate a series of various views of some embodiments of a method for forming some embodiments of the IC of FIGS. 5A-5C. Figures with a suffix of "A" (e.g., FIG. 14A) illustrate a series of layout views of some embodiments for forming some embodiments of the IC 100 of FIGS. 5A-5C. Figures with the suffix "B" (e.g., FIG. 14B) illustrate a series of cross-sectional views taken along line D-D of corresponding figures of FIGS. 14A-28A (e.g., FIG. 14B illustrates a cross-sectional view of the structure in FIG. 14A taken along line D-D of FIG. 14A). Figures with the suffix "C" (e.g., FIG. 14C) illustrate a series of cross-sectional views taken along line E-E of corresponding figures of FIGS. 14A-28A (e.g., FIG. 14C illustrates a cross-sectional view of the structure in FIG. 14A taken along line E-E of FIG. 14A).

As shown in FIGS. 14A-14C, a first stack 1402 of semiconductor layers is formed over a base semiconductor structure 1404 (e.g., a semiconductor wafer, semiconductor substrate, etc.). The base semiconductor structure 1404 is or comprises the first semiconductor material. In some embodiments, the base semiconductor structure 1404 has the first lattice orientation.

The first stack 1402 of semiconductor layers comprises alternating layers of a third semiconductor material (e.g., Si, SiGe, Ge, etc.) and a fourth semiconductor material (e.g., Si, SiGe, Ge, etc.). For example, the first stack 1402 of semiconductor layers comprises a plurality of first semiconductor layers 1406 and a plurality of second semiconductor layers 1408. The first semiconductor layers 1406 are or comprise the third semiconductor material. The second semiconductor layers 1408 are or comprise the fourth semiconductor material. The third semiconductor material is different than the fourth semiconductor material. For example, the third semiconductor material is Si and the fourth semiconductor material is SiGe. In such embodiments, the first stack 1402 of semiconductor layers comprises alternating layers of SiGe and Si.

In some embodiments, the third semiconductor material is the same as the first semiconductor material. For example, both the third semiconductor material and the first semiconductor material are Si. In other embodiments, the third semiconductor material is different than the first semiconductor material. For example, the third semiconductor material is SiGe (or Ge) and the first semiconductor material is Si. In further embodiments, the second semiconductor layers 1408 have the fourth lattice orientation.

In some embodiments, a process for forming the first stack 1402 of semiconductor layers comprises epitaxially forming the first semiconductor layers 1406 and the second semiconductor layers 1408. For example, a first one of the second semiconductor layers 1408 is grown on the base semiconductor structure 1404 by a first epitaxial process, such as, vapor-phase epitaxy (VPE), liquid-phase epitaxy (LPE), molecular-beam epitaxy (MBE), some other epitaxial process, or a combination of the foregoing. Thereafter, a first one of the first semiconductor layers 1406 is grown on the first one of the second semiconductor layers 1408 by a second epitaxial process, such as, VPE, LPE, MBE, some other epitaxial process, or a combination of the foregoing. The first epitaxial process and the second epitaxial process are repeated in an alternative manner until the first stack 1402 of semiconductor layers is formed.

Figure 15A:
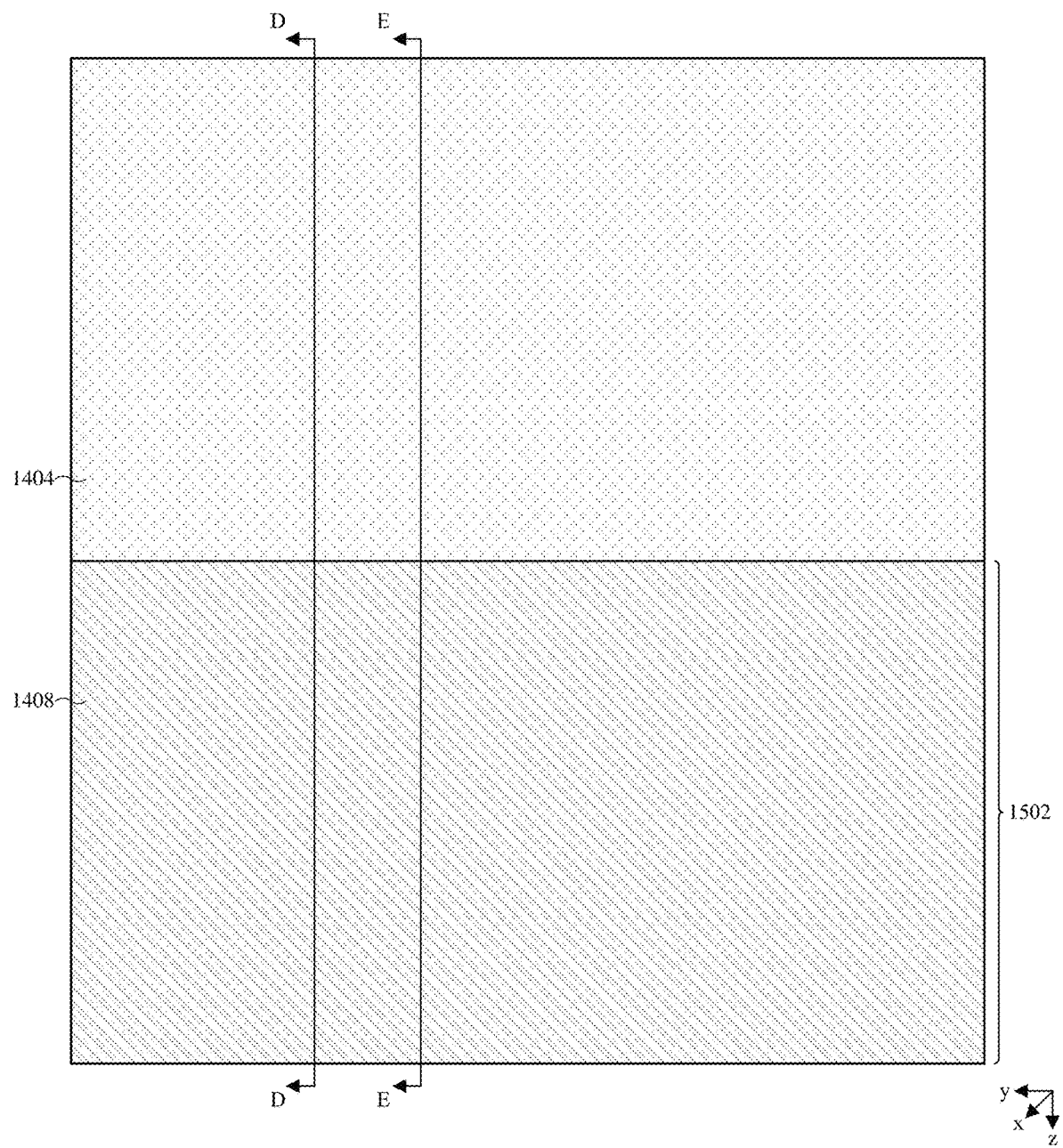
Figure 15B:
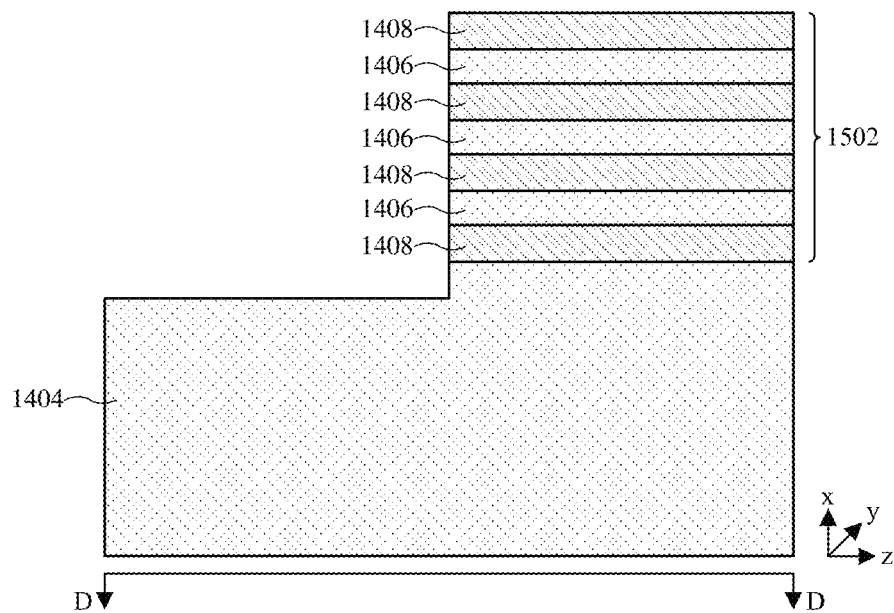
Figure 15C:
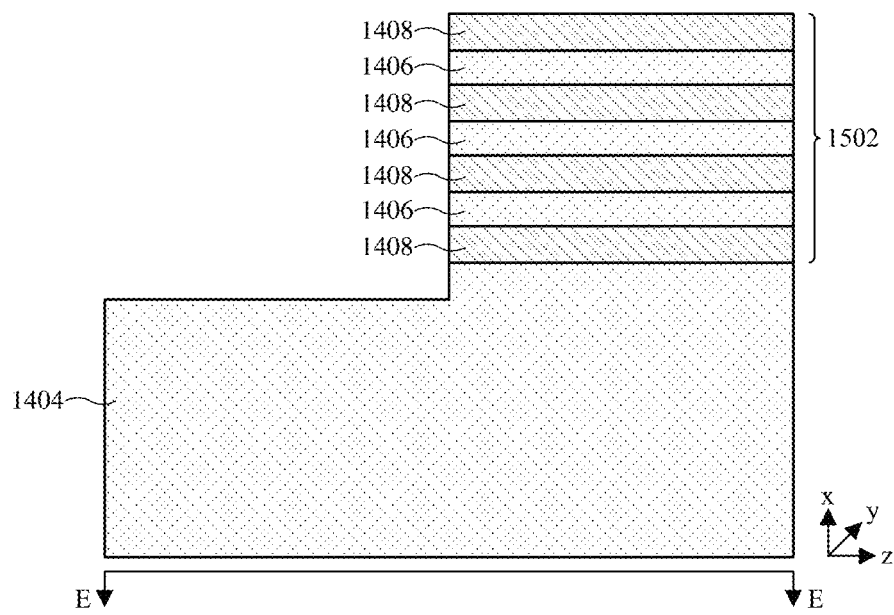

As shown in FIGS. 15A-15C, a second stack 1502 of semiconductor layers is formed over the base semiconductor structure 1404. In some embodiments, a process for forming the second stack 1502 of semiconductor layers comprises forming a first patterned masking layer (not shown) (e.g., positive/negative photoresist, hardmask, etc.) over the first stack 1402 of semiconductor layers (see, e.g., FIGS. 14A-14C). In further embodiments, the first patterned masking layer may be formed by forming a masking layer (not shown) over the first stack 1402 of semiconductor layers, exposing the masking layer to a pattern (e.g., via a lithography process, such as photolithography, extreme ultraviolet lithography, or the like), and developing the masking layer to form the first patterned masking layer.

Thereafter, a first etching process is performed on the first stack 1402 of semiconductor layers to remove unmasked portions of the first stack 1402 of semiconductor layers, thereby forming the second stack 1502 of semiconductor layers. The first etching process may be a dry etching process, a wet etching process, a reactive ion etching (RIE) process, some other etching process, or a combination of the foregoing. The second stack 1502 of semiconductor layers comprises the portion of the first stack 1402 of semiconductor layers remaining after the first etching process. In some embodiments, the first etching process removes a first portion of the base semiconductor structure 1404 that is disposed on a side of the second stack 1502 of semiconductor layers, such that the base semiconductor structure 1402 has a first upper surface disposed over a second upper surface. The second stack 1502 of semiconductor layers covers the first upper surface, and the second upper surface is disposed on the side of the second stack 1502 of semiconductor layers.

It will be appreciated that, in some embodiments, the second stack 1502 of semiconductor layers is one stack of semiconductor layers of a first plurality of stacks of semiconductor layers formed by the first etching process. The stacks of semiconductor layers of the first plurality of stacks of semiconductor layers may comprise similar features (e.g., structural features) as the second stack 1502 of semiconductor layers. In some embodiments, the stacks of semiconductor layers of the first plurality of stacks of semiconductor layers may be spaced from one another (in the "z" direction). In further embodiments, the stacks of semiconductor layers of the first plurality of stacks of semiconductor layers may extend (in the "y" direction) in parallel with one another.

Figure 16A:
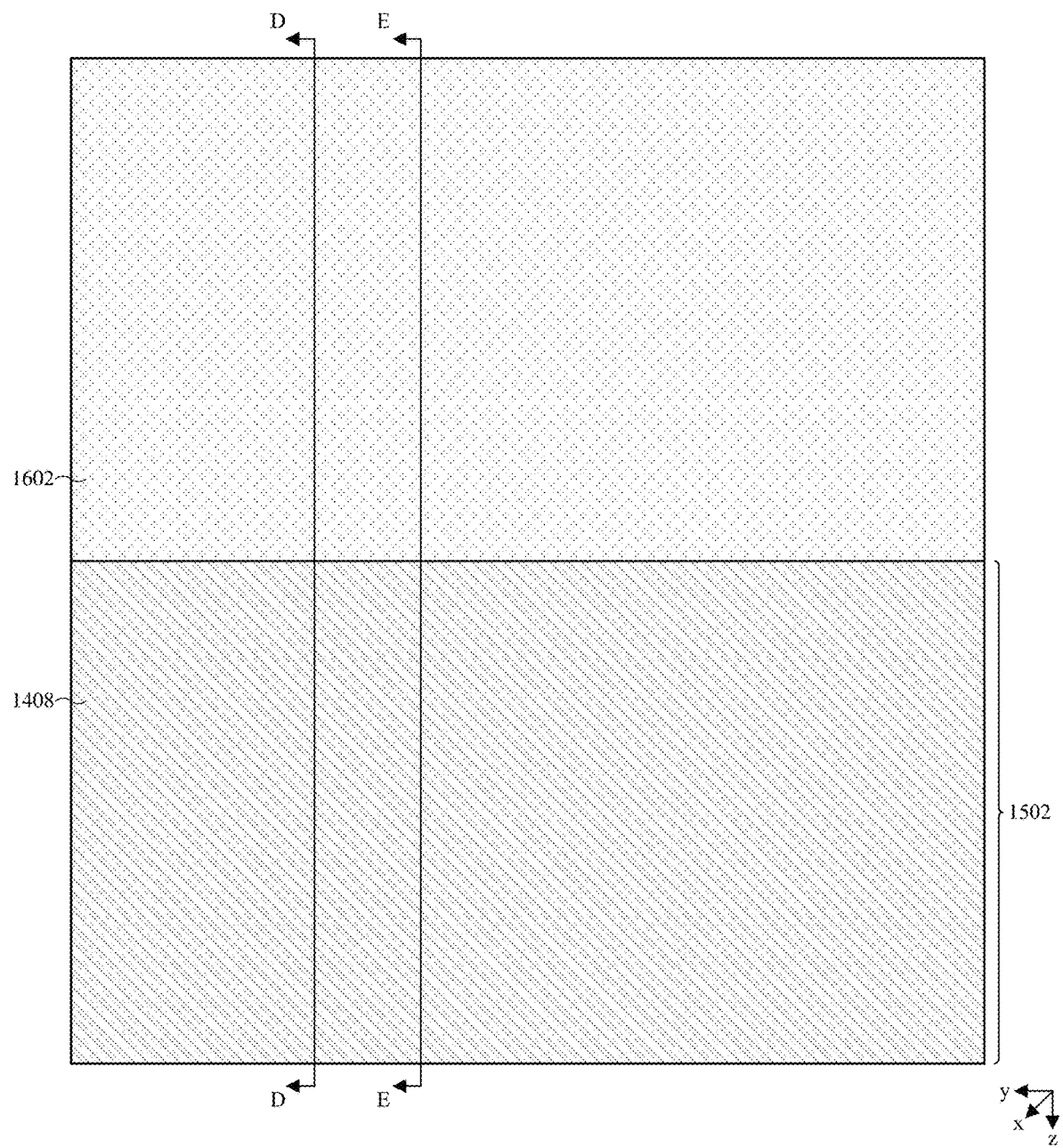
Figure 16B:
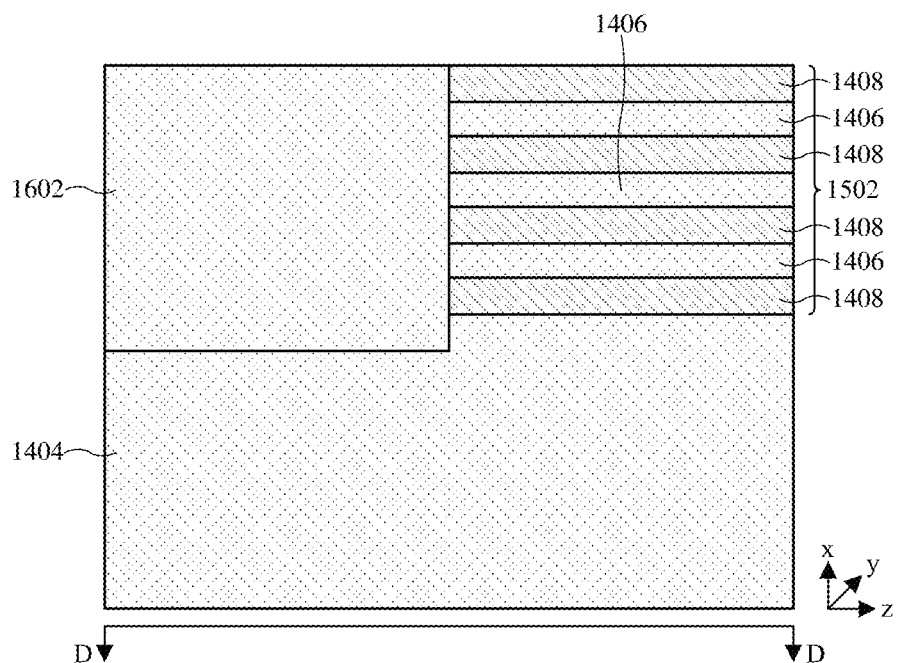
Figure 16C:
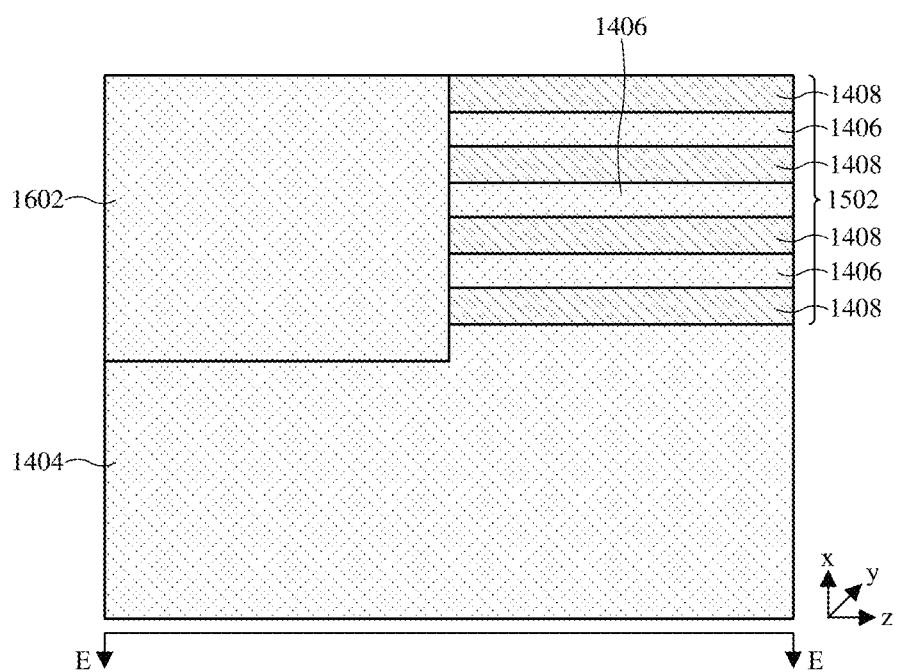

As shown in FIGS. 16A-16C, a third epitaxial semiconductor structure 1602 is formed over the base semiconductor structure 1404 and on the side of the second stack 1502 of semiconductor layers. The third epitaxial semiconductor structure 1602 is or comprises an epitaxial semiconductor material (e.g., a semiconductor material formed by an epitaxial process, such as epitaxial Si, epitaxial Ge, epitaxial SiGe, etc.). In some embodiments, the third epitaxial semiconductor structure 1602 has the second lattice orientation. In further embodiments, the third epitaxial semiconductor structure 1602 is formed with a bottommost surface disposed beneath a bottommost surface of the second stack 1502 of semiconductor layers. In other embodiments, the bottommost surface of the third epitaxial semiconductor structure 1602 is co-planar with the bottommost surface of the second stack 1502 of semiconductor layers.

In some embodiments, a process for forming the third epitaxial semiconductor structure 1602 comprises epitaxially forming the third epitaxial semiconductor structure 1602. For example, a third epitaxial process is performed to grow the third epitaxial semiconductor structure 1602 from the base semiconductor structure 1404. The third epitaxial process forms the third epitaxial semiconductor structure 1602 on the side of the second stack 1502 of semiconductor layers and extending vertically (in the "x" direction). In some embodiments, the third epitaxial process may be, for example, VPE, LPE, MBE, some other epitaxial process, or a combination of the foregoing. Thereafter, in some embodiments, a planarization process (e.g., chemical-mechanical polishing (CMP)) is then performed on the third epitaxial semiconductor structure 1602 to co-planarize an uppermost surface of the third epitaxial semiconductor structure 1602 and an uppermost surface of the second stack 1502 of semiconductor layers.

In some embodiments, the third epitaxial process may be performed with the first patterned masking layer in place masking the second stack 1502 of semiconductor layers. In such embodiments, the first patterned masking layer is removed after the third epitaxial process (e.g., via the planarization process). In other embodiments, the first patterned masking layer may be removed before the third epitaxial process is performed. In such embodiments, a second patterned masking layer may be formed masking the second stack 1502 of semiconductor layers, and/or the third epitaxial process may be a selective epitaxial process that is more selective to the base semiconductor structure 1404 that the second semiconductor layers 1408.

It will be appreciated that, in some embodiments, the third epitaxial semiconductor structure 1602 is one epitaxial semiconductor structure of a second plurality of epitaxial semiconductor structures formed by the third epitaxial process. The epitaxial semiconductor structures of the second plurality of epitaxial semiconductor structures may comprise similar features (e.g., structural features) as third epitaxial semiconductor structure 1602. In some embodiments, epitaxial semiconductor structures of the second plurality of epitaxial semiconductor structures are disposed between the stacks of semiconductor layers of the first plurality of stacks of semiconductor layers.

Figure 17A:
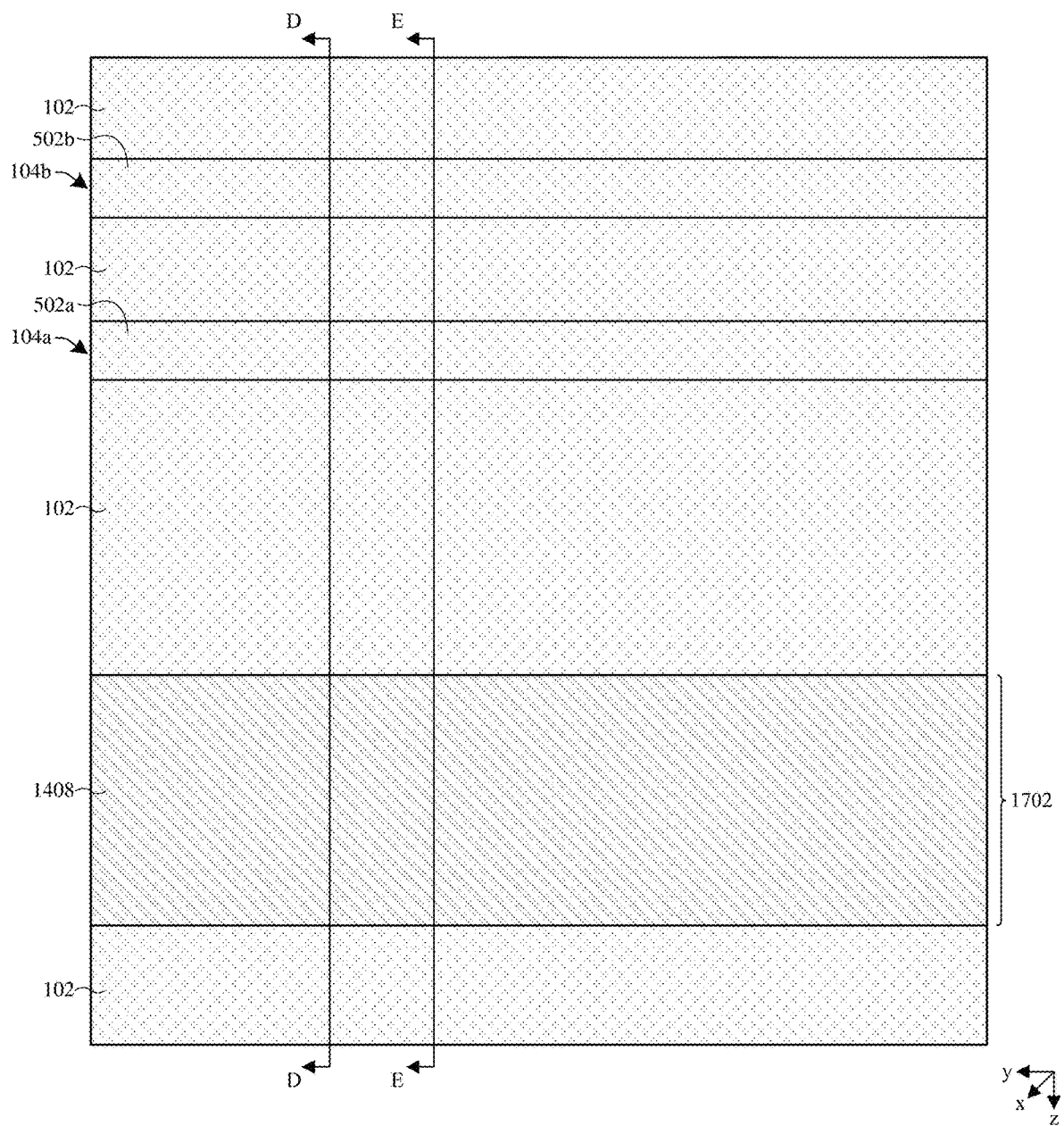
Figure 17B:
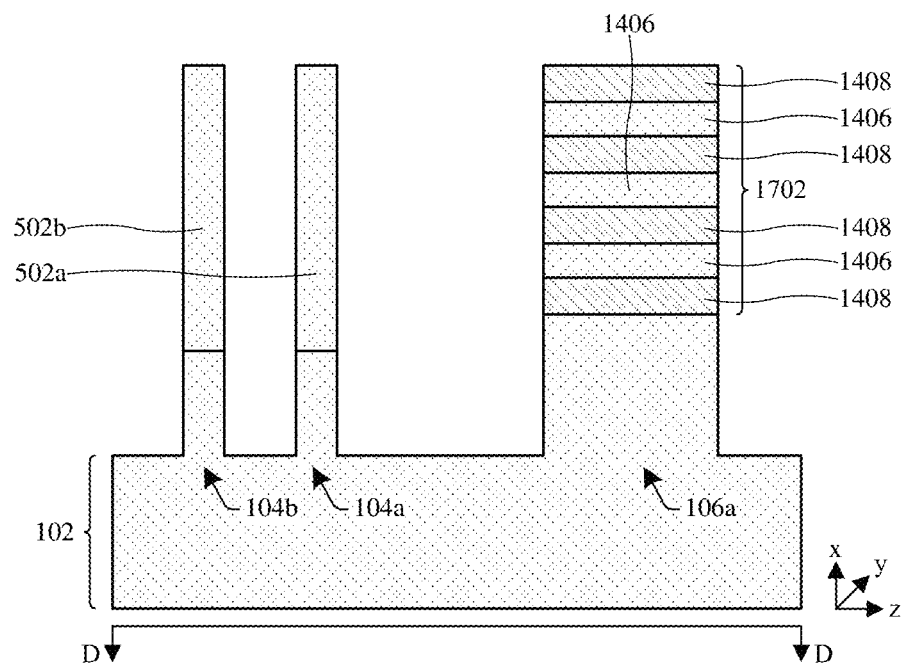
Figure 17C:
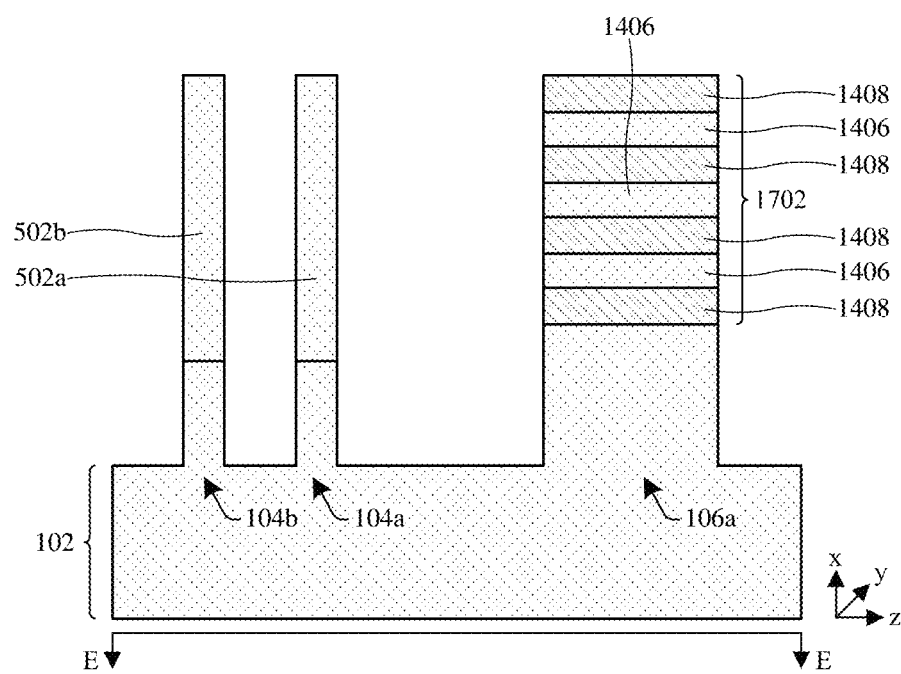

As shown in FIGS. 17A-17C, a semiconductor substrate 102 is formed, and a plurality of first fins 104 and a plurality of second fins 106 are formed projecting vertically (in the "x" direction) from the semiconductor substrate 102 and extending laterally (in the "y" direction) across the semiconductor substrate 102. For example, a third fin 104a of the first fins 104, a fourth fin 106a of the second fins 106, and a fifth fin 104b of the first fins 104 are formed projecting vertically (in the "x" direction) from the semiconductor substrate 102 and extending laterally (in the "y" direction) across the semiconductor substrate 102. In some embodiments, forming the first fins 104 comprises forming a first plurality of epitaxial semiconductor structures 502. For example, forming the third fin 104a comprises forming a first epitaxial semiconductor structure 502a, and forming the fifth fin 104b comprises forming a second epitaxial semiconductor structure 502b. Further, a third stack 1702 of semiconductor layers is formed over the fourth fin 106a.

In some embodiments, a process for forming the semiconductor substrate 102, the first fins 104, the second fins 106, and the third stack 1702 of semiconductor layers comprises forming a third patterned masking layer over the third epitaxial semiconductor structure 1602, the second stack 1502 of semiconductor layers, and the base semiconductor structure 1404 (see, e.g., FIGS. 16A-16C). Thereafter, a second etching process is performed on the third epitaxial semiconductor structure 1602, the second stack 1502 of semiconductor layers, and the base semiconductor structure 1404. The second etching process may be a dry etching process, a wet etching process, a RIE process, some other etching process, or a combination of the foregoing. The second etching process removes unmasked portions of the third epitaxial semiconductor structure 1602, unmasked portions of the base semiconductor structure 1404, and unmasked portions of the second stack 1502 of semiconductor layers, thereby forming the semiconductor substrate 102, the first fins 104, the second fins 106, and the third stack 1702 of semiconductor layers.

The semiconductor substrate 102 comprises a lower portion of the base semiconductor structure 1404 remaining after the second etching process. The third stack 1702 of semiconductor layers comprises a portion of the second stack 1502 of semiconductor layers remaining after the second etching process. The second fins 106 comprise first upper portions of the base semiconductor structure 1404 remaining after the second etching process. The epitaxial semiconductor structures 502 comprise portions of the third epitaxial semiconductor structure 1602 remaining after the second etching process. The first fins 104 comprise second upper portions of the base semiconductor structure 1404 remaining after the second etching process and comprise the epitaxial semiconductor structures 502. For example, the third fin 104a comprises one of the second upper portions of the base semiconductor structure 1404 and the first epitaxial semiconductor structure 502a, and the fifth fin 104b comprises another one of the second upper portions of the base semiconductor structure 1404 and the second epitaxial semiconductor structure 502b. The first upper portions and the second upper portions of the base semiconductor structure 1404 are disposed over the lower portion of the base semiconductor structure 1404.

It will be appreciated that, in some embodiments, the third stack 1702 of semiconductor layers is one stack of semiconductor layers of a second plurality of stacks of semiconductor layers that are formed over the second fins 106 by the second etching process. The stacks of semiconductor layers of the second plurality of stacks of semiconductor layers may comprise similar features (e.g., structural features) as the third stack 1702 of semiconductor layers.

In some embodiments, the first fins 104 and second fins 106 may be formed by one or more patterning processes. For example, the second fins 106 may be formed by a first patterning process, and the first fins 104 may be formed by a second patterning process that is different than the first patterning process. The first patterning process may comprise forming a fourth patterned masking layer over the third epitaxial semiconductor structure 1602, the second stack 1502 of semiconductor layers, and the base semiconductor structure 1404. The fourth patterned masking layer may be formed by exposing a masking layer to a pattern via EUV lithography. Thereafter, a third etching process (e.g., wet etch, dry etch, RIE, etc.) is performed on the second stack 1502 of semiconductor layers and the base semiconductor structure 1404 to remove unmasked portions of the second stack 1502 of semiconductor layers and the base semiconductor structure 1404, thereby forming the second fins 106 and the third stack 1702 of semiconductor layers. The second patterning process may be, for example, a mandrel-spacer double patterning process, some other multiple patterning process, or a combination of the foregoing.

Figure 18A:
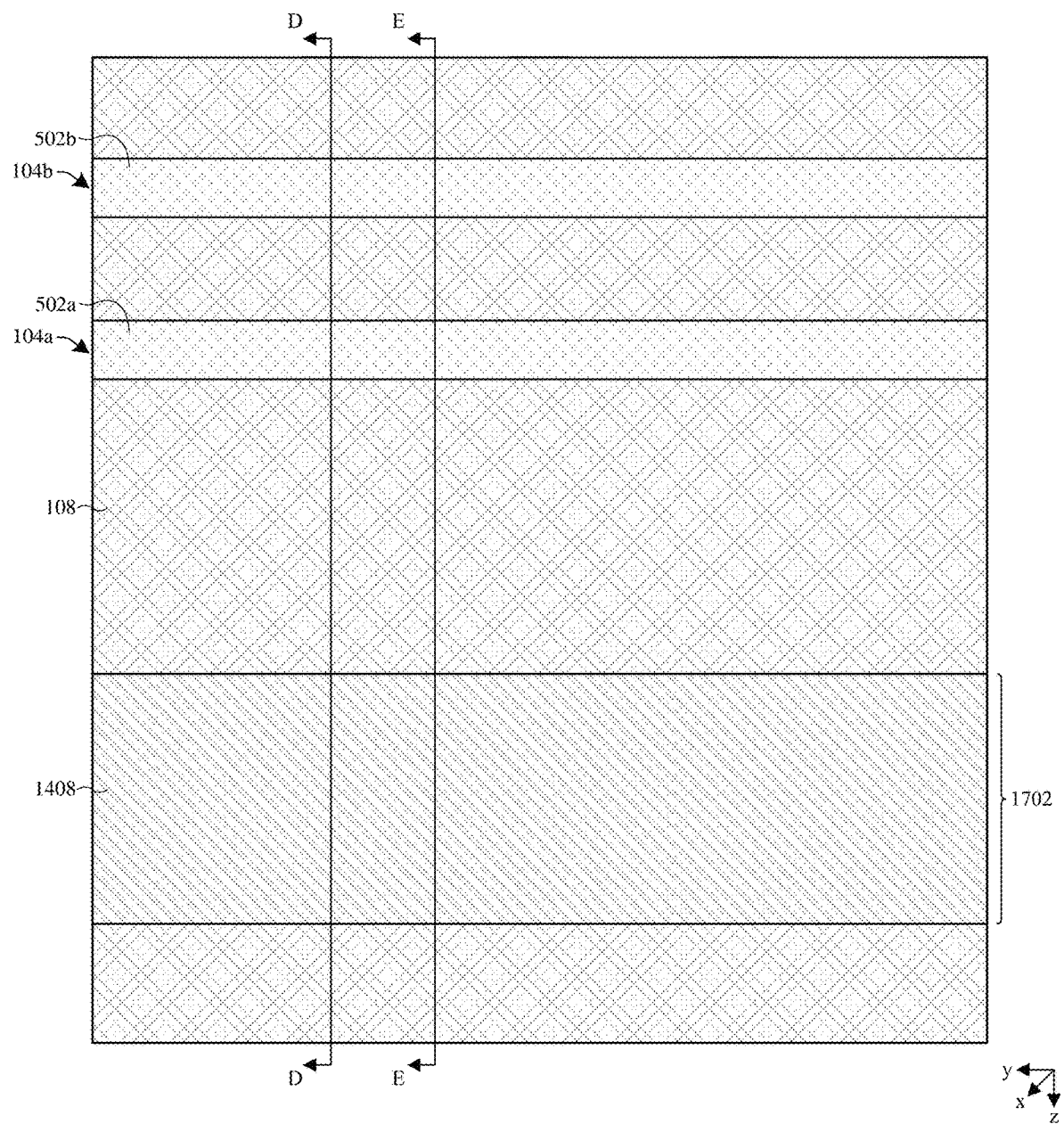
Figure 18B:
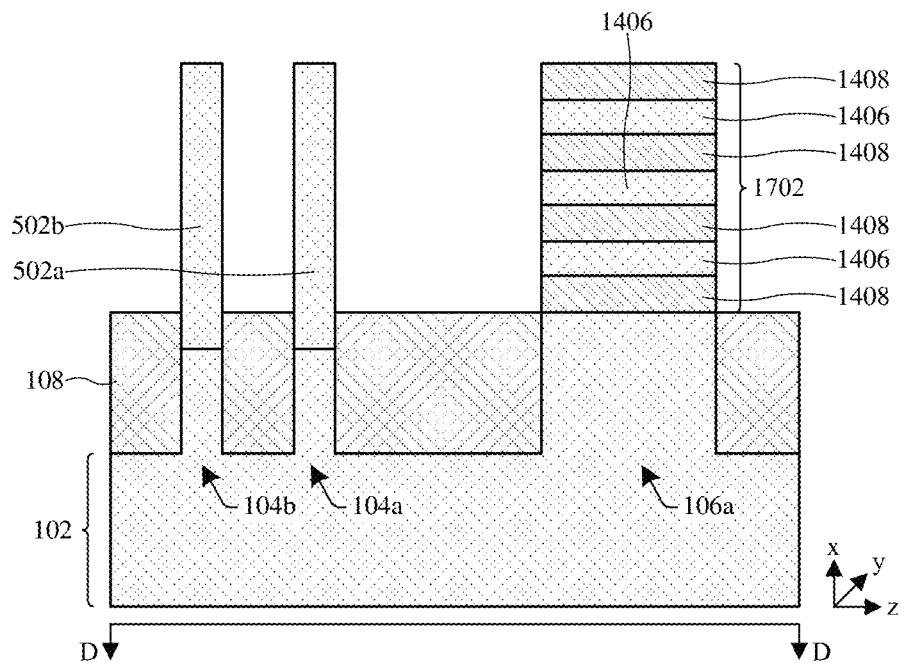
Figure 18C:
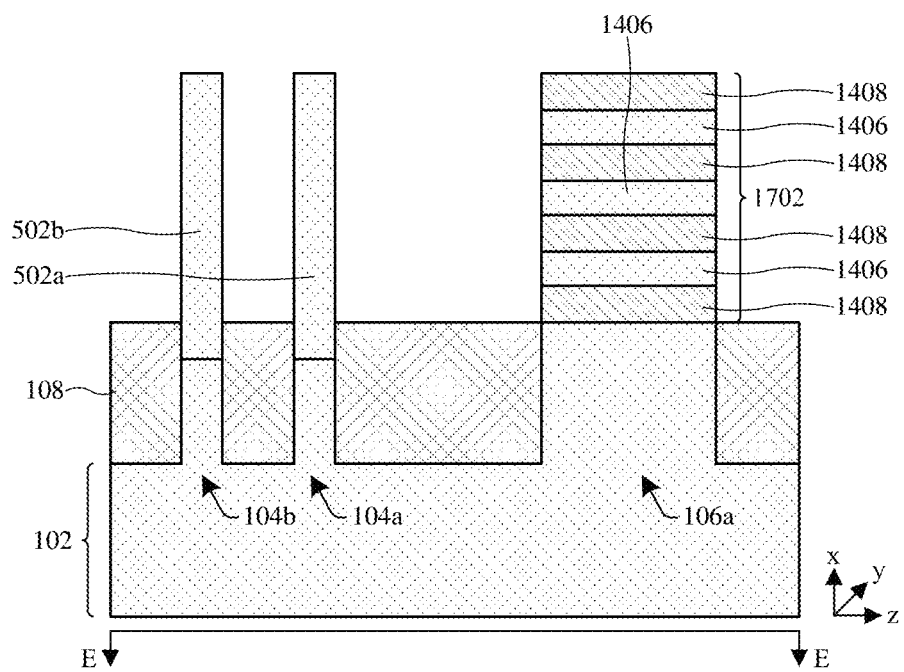

As shown in FIGS. 18A-18C, an isolation structure 108 is formed over the semiconductor substrate 102 and between the first fins 104 and the second fins 106. In some embodiments, a process for forming the isolation structure 108 comprise depositing or growing an isolation layer (not shown) on the semiconductor substrate 102, over the first fins 104, over the second fins 106, and over the third stack 1702 of semiconductor layers. In further embodiments, the isolation layer may be deposited or grown by, for example, chemical vapor deposition (CVD), physical vapor deposition (PVD), atomic layer deposition (ALD), thermal oxidation, some other deposition or growth process, or a combination of the foregoing. A planarization process (e.g., CMP) is then performed on the isolation layer to remove an upper portion of the isolation layer. The planarization process may also remove the third patterned masking layer. Thereafter, a fourth etching process (e.g., wet etch, dry etch, RIE, etc.) is performed on the isolation layer to recess the isolation layer below upper surfaces of the first fins 104 and an upper surface of the third stack 1702 of semiconductor layers, thereby forming the isolation structure 108.

As shown in FIGS. 19A-19C, a plurality of dummy gate structures 504 are formed over the isolation structure 108, the first fins 104, the second fins 106, and the third stack 1702 of semiconductor layers. The dummy gate structures 504 comprise dummy gate material structures 506 and dummy gate dielectric structures 1902. The dummy gate dielectric structures separate the dummy gate material structures 506 from the isolation structure 108, the first fins 104, and the third stack 1702 of semiconductor layers. For example, a sixth dummy gate structure 504h comprises a third dummy gate material structure 506h and a third dummy gate dielectric structure 1902h, and a seventh dummy gate structure 504i comprises a fourth dummy gate material structure 506i and a fourth dummy gate dielectric structure (not shown). The third dummy gate dielectric structure 1902h separates the third dummy gate material structure 506h from the isolation structure 108, the third fin 104a, the fourth fin 106a, the fifth fin 104b, and the third stack 1702 of semiconductor layers.

In some embodiments, a process for forming the dummy gate structures 504 comprises depositing a dummy gate dielectric layer (not shown) covering the isolation structure 108, the first fins 104, the second fins 106, the epitaxial semiconductor structures 502, and the third stack 1702 of semiconductor layers. The dummy gate dielectric layer may be deposited as a conformal layer. The dummy gate dielectric layer may be or comprise, for example, an oxide (e.g., $SiO_2$), a high-k dielectric (e.g., a dielectric material with a dielectric constant greater than 3.9), some other dielectric material, or a combination of the foregoing. The dummy gate dielectric layer may be deposited by, for example, CVD, PVD, ALD, some other deposition process, or a combination of the foregoing. A dummy gate material layer (not shown) is then deposited on the dummy gate dielectric layer and covering the dummy gate dielectric layer. The dummy gate material layer may be deposited by, for example, CVD, PVD, ALD, some other deposition process, or a combination of the foregoing.

Thereafter, a fifth patterned masking layer is formed over the dummy gate material layer. In some embodiments, the fifth patterned masking layer may comprise a stack of dielectric materials. For example, the fifth patterned masking layer may comprise a first dielectric layer (e.g., $SiO_2$), a second dielectric layer (e.g. SiN) disposed over the first dielectric layer, and a third dielectric layer (e.g., $SiO_2$) disposed over the second dielectric layer. A fifth etching process is the performed to remove unmasked portions of the dummy gate material layer and dummy gate dielectric layer, thereby forming the dummy gate structures 504. The fifth etching process may be a dry etching process, a wet etching process, a RIE process, some other etching process, or a combination of the foregoing. The dummy gate material structures 506 comprise portions of the dummy gate material layer remaining after the fifth etching process. The dummy gate dielectric structures 1902 comprise portions of the dummy gate dielectric layer remaining after the fifth etching process. For example, the third dummy gate material structure 506h comprises a first portion of the dummy gate material layer remaining after the fifth etching process, and the third dummy gate dielectric structure 1902h comprises a second portion of the dummy gate dielectric layer remaining after the fifth etching process.

Figure 20A:
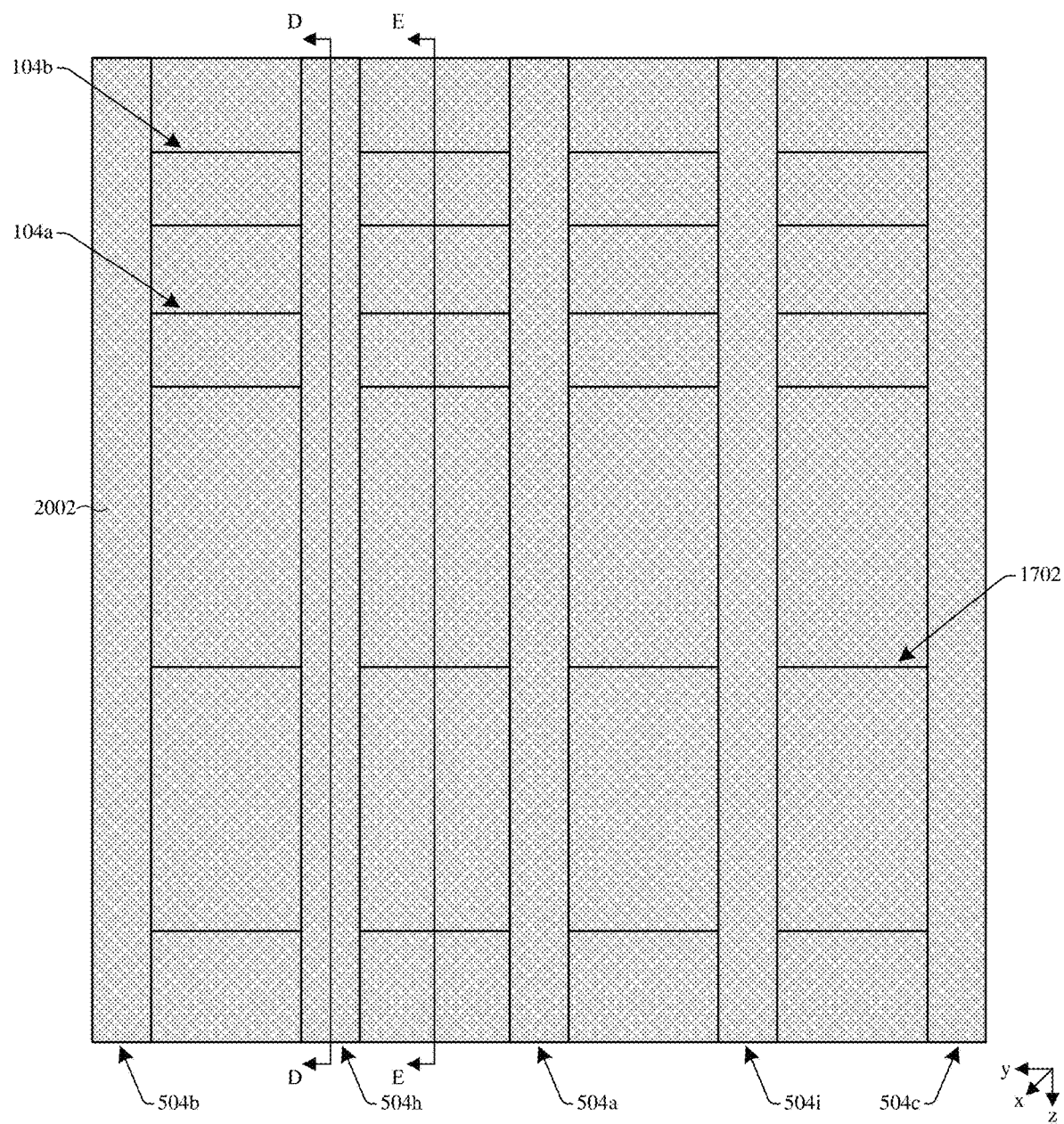
Figure 20B:
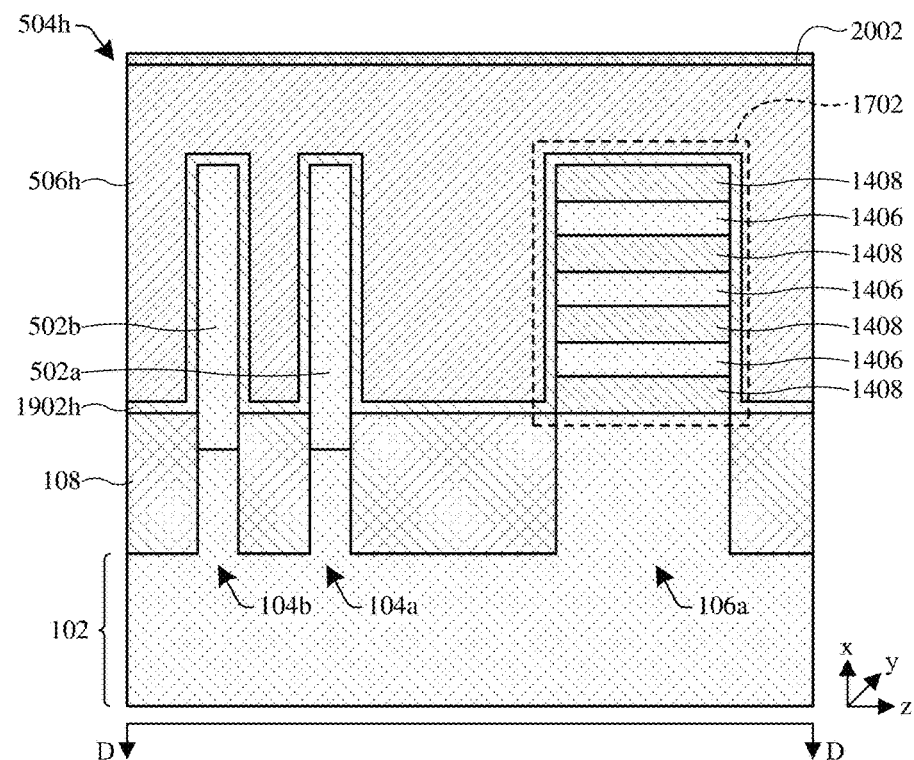
Figure 20C:
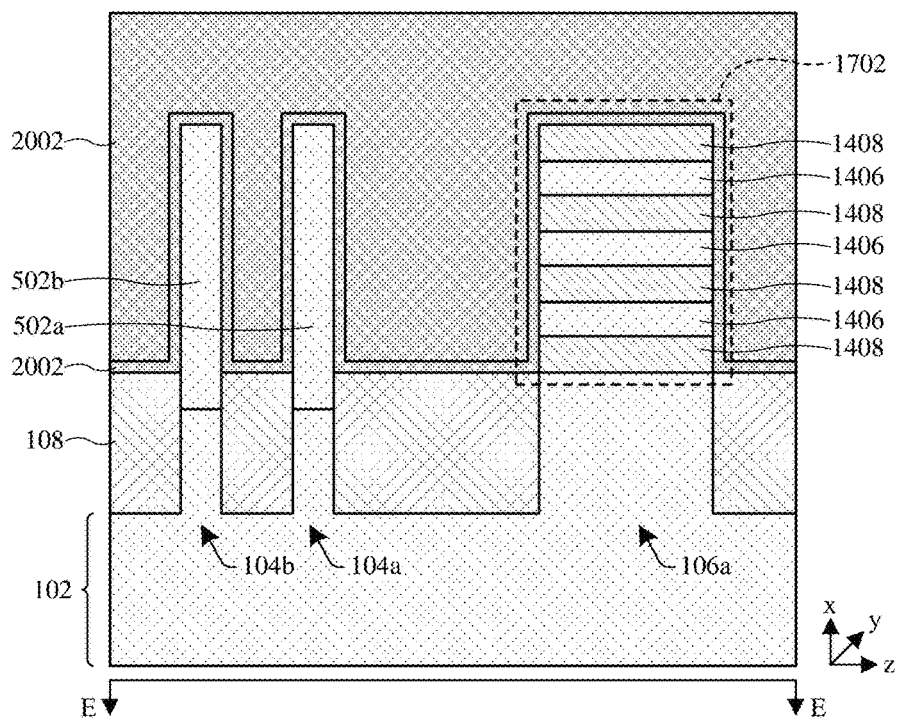

As shown in FIGS. 20A-20C, a first spacer layer 2002 is formed over the isolation structure 108, the first fins 104, the second fins 106, the third stack 1702 of semiconductor layers, and the dummy gate structures 504. In some embodiments, the first spacer layer 2002 is formed as a conformal layer. In further embodiments, the first spacer layer 2002 is formed over the fifth patterned masking layer. The first spacer layer 2002 may comprise, for example, an oxide (e.g., $SiO_2$), a nitride (e.g., SiN), an oxy-nitride (e.g., $SiO_XN_Y$), some other dielectric material, or a combination of the foregoing. In some embodiments, a process for forming the first spacer layer 2002 comprises depositing the first spacer layer 2002 on the isolation structure 108, the first fins 104, the third stack 1702 of semiconductor layers, and the dummy gate structures 504. The first spacer layer 2002 may be deposited by, for example, PVD, CVD, ALD, some other deposition process, or a combination of the foregoing.

Figure 21A:
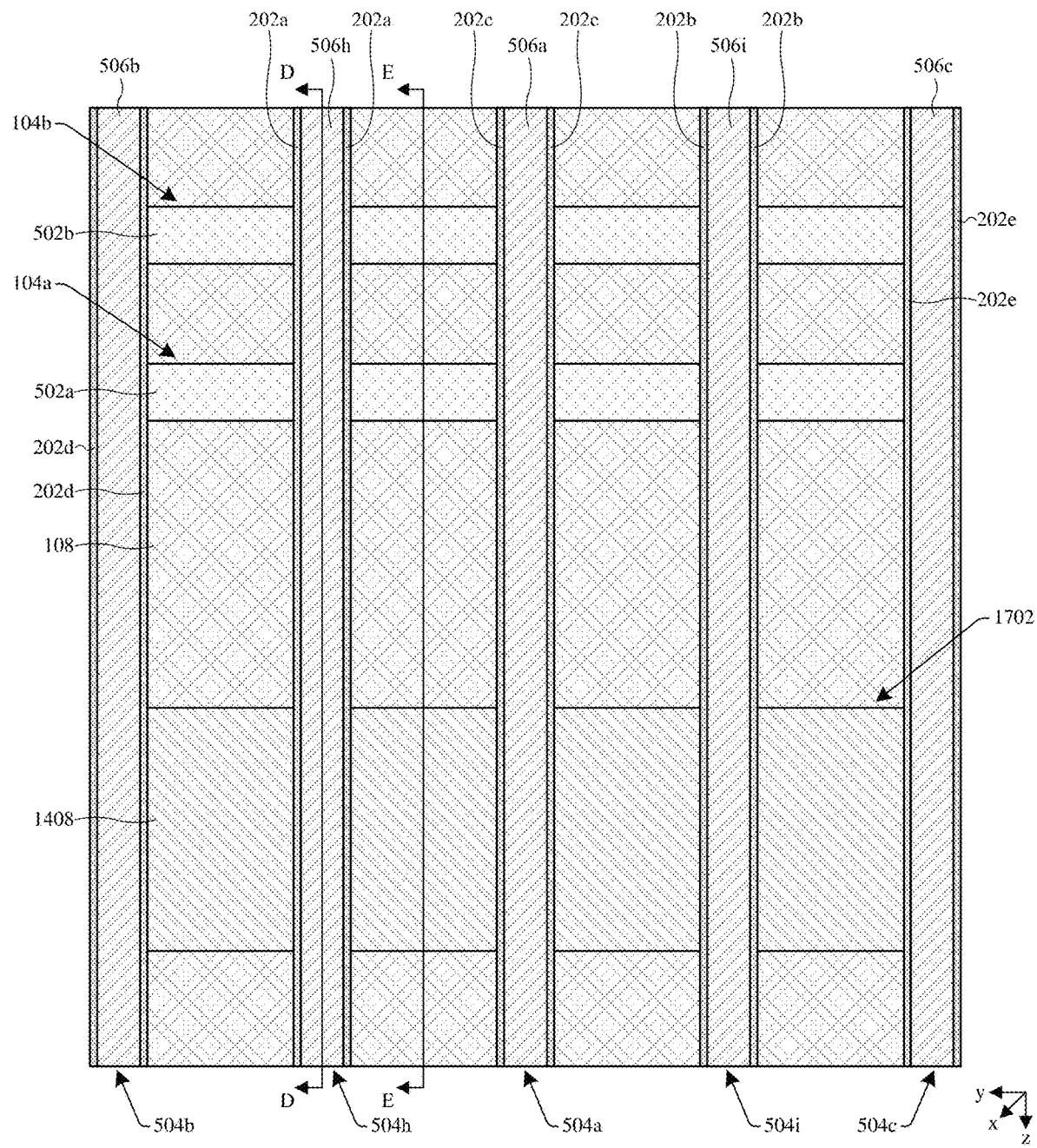
Figure 21B:
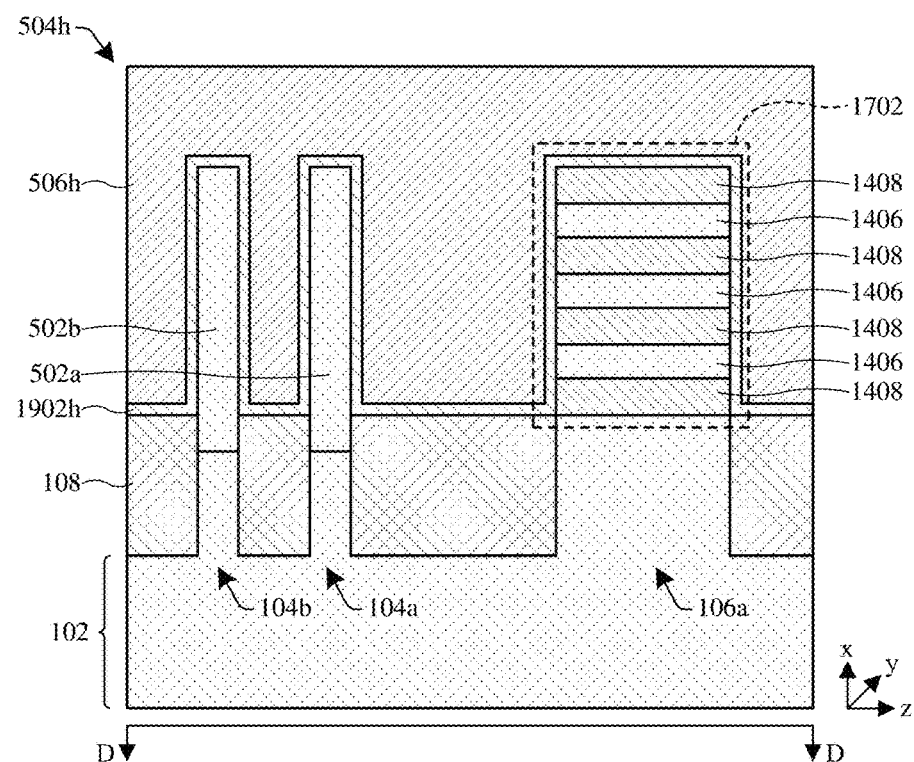
Figure 21C:
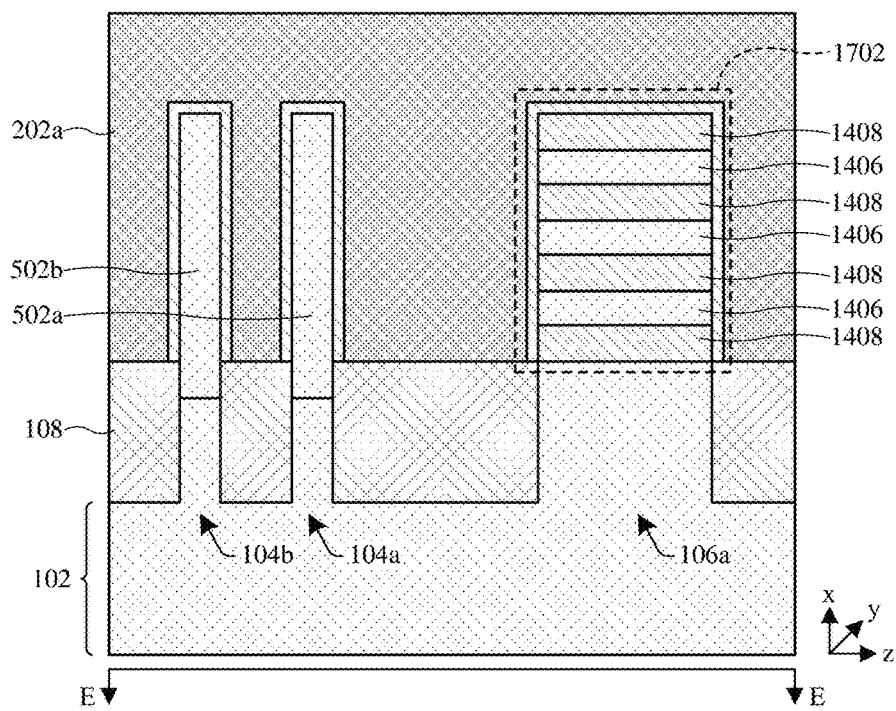

As shown in FIGS. 21A-21C, a plurality of first sidewall spacers 202 are formed over the isolation structure 108, the first fins 104, the second fins 106, and the third stack 1702 of semiconductor layers. The first sidewall spacers 202 are formed extending along sidewalls of the dummy gate structures 504 (in the "x" direction). For example, the first sidewall spacers 202 comprise a second sidewall spacer 202a. The second sidewall spacer 202a is disposed over the isolation structure 108, the third fin 104a, the fifth fin 104b, and the third stack 1702 of semiconductor layers. In some embodiments, the second sidewall spacer 202a contacts the isolation structure 108, the third fin 104a, the fifth fin 104b, and the third stack 1702 of semiconductor layers. In further embodiments, a process for forming the first sidewall spacers 202 comprises performing a sixth etching process (e.g., wet etch, dry etch, RIE, etc.) on the first spacer layer 2002 to remove the first spacer layer 2002 from horizontal surfaces, thereby leaving portions of the first spacer layer 2002 along sidewalls of the dummy gate structures 504 as the first sidewall spacers 202. In yet further embodiments, the sixth etching process may expose the fifth patterned masking layer.

Figure 22A:
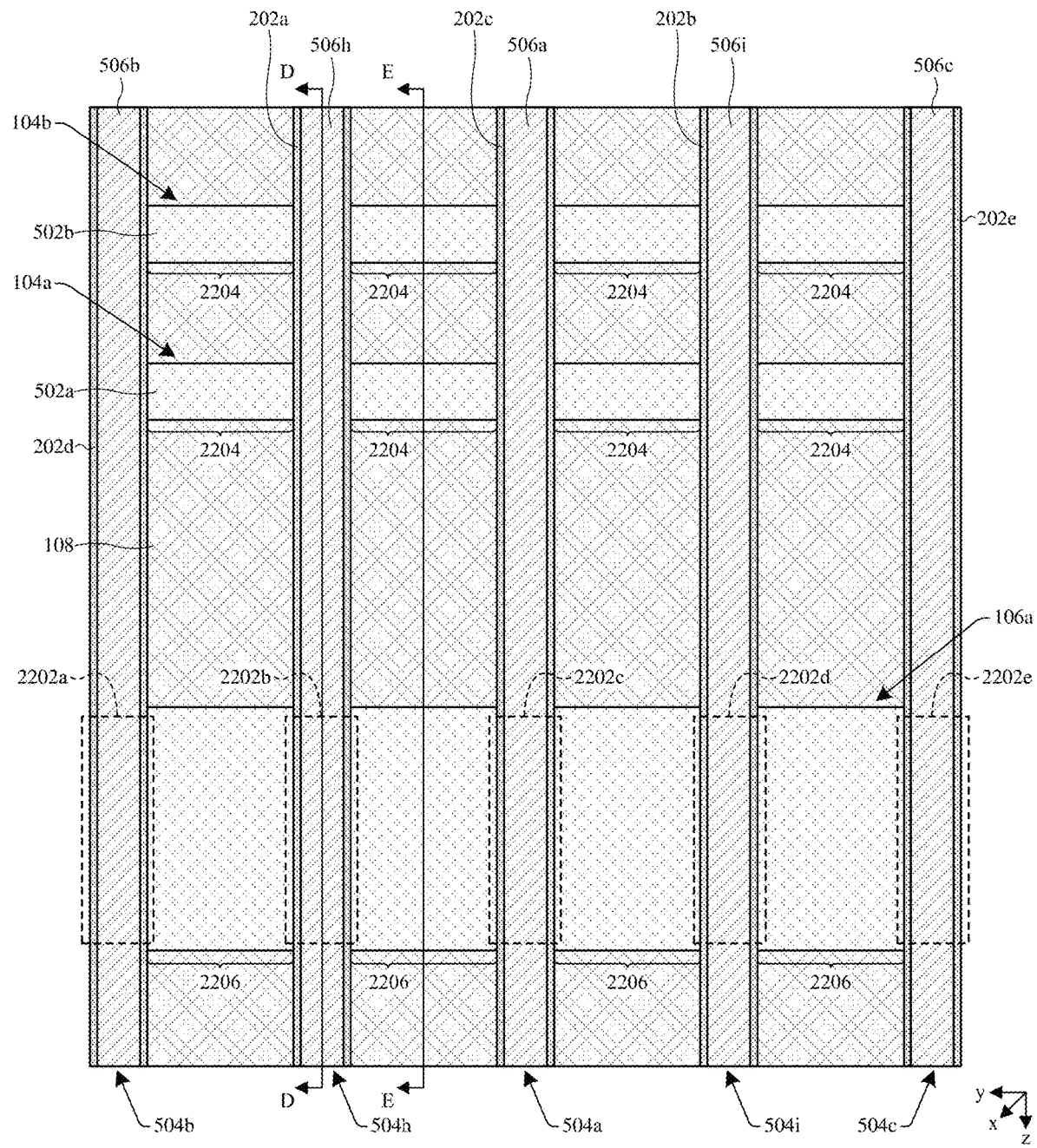
Figure 22B:
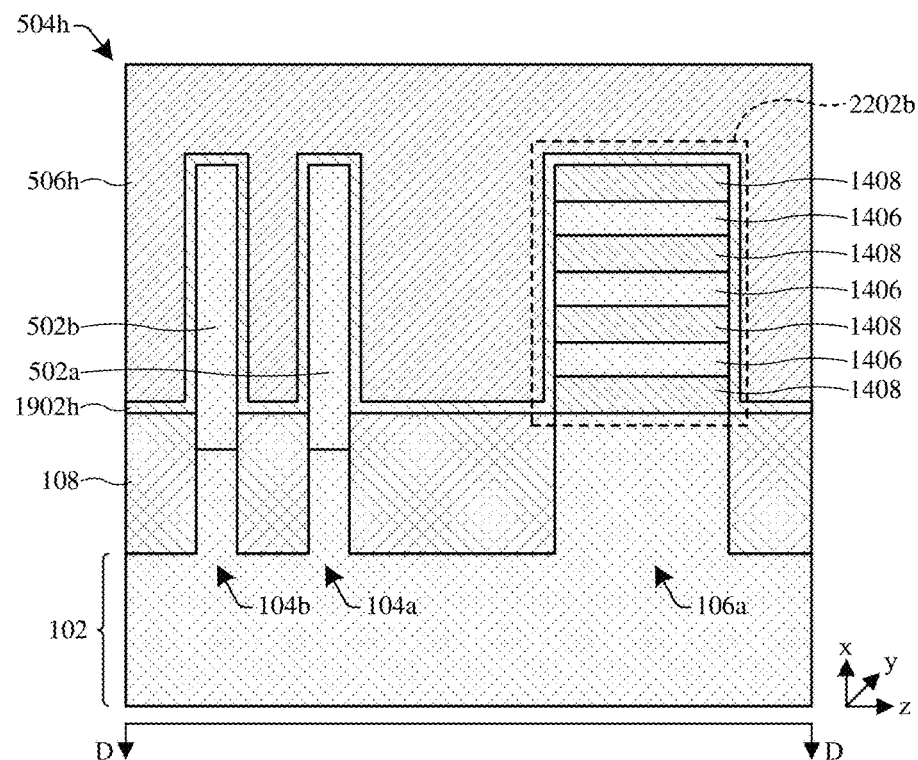
Figure 22C:
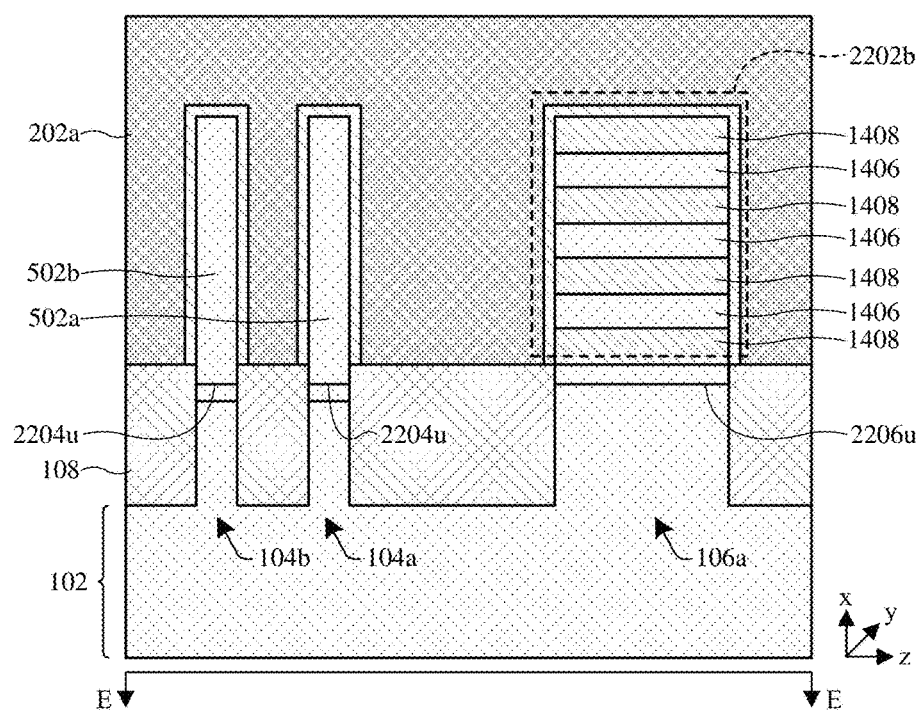

As shown in FIGS. 22A-22C, a third plurality of stacks 2202 of semiconductor layers are formed over the fourth fin 106a. The dummy gate structures 504 and the first sidewall spacers 202 cover the third plurality of stacks 2202 of semiconductor layers. For example, the third plurality of stacks 2202 of semiconductor layers comprises a fourth stack 2202b of semiconductor layers, a fifth stack 2202d of semiconductor layers, and a sixth stack 2202c of semiconductor layers. The sixth dummy gate structure 504h and the second sidewall spacer 202a cover the fourth stack 2202b of semiconductor layers.

Also shown in FIGS. 22A-22C, portions of the first fins 104 are recessed below the upper surface of the isolation structure 108, such that first sections 2204 of the first fins 104 have first upper surfaces 2204u disposed beneath the upper surface of the isolation structure 108. The first sections 2204 of the first fins 104 are disposed between the dummy gate structures 504. Further, portions of the second fins 106 are recessed below the upper surface of the isolation structure 108, such that second sections 2206 of the second fins 106 have second upper surfaces 2206u disposed beneath the upper surface of the isolation structure 108. The second sections 2206 of the second fins 106 are disposed between the dummy gate structures 504. In some embodiments, the portions of the first fins 104 that are recessed below the upper surface of the isolation structure 108 are portions of the epitaxial semiconductor structures 502. In such embodiments, the first upper surfaces 2204u of the first sections 2204 of the first fins 104 correspond to upper surfaces of the epitaxial semiconductor structures 502.

In some embodiments, a process for forming the third plurality of stacks 2202 of semiconductor layers comprises performing a seventh etching process on the third stack 1702 of semiconductor layers (see, e.g., FIGS. 21A-21C). The seventh etching process removes portions of the third plurality of stacks 2202 of semiconductor layers that are not masked by the dummy gate structures 504 (and/or fifth patterned masking layer) and the first sidewall spacers 202, thereby forming the third plurality of stacks 2202 of semiconductor layers. In further embodiments, a process for recessing the portions of the first fins 104 and the portions of the second fins 106 below the upper surface of the isolation structure 108 comprises removing portions of the first fins 104 and portions of the second fins 106 disposed between the dummy gate structures 504. In yet further embodiments, the seventh etching process removes the portions of the first fins 104 and the portions of the second fins 106 disposed between the dummy gate structures 504. The seventh etching process may remove the portions of the first fins 104 and the portions of the second fins 106 disposed between the dummy gate structures 504 due to such portions not being masked by the dummy gate structures 504 (and/or the fifth patterned masking layer) and the first sidewall spacers 202.

It will be appreciated that, in some embodiments, the stacks of semiconductor layers of the third plurality of stacks 2202 of semiconductor layers are stacks of semiconductor layers of a fourth plurality of stacks of semiconductor layers that are formed over the second fins 106. For example, the fourth plurality of stacks of semiconductor layers also comprises a fifth plurality of stacks of semiconductor layers that are formed over one of the second fins 106 that is different than the fourth fin 106a. The stacks of semiconductor layers of the fourth plurality of stacks of semiconductor layers may comprise similar features (e.g., structural features) as the stacks of semiconductor layers of the third plurality of stacks 2202 of semiconductor layers.

Figure 23A:
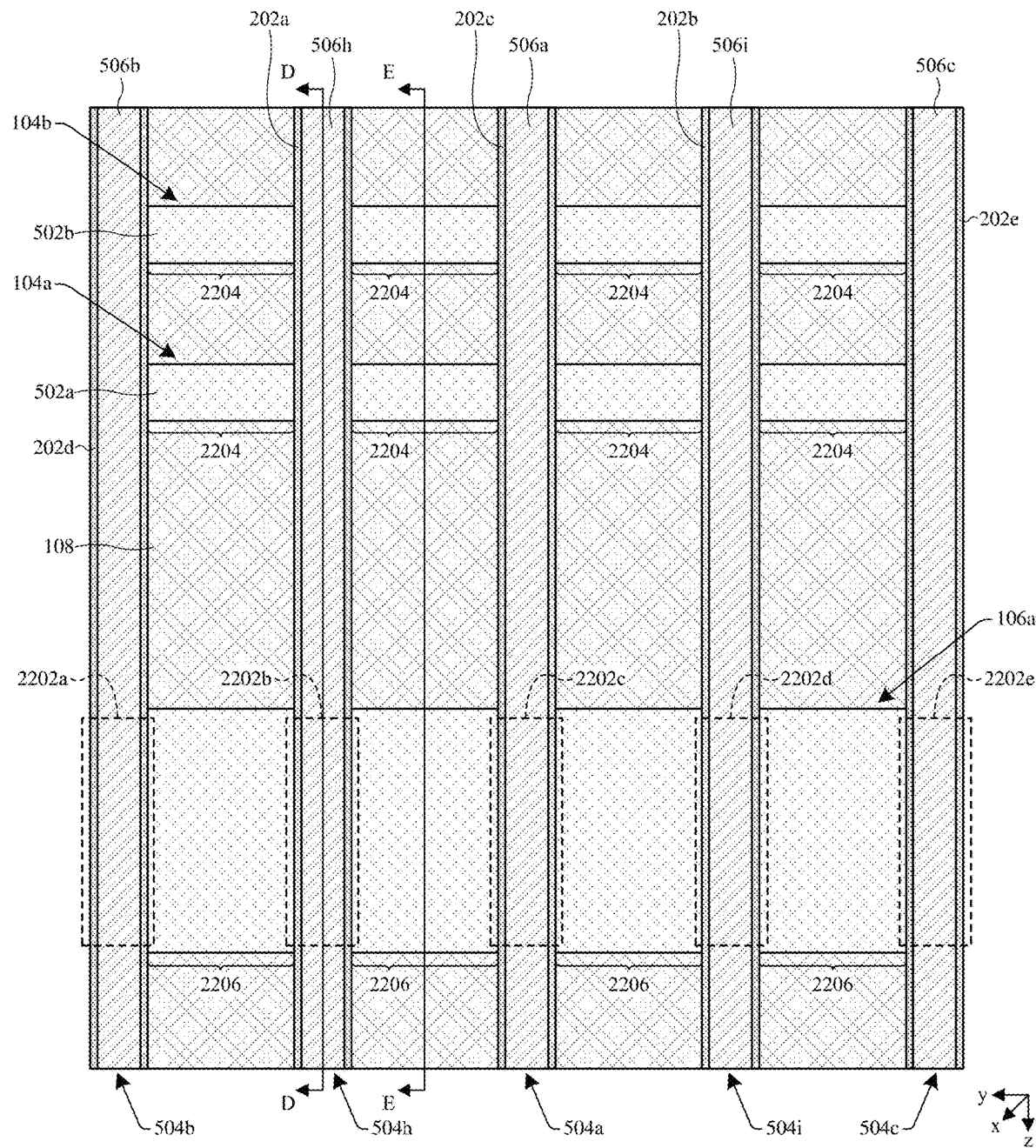
Figure 23B:
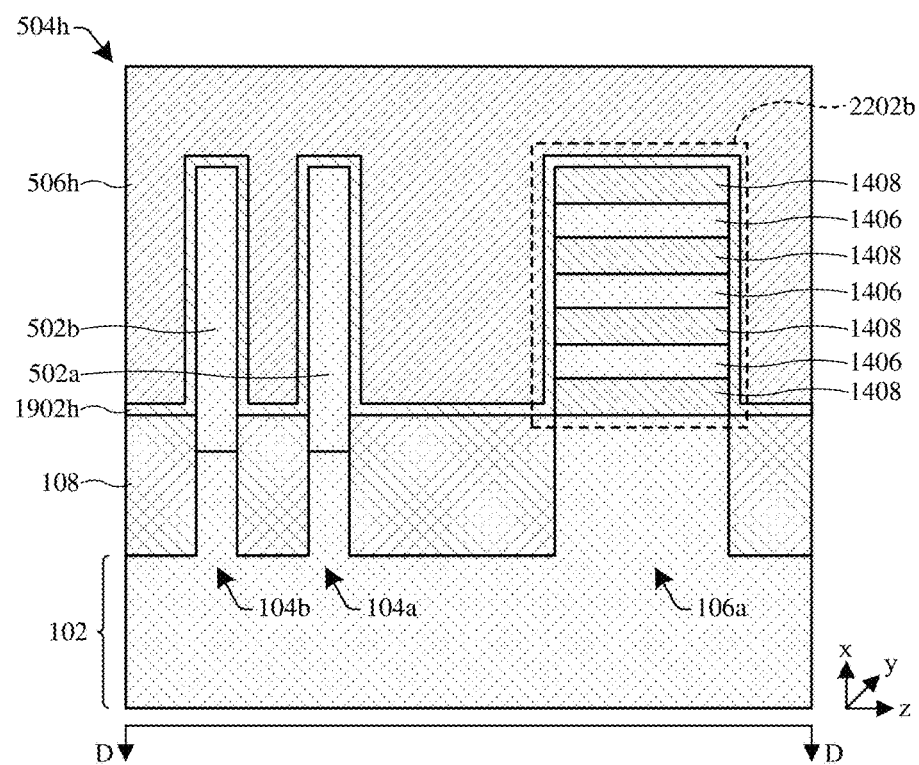
Figure 23C:
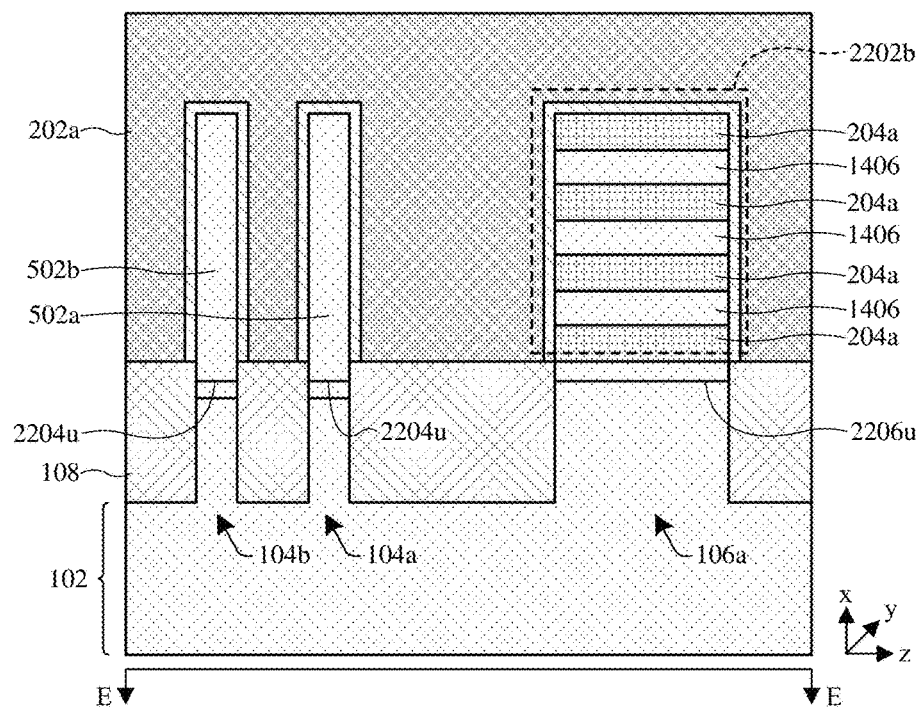

As shown in FIGS. 23A-23C, a plurality of third sidewall spacers 204 are formed along opposite sidewalls of the second semiconductor layers 1408 (see, e.g., FIGS. 22A-22C) of the third plurality of stacks 2202 of semiconductor layers. The sidewall spacers of the third sidewall spacers 204 are separated from one another (in the "x" direction) by the first semiconductor layers 1406 of the third plurality of stacks 2202 of semiconductor layer. For example, the third sidewall spacers 204 comprises a first group of the third sidewall spacers 204. The first group of the third sidewall spacers 204 comprises a plurality of fourth sidewall spacers 204a. The fourth sidewall spacers 204a are formed along opposite sidewalls of the second semiconductor layers 1408 of the fourth stack 2202b of semiconductor layers. The fourth sidewall spacers 204a are spaced from one another (in the "x" direction) by the first semiconductor layers 1406 of the fourth stack 2202b of semiconductor layers.

In some embodiments, a process for forming the third sidewall spacers 204 comprises performing an eighth etching process (e.g., wet etch) on the third plurality of stacks 2202 to selectively remove outer portions of the second semiconductor layers 1408 of the third plurality of stacks 2202 of semiconductor layers. The eighth etching process is more selective to the second semiconductor layers 1408 than the first semiconductor layers 1406 of the third plurality of stacks 2202 of semiconductor layers. By removing the outer portions of the second semiconductor layers 1408 of the third plurality of stacks 2202 of semiconductor layers, the second semiconductor layers 1408 of the third plurality of stacks 2202 of semiconductor layers are laterally recessed (in the "y" direction) in relation to the first semiconductor layers 1406 of the third plurality of stacks 2202 of semiconductor layers. In other words, after the outer portions of the second semiconductor layers 1408 of the third plurality of stacks 2202 of semiconductor layers are removed, opposite outer sidewalls of the second semiconductor layers 1408 are disposed between opposite outer sidewalls of the first semiconductor layers 1406 of the third plurality of stacks 2202 of semiconductor layers.

Thereafter, a second spacer layer (not shown) is deposited over the isolation structure 108, the first fins 104, the second fins 106, the third plurality of stacks 2202 of semiconductor layer, the dummy gate structures 504 (and/or fifth patterned masking layer), and the first sidewall spacers 202. In some embodiments, second spacer layer may be deposited as a conformal layer. In further embodiments, the second spacer layer may be or comprise, for example, an oxide (e.g., $SiO_2$), a nitride (e.g., SiN), an oxy-nitride (e.g., $SiO_XN_Y$), some other dielectric material, or a combination of the foregoing. The spacer layer may be deposited by, for example, CVD, PVD, ALD, some other deposition process, or a combination of the foregoing.

A ninth etching process is then performed on the second spacer layer to partially remove the second spacer layer, thereby leaving portions of the second spacer layer along the opposite sidewalls of the second semiconductor layers 1408 of the third plurality of stacks 2202 of semiconductor layers as the third sidewall spacers 204. More specifically, in some embodiments, the ninth etching process is an anisotropic etch that removes the material of the second spacer layer (in the "x" direction). Because the second semiconductor layers 1408 is laterally recessed in relation to the first semiconductor layers 1406, the anisotropic etch removes the second spacer layer from horizontal surfaces, sidewalls of the first sidewall spacers 202, and sidewalls of the first semiconductor layers 1406, thereby forming the third sidewall spacers 204 along the opposite sidewalls of the second semiconductor layers 1408. In further embodiments, the ninth etching process may be, for example, a plasma etching process, a dry etching process, RIE, some other etching process, or a combination of the foregoing.

Figure 24A:
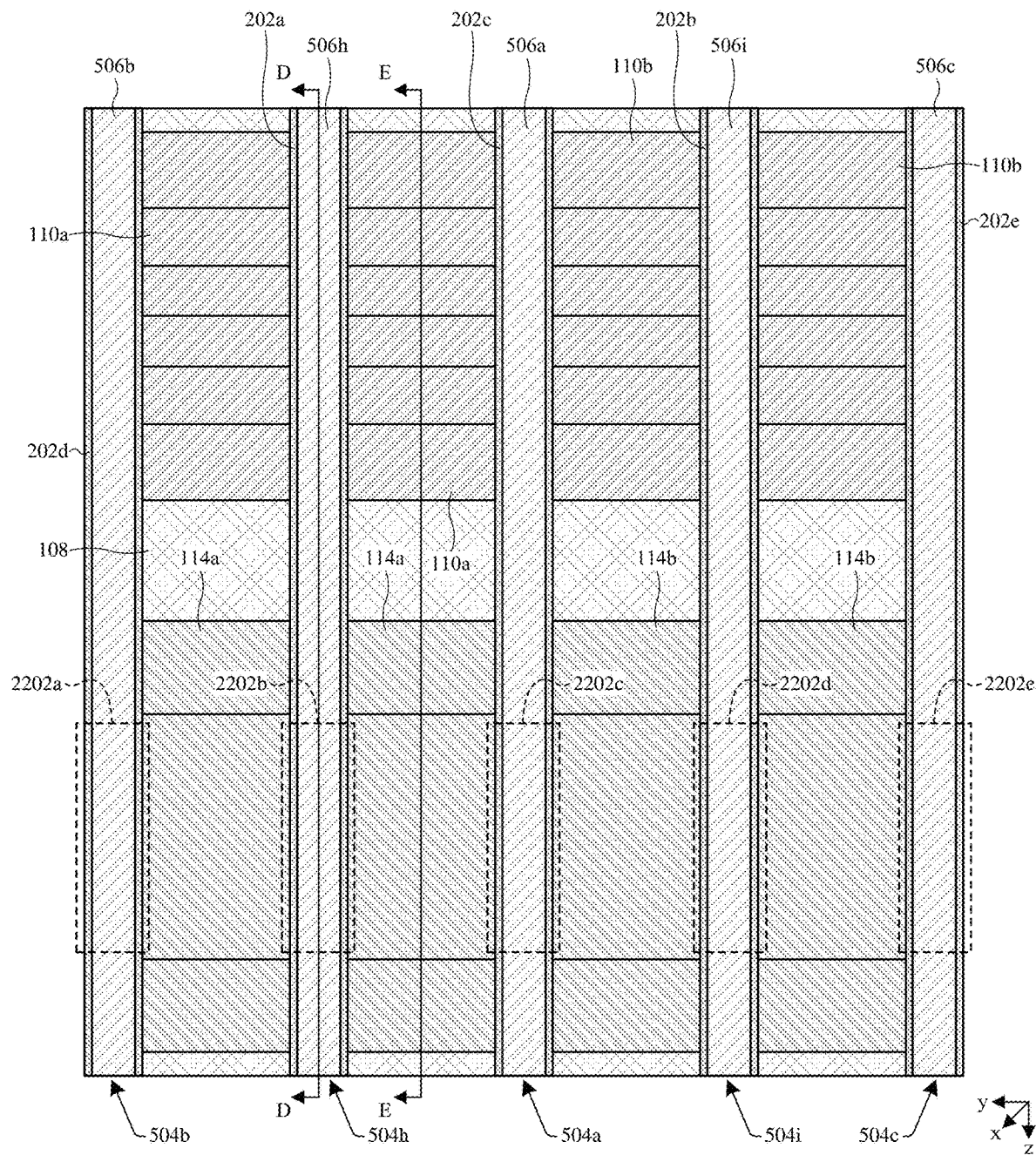
Figure 24B:
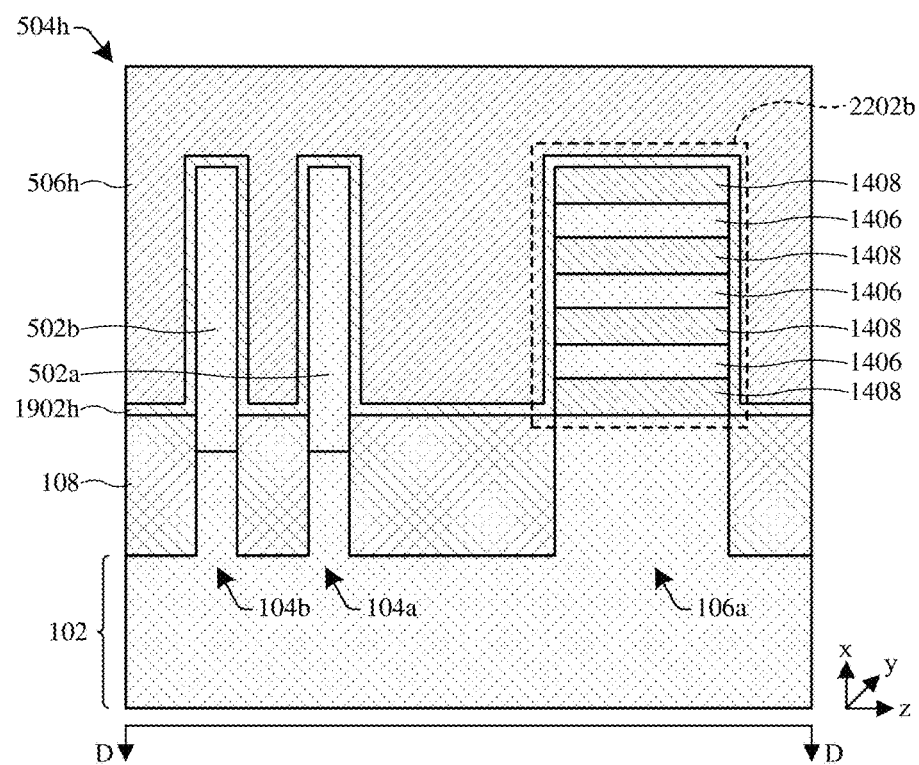
Figure 24C:
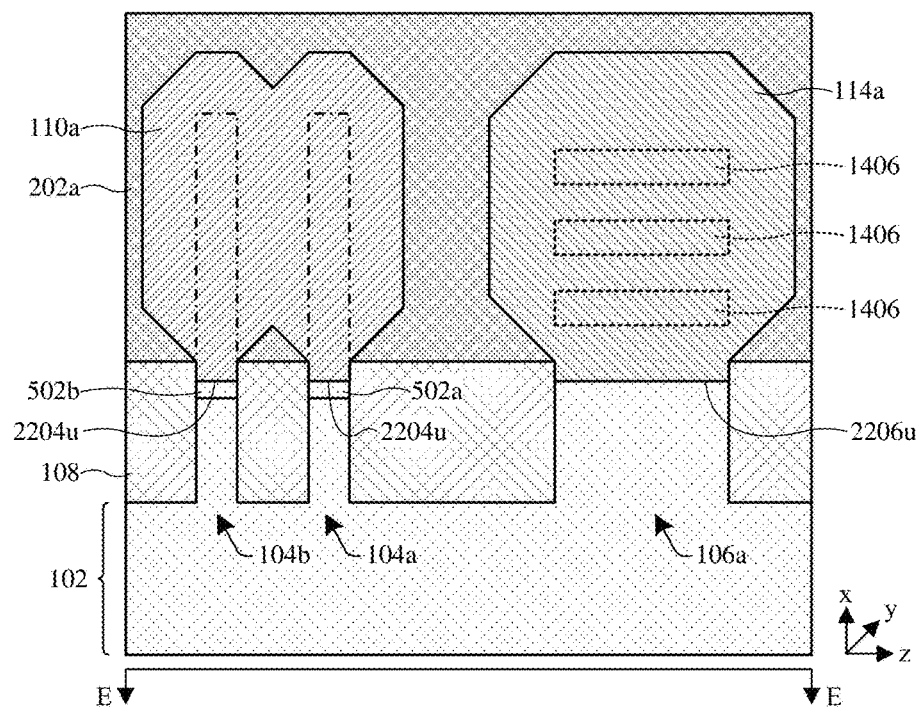

As shown in FIGS. 24A-24C, pairs of first source/drain regions 110 and pairs of second source/drain regions 114 are formed over the semiconductor substrate 102. The pairs of first source/drain regions are formed over the first fins 104, and the pairs of second source/drain regions are formed over the second fins 106. For example, a first pair 110a of the first source/drain regions 110 is formed over the third fin 104a and the fifth fin 104b, and a second pair 114a of the second source/drain regions 114 is formed over the fourth fin 106a. The first source/drain regions 110 and the second source/drain regions 114 are formed between the dummy gate structures 504 and between the third plurality of stacks 2202 of semiconductor layers.

In some embodiments, a process for forming the first source/drain regions 110 and the second source/drain regions 114 comprises epitaxially forming the first source/drain regions 110 and the second source/drain regions 114. For example, a fourth epitaxial process is performed to grow the first source/drain regions 110 from the first sections 2204 (see, e.g., FIGS. 23A-23C) of the first fins 104, and a fifth epitaxial process is performed to grow the second source/drain regions 114 from the second sections 2206 (see, e.g., FIGS. 23A-23C) of the second fins 106. In some embodiments, the fourth epitaxial process may be, for example, VPE, LPE, MBE, some other epitaxial process, or a combination of the foregoing. The fourth epitaxial process may in-situ dope the first source/drain regions 110 with first doping type dopants (e.g., p-type dopants, such as boron atoms). In further embodiments, the fifth epitaxial process may be, for example, VPE, LPE, MBE, some other epitaxial process, or a combination of the foregoing. The fifth epitaxial process may in-situ dope the second source/drain regions 114 with second doping type dopants (e.g., n-type dopants, such as phosphorus atoms).

Figure 25A:
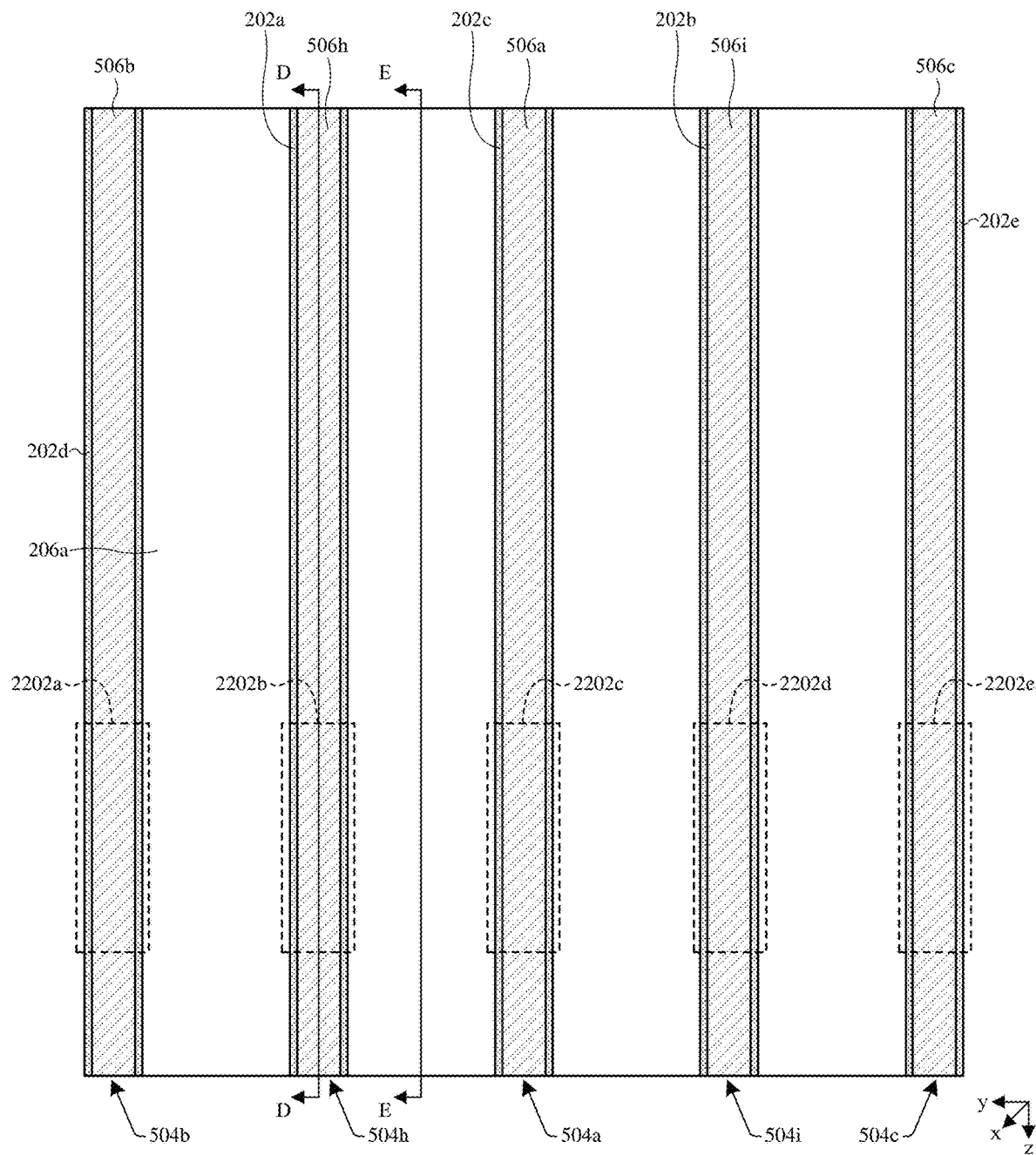
Figure 25B:
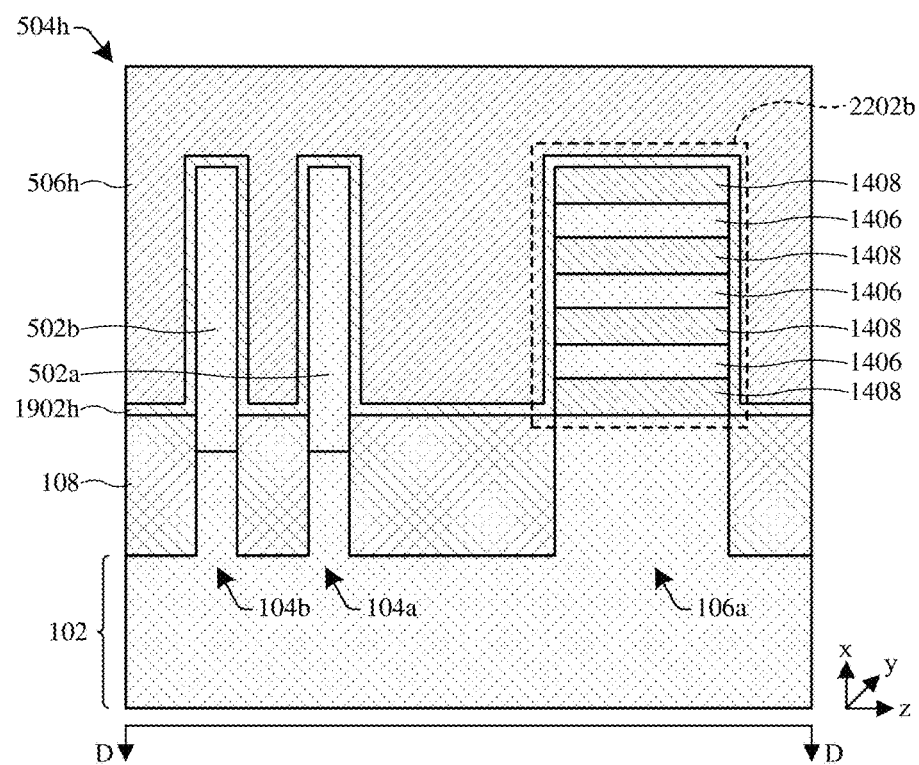
Figure 25C:
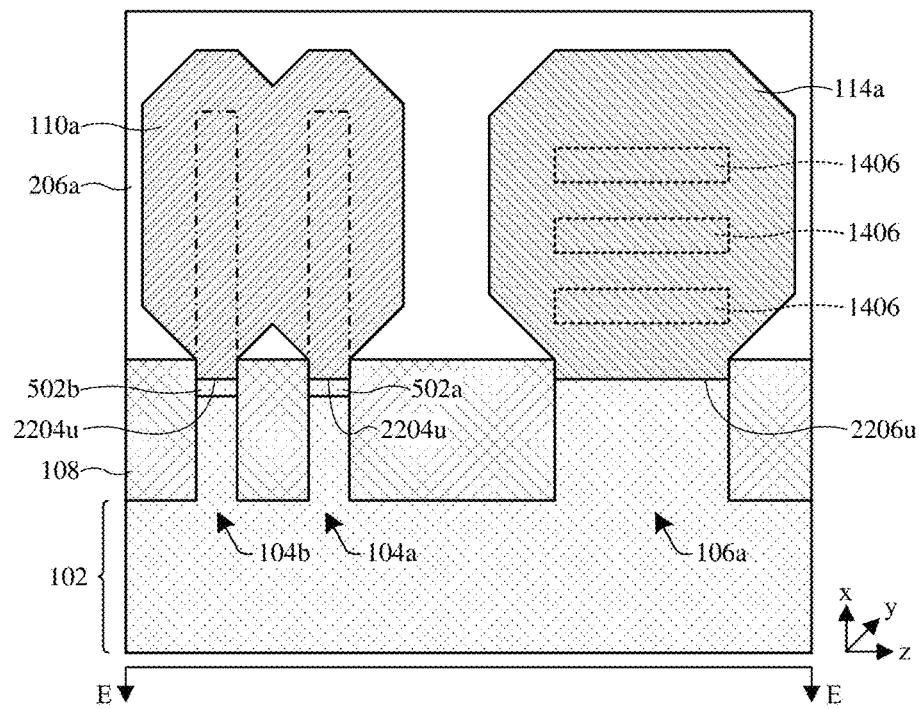

As shown in FIGS. 25A-25C, a first ILD layer 206a is formed over the isolation structure 108, the first source/drain regions 110, the second source/drain regions 114, the third sidewall spacers 204, and the third plurality of stacks 2202 of semiconductor layers. In some embodiments, a process for forming the first ILD layer 206a comprises depositing the first ILD layer 206a on and covering the isolation structure 108, the first source/drain regions 110, the second source/drain regions 114, the first sidewall spacers 202, and the dummy gate structures 504 (or fifth patterned masking layer). Thereafter, a planarization process (e.g., CMP) is performed on the first ILD layer 206a to remove an upper portion of the first ILD layer 206a, thereby exposing the dummy gate structures 504 and the first sidewall spacers 202. In some embodiments, the planarization process may co-planarize upper surfaces of the first ILD layer 206a, the dummy gate structures 504, and the first sidewall spacers 202. In further embodiments, the planarization process may remove the fifth patterned masking layer.

Figure 26A:
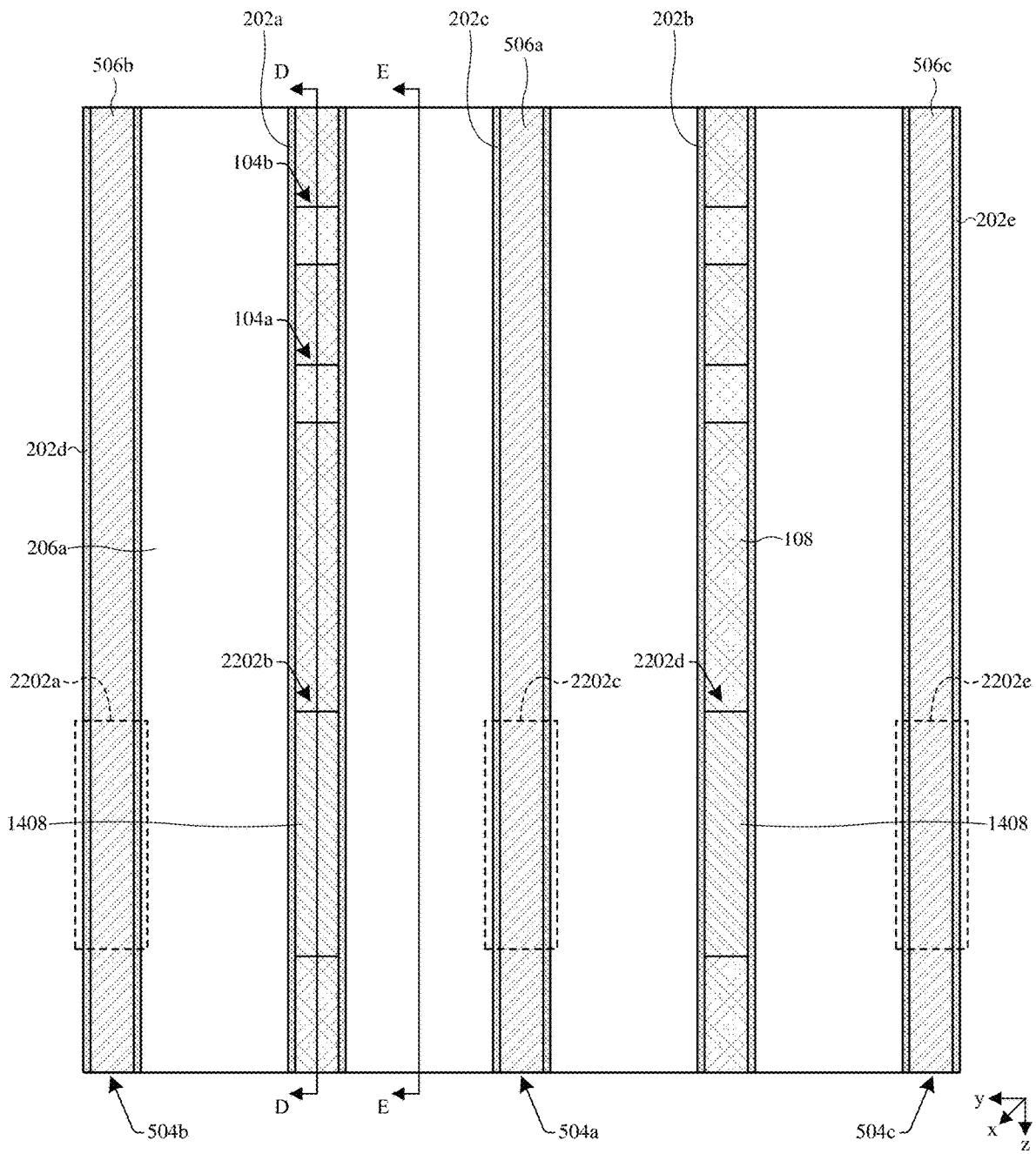
Figure 26B:
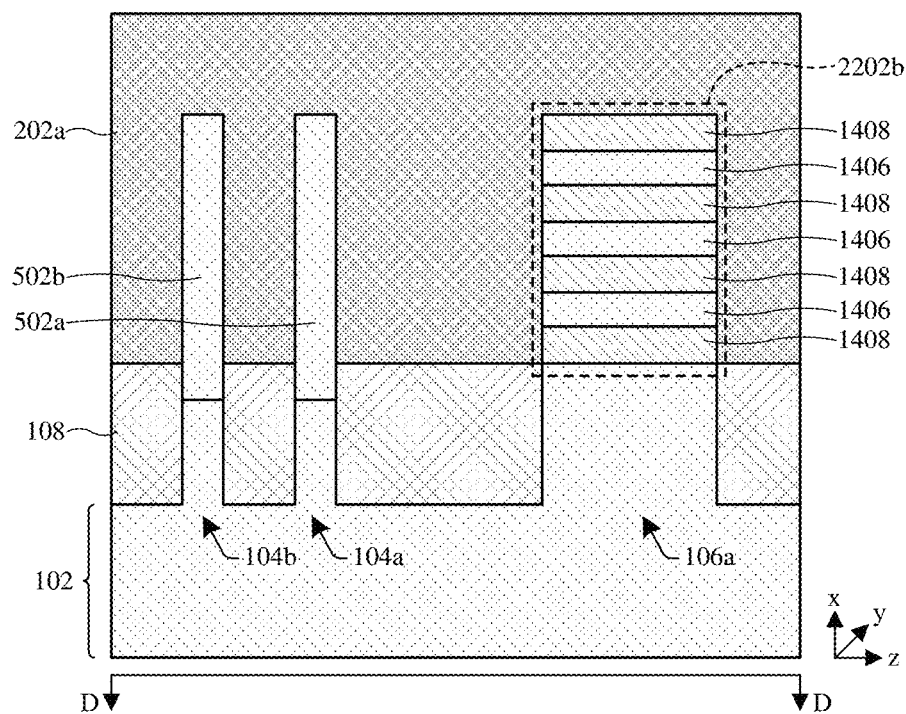
Figure 26C:
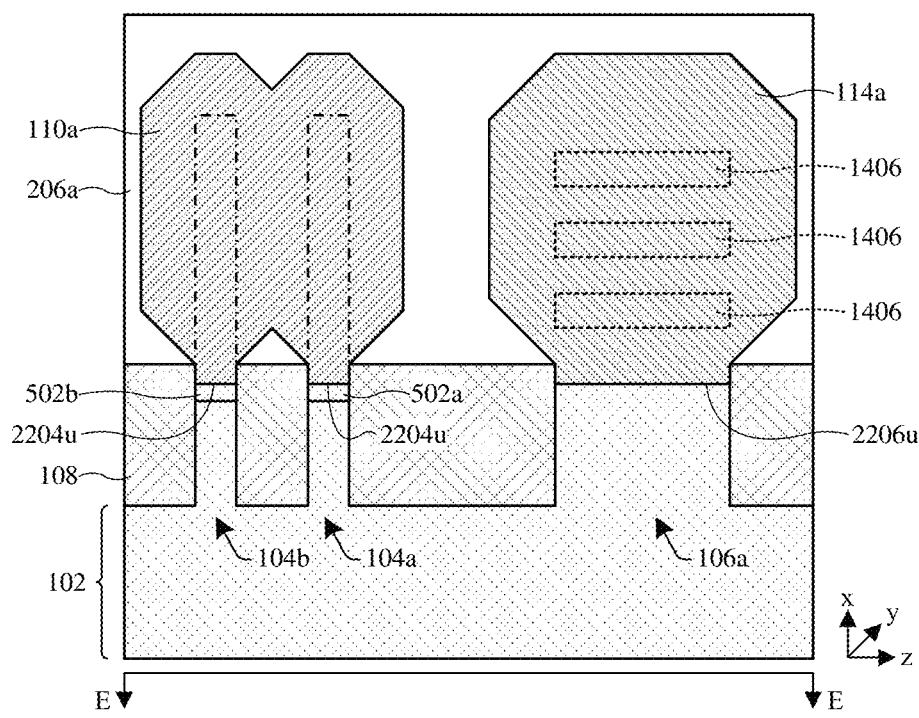

As shown in FIGS. 26A-26C, one or more of the dummy gate structures 504 are removed. The removal of the one or more of the dummy gate structures 504 exposes one or more of the third plurality of stacks 2202 of semiconductor layers, portions of the first fins 104 disposed between the first source/drain regions 110, and portions of the second fins 106 disposed between the second source/drain regions 114. For example, the sixth dummy gate structure 504h is removed, thereby exposing the fourth stack 2202b of semiconductor layers, a first portion of the third fin 104a disposed between the first source/drain regions 110 of the first pair 110a, and a second portion of the fifth fin 104b disposed between the second source/drain regions 114 of the second pair 114a.

In some embodiments, a process for removing the one or more of the dummy gate structures 504 comprises forming a sixth patterned masking layer (not shown) over the first ILD layer 206a, the dummy gate structures 504, and the first sidewall spacers 202. The sixth patterned masking layer exposes the one or more of the dummy gate structures 504. An eleventh etching process (e.g., wet etch, dry etch, etc.) is the performed to remove unmasked dummy gate material structures 506, thereby removing the dummy gate material structures 506 of the one or more dummy gate structures 504. Thereafter, a twelfth etching process (e.g., wet etch, dry etch, etc.) is performed to selectively remove the dummy gate dielectric structures 1902 that were exposed by the eleventh etching process.

Figure 27A:
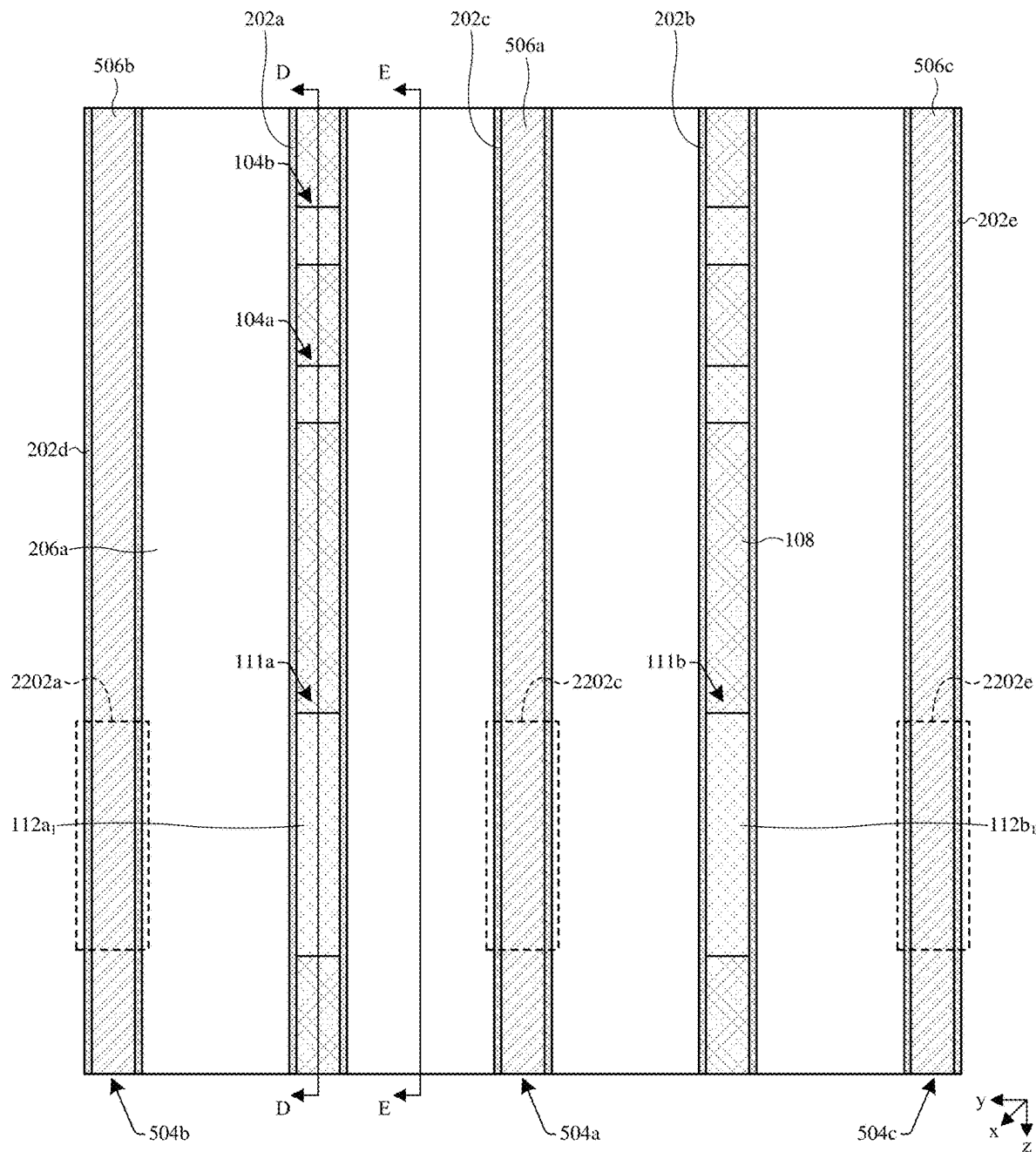
Figure 27B:
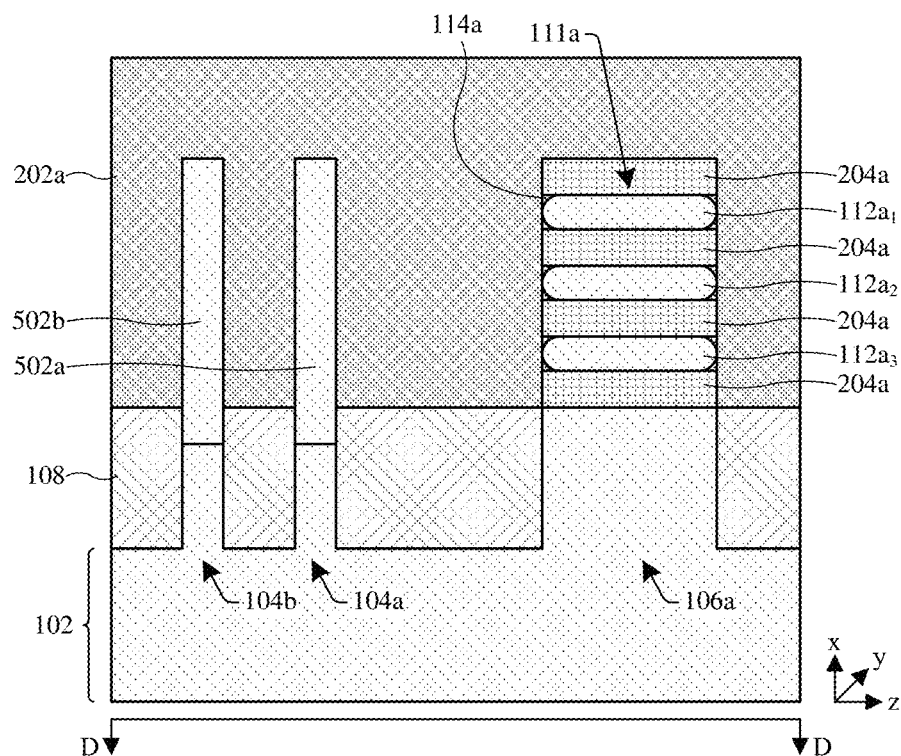
Figure 27C:
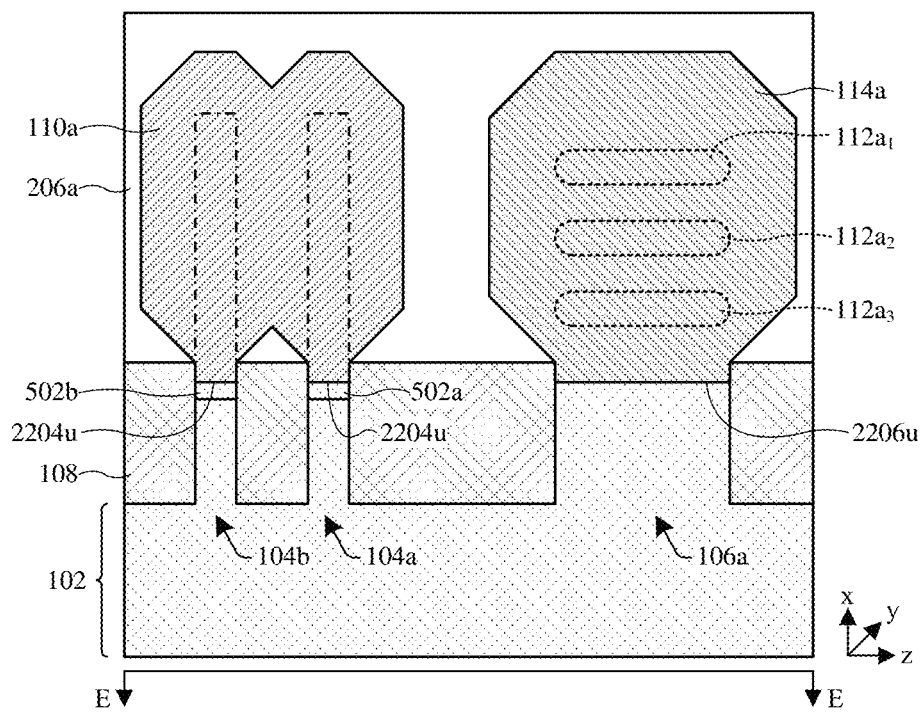

As shown in FIGS. 27A-27C, a plurality of nanostructure stacks 111 are formed over the second fins 106. The nanostructure stacks 111 comprise a plurality of nanostructures 112. For example, a first nanostructure stack 111a is disposed over the fourth fin 106a. The first nanostructure stack 111a comprises a first plurality of nanostructures 112a that are vertically stacked over one another (in the "y" direction). The first plurality of nanostructures 112a extend laterally (in the "y" direction) between the second source/drain regions 114 of the second pair 114a.

In some embodiments, a process for forming the nanostructure stacks 111 comprises removing the second semiconductor layers 1408 of the third plurality of stacks 2202 of semiconductor layers that were exposed by the removal of the one or more dummy gate structures 504, thereby forming the plurality of nanostructures 112. The second semiconductor layers 1408 of the third plurality of stacks 2202 of semiconductor layers may be removed by performing a thirteenth etching process (e.g., wet etch) that selectively etches the second semiconductor layers 1408 against the first semiconductor layers 1406 of the third plurality of stacks 2202 of semiconductor layers. In some embodiments, the thirteenth etching process may be selectively removed by using a wet etchant, such as, ammonium hydroxide (NH$_4$OH), tetramethylammonium hydroxide (TMAH) solution, ethylenediamine pyrocatechol (EDP), potassium hydroxide (KOH) solution, or the like.

Figure 28A:
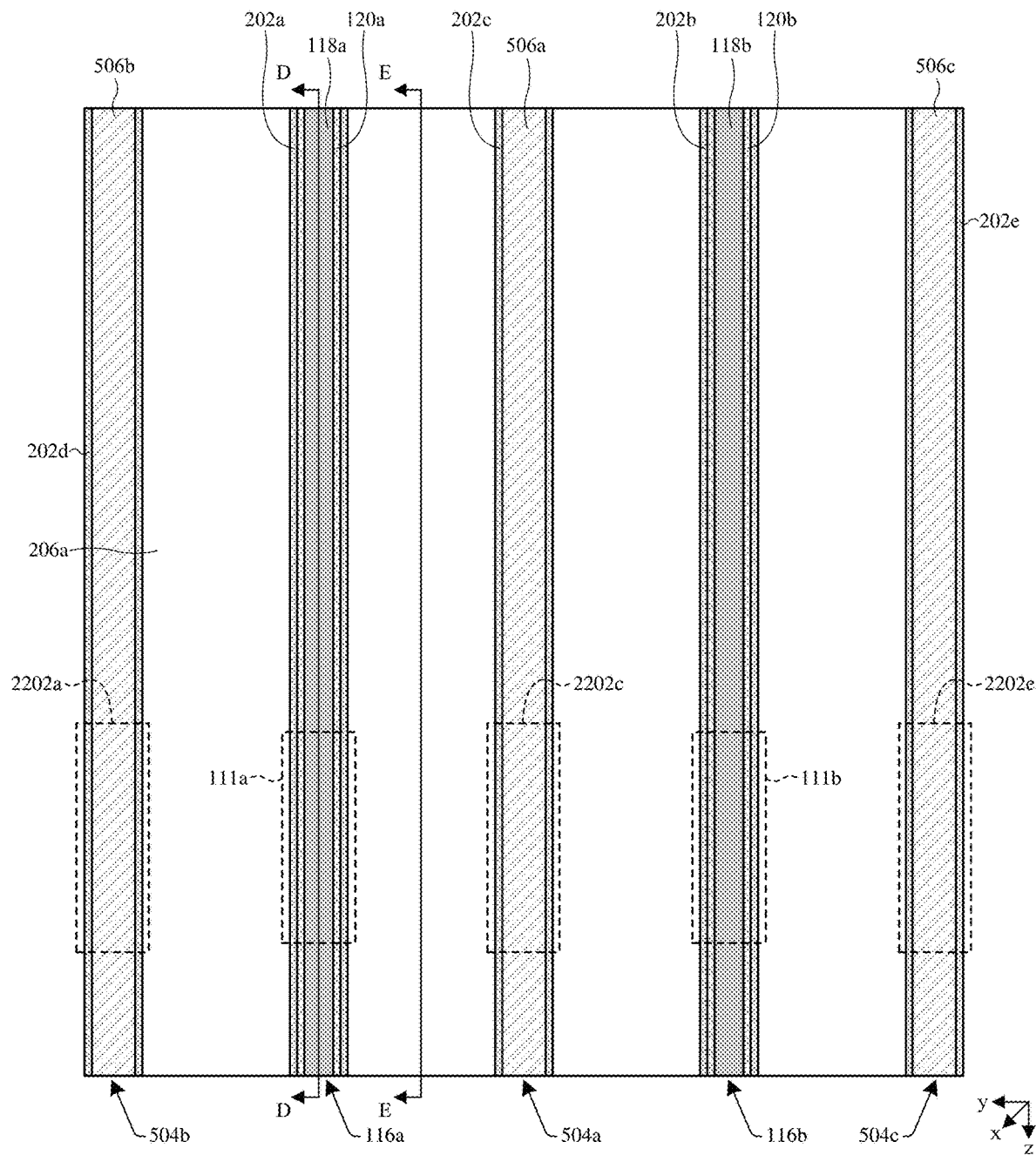
Figure 28B:
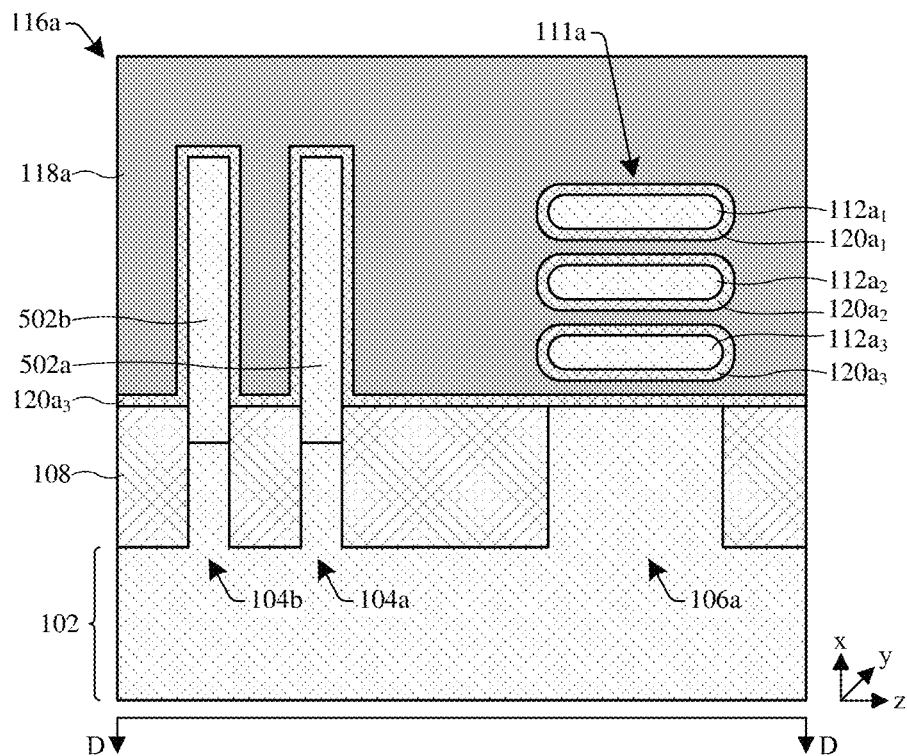
Figure 28C:
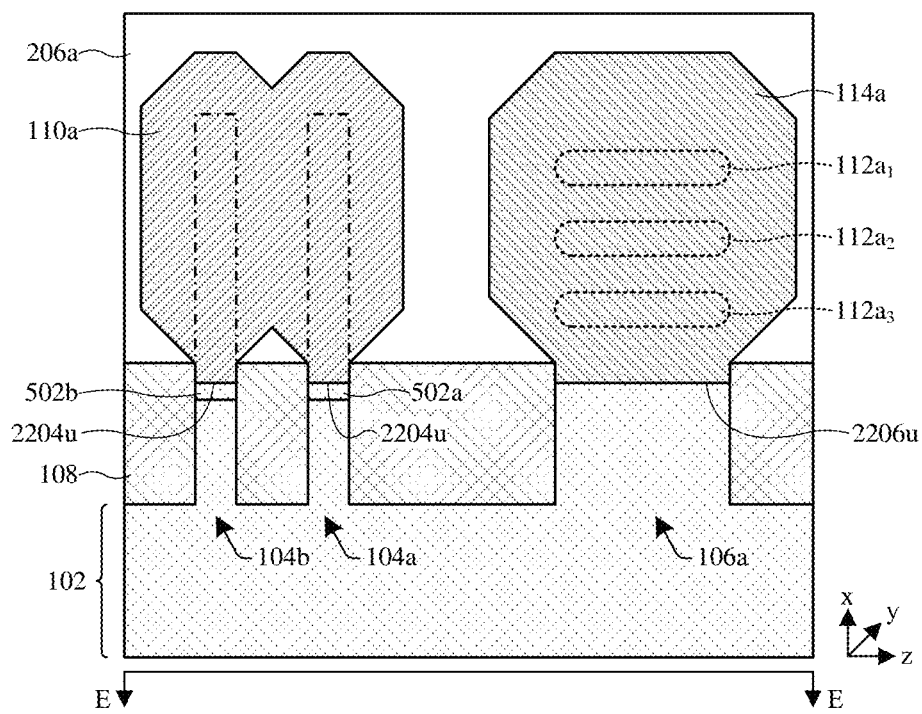

As shown in FIGS. 28A-28C, a plurality of gate structures 116 are formed over the isolation structure 108, the first fins 104, the second fins 106, and the nanostructure stacks 111. In some embodiments, the gate structures 116 are formed extending continuously (in the "z" direction) across the isolation structure 108, over the first fins 104, over the second fins 106, and around the plurality of nanostructures 112. The gate structures 116 comprise a plurality of gate electrode structures 118 and a plurality of gate dielectric structures 120. The gate dielectric structures 120 separate the gate electrode structures 118 from the first fins 104, the second fins 106, and the nanostructures of the plurality of nanostructures 112.

In some embodiments, a process for forming the gate structures 116 comprises depositing a gate dielectric layer (not shown) around each of the nanostructures of the plurality of nanostructures 112 and on exposed portions of isolation structure 108, the first fins 104, and the second fins 106. In further embodiments, the gate dielectric layer is also deposited on exposed inner sidewalls of the first sidewall spacers 202 and over the first sidewall spacers 202, the dummy gate structures 504, and the first ILD layer 206a. The gate dielectric layer may be deposited as a conformal layer. The gate dielectric layer may be or comprise, for example, an oxide (e.g., SiO$_2$), a high-k dielectric (e.g., a dielectric material with a dielectric constant greater than 3.9), some other dielectric material, or a combination of the foregoing. The gate dielectric layer may be multi-layered, for example, comprising one or more interfacial layers. The gate dielectric layer may be deposited by, for example, CVD, ALD, some other deposition process, or a combination of the foregoing.

Thereafter, a gate electrode layer (not shown) is deposited on the gate dielectric layer and around each of the nanostructures of the plurality of nanostructures 112. The gate electrode layer may be formed with an upper surface that is disposed over the upper surface of the first ILD layer 206a. The gate electrode layer may be or comprise, for example, polysilicon (e.g., doped polysilicon), a metal (e.g., Al, W, etc.), some other conductive material, or a combination of the foregoing. The gate electrode layer may be multi-layered, for example, comprising a work function metal layer (e.g., TiN, TaN, or the like), a metal fill layer (e.g., W), etc. In some embodiments, the gate electrode layer may be deposited by, for example, CVD, PVD, ALD, electrochemical plating, electroless plating, some other deposition process, or a combination of the foregoing. A planarization process (e.g., CMP) is then performed on the gate electrode layer and the gate dielectric layer to remove upper portions of the gate electrode layer and the gate dielectric layer, thereby forming the gate electrode structures 118 and the gate dielectric structures 120. The planarization process may co-planarize upper surfaces of the first sidewall spacers 202, the gate electrode structures 118, the gate dielectric structures 120, the first ILD layer 206a, and the dummy gate material structures 506.

Figure 29A:
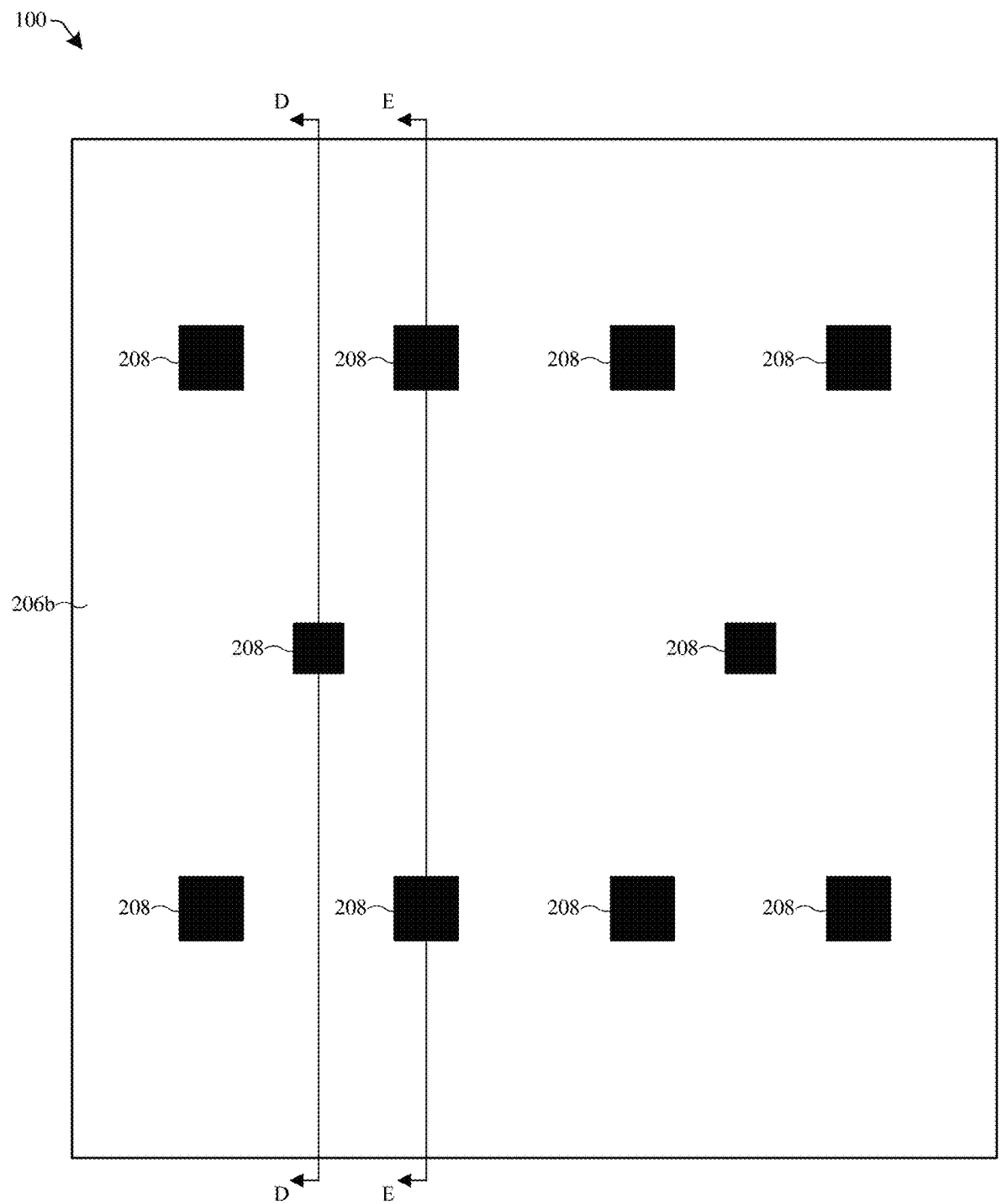
Figure 29B:
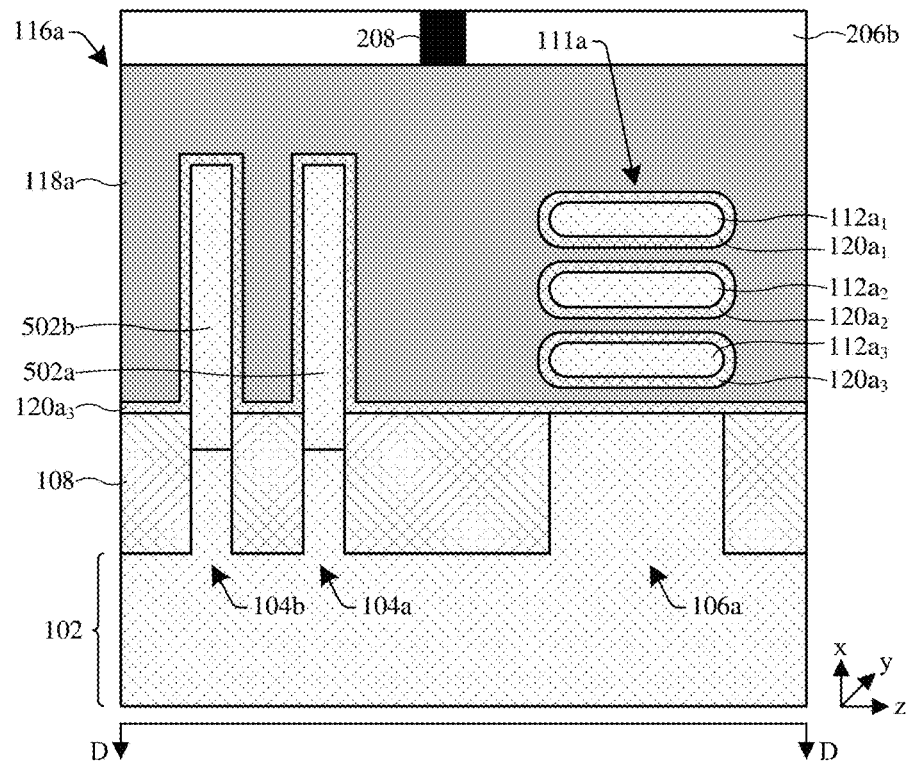
Figure 29C:
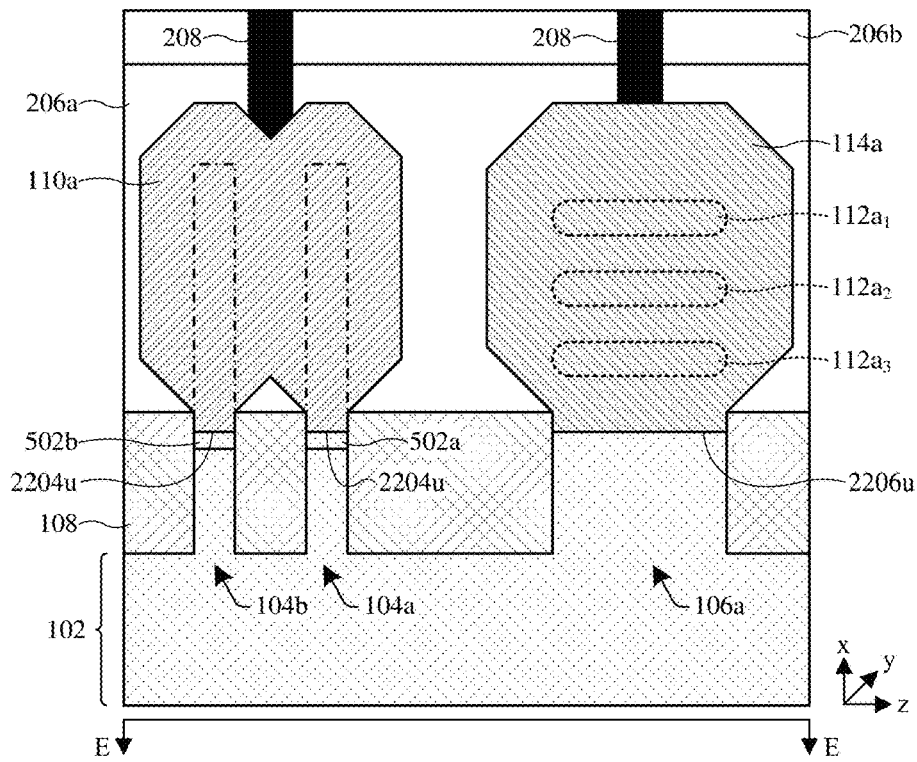

As shown in FIGS. 29A-29C, a second ILD layer 206b is formed over the first ILD layer 206a, the gate structures 116, the dummy gate structures 504, and the first sidewall spacers 202. Further, a plurality of conductive contacts 208 are formed in the first ILD layer 206a and the second ILD layer 206b and over the first source/drain regions 110, the second source/drain regions 114, and the gate structures 116. The conductive contacts 208 are formed extending vertically (in the "x" direction) from the first source/drain regions 110, the second source/drain regions 114, and/or the gate structures 116.

In some embodiments, the conductive contacts 208 are formed extending laterally (in the "z" direction and/or the "y" direction) through the first ILD layer 206a and/or the second ILD layer 206b. For example, some of the conductive contacts of the conductive contacts 208 are formed extending laterally (in the "z" direction) through the first ILD layer 206a, such that the some of the conductive contacts 208 contact (and electrically couple) one or more first source/drain regions 110 and/or one or more second source/drain regions 114. Some other conductive contacts of the conductive contacts 208 may be formed extending laterally (in the "y" direction) through the second ILD layer 206b, such that the some other conductive contacts of the conductive contacts 208 contact (and electrically couple) one or more gate structures 116.

In some embodiments, a process for forming the second ILD layer 206b and the conductive contacts 208 comprises depositing the second ILD layer 206b over the first ILD layer 206a, the gate structures 116, and the first sidewall spacers 202. Thereafter, a plurality of contact openings (or trenches) are formed extending through the second ILD layer 206b and/or the first ILD layer 206a. A conductive material (e.g., W) is then formed on the second ILD layer 206b and in the contact openings (or trenches). Thereafter, a planarization process (e.g., CMP) is performed on the conductive material to form the conductive contacts 208. In further embodiments, none of the conductive contacts 208 are contacting the dummy gate structures 504. While not shown, it will be appreciated that any number of additional ILD layers/structures may be formed over the second ILD layer 206b, and any number of other conductive features (e.g., metal lines, metal vias, etc.) may be formed in the additional ILD layers/structures to form an interconnect structure (e.g., copper interconnect) embedded in an ILD structure 206 that interconnects various semiconductor devices of the IC 100.

FIGS. 26A-26C through 28A-28C illustrate some embodiments of a process comprising the removal of the sixth dummy gate structure 504h and the seventh dummy gate structure 504i, the formation of the first nanostructure stack 111a and the third nanostructure stack 111b, and the formation of a first gate structure 116a and a second gate structure 116b. However, it will be appreciated, that in some embodiments, the first dummy gate structure 504a, the second dummy gate structure 504b, and/or the third dummy gate structure 504c may also be removed (see, e.g., FIGS. 26A-26C). In such embodiments, during the process, the dummy gate structures 504 may be referred to as sacrificial gate structures. For example, the first dummy gate structure 504a is referred to as a first sacrificial gate structure and the sixth dummy gate structure 504h is referred to as a second sacrificial gate structure. In further such embodiments, after the sacrificial gate structures are removed, additional nanostructure stacks may be formed. For example, the second nanostructure stack 111c (see, e.g., FIGS. 5A-5C) may be formed (see, e.g., FIGS. 27A-27C). In further such embodiments, after the additional nanostructures are formed, dummy gate structures comprising similar features (e.g., structural features) as the gate structures 116 may be formed over the additional nanostructure stacks. For example, the first dummy gate structure 504a may be formed comprising similar features as the gate structures 116 and over the second nano structure stack 111c. In further such embodiments, the dummy gate structures may be distinguished from the gate structures 116 due to the dummy gate structures not being electrically coupled to any of the conductive contacts 208 (or any other overlying conductive features of the interconnect structure).

Figure 30:
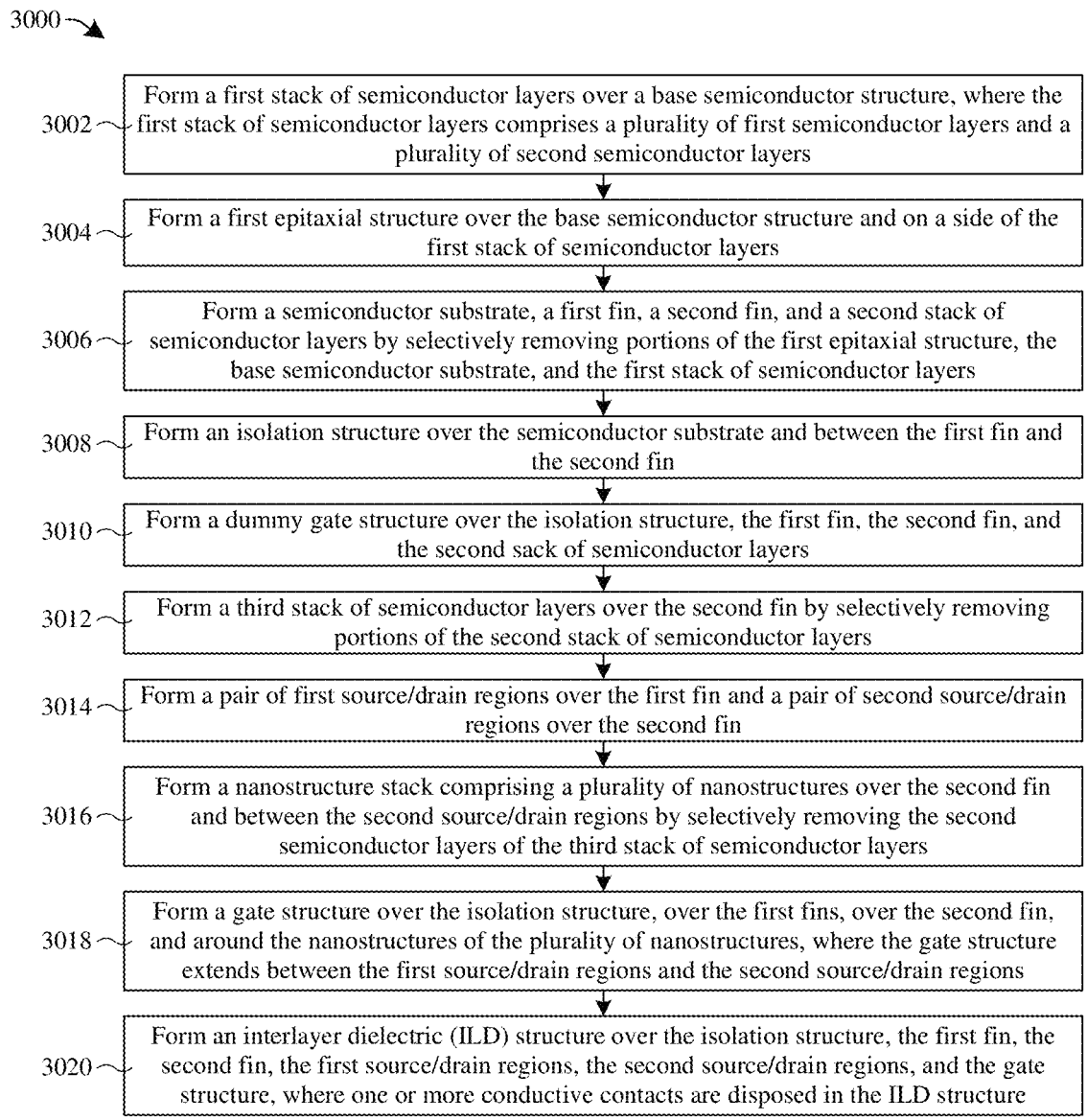
FIG. 30 illustrates a flowchart of some embodiments of a method for forming an integrated chip (IC) comprising a semiconductor device with improved device performance.

FIG. 30 illustrates a flowchart of some embodiments of a method for forming an integrated chip (IC) comprising a semiconductor device with improved device performance. While the flowchart 3000 of FIG. 30 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 3002, a first stack of semiconductor layers is formed over a base semiconductor structure, where the first stack of semiconductor layers comprises a plurality of first semiconductor layers and a plurality of second semiconductor layers. FIGS. 14A-14C through FIGS. 15A-15C illustrate a series of various cross-sectional views of some embodiments corresponding to act 3002.

At act 3004, a first epitaxial structure is formed over the base semiconductor structure and on a side of the first stack of semiconductor layers. FIGS. 16A-16C illustrate various cross-sectional views of some embodiments corresponding to act 3004.

At act 3006, a semiconductor substrate, a first fin, a second fin, and a second stack of semiconductor layers are formed by selectively removing portions of the first epitaxial structure, the base semiconductor substrate, and the first stack of semiconductor layers. FIGS. 17A-17C illustrate various cross-sectional views of some embodiments corresponding to act 3006.

At act 3008, an isolation structure is formed over the semiconductor substrate and between the first fin and the second fin. FIGS. 18A-18C illustrate various cross-sectional views of some embodiments corresponding to act 3008.

At act 3010, a dummy gate structure is formed over the isolation structure, the first fin, the second fin, and the second sack of semiconductor layers. FIGS. 19A-19C illustrate various cross-sectional views of some embodiments corresponding to act 3010.

At act 3012, a third stack of semiconductor layers is formed over the second fin by selectively removing portions of the second stack of semiconductor layers. FIGS. 20A-20C through FIGS. 22A-22C illustrate a series of various cross-sectional views of some embodiments corresponding to act 3012.

At act 3014, a pair of first source/drain regions is formed over the first fin and a pair of second source/drain regions is formed over the second fin. FIGS. 23A-23C through FIGS. 24A-24C illustrate a series of various cross-sectional views of some embodiments corresponding to act 3014.

At act 3016, a nanostructure stack comprising a plurality of nanostructures is formed over the second fin and between the second source/drain regions by selectively removing the second semiconductor layers of the third stack of semiconductor layers. FIGS. 25A-25C through FIGS. 27A-27C illustrate a series of various cross-sectional views of some embodiments corresponding to act 3016.

At act 3018, a gate structure is formed over the isolation structure, over the first fins, over the second fin, and around the nanostructures of the plurality of nanostructures, where the gate structure extends between the first source/drain regions and the second source/drain regions. FIGS. 28A-28C illustrate various cross-sectional views of some embodiments corresponding to act 3018.

At act 3020, an interlayer dielectric (ILD) structure is formed over the isolation structure, the first fin, the second fin, the first source/drain regions, the second source/drain regions, and the gate structure, where one or more conductive contacts are disposed in the ILD structure. FIGS. 29A-29C illustrate various cross-sectional views of some embodiments corresponding to act 3020.

In some embodiments, the present application provides an integrated chip (IC). The IC comprises a first semiconductor fin projecting vertically from a semiconductor substrate. A second semiconductor fin projects vertically from the semiconductor substrate, wherein the second semiconductor fin is spaced from the first semiconductor fin in a first direction, and wherein the first semiconductor fin has a first uppermost surface disposed over a second uppermost surface of the second semiconductor fin. A nanostructure stack is disposed directly over the second semiconductor fin and vertically spaced from the second semiconductor fin, wherein the nanostructure stack comprises a plurality of semiconductor nanostructures that are vertically stacked. A pair of first source/drain regions is disposed on the first semiconductor fin, wherein the first source/drain regions are disposed on opposite sides of an upper portion of the first semiconductor fin. A pair of second source/drain regions is disposed on the second semiconductor fin, wherein the second source/drain regions are disposed on opposite sides of the nanostructure stack.

In some embodiments, the present application provides an integrated chip (IC) The IC comprises an isolation structure disposed over a semiconductor substrate. A first semiconductor fin and a second semiconductor fin project vertically from the semiconductor substrate through the isolation structure, wherein the first semiconductor fin is spaced from the second semiconductor fin, and wherein the first semiconductor fin has a first uppermost surface disposed below a second uppermost surface of the second semiconductor fin. A first semiconductor device is disposed over the semiconductor substrate. The first semiconductor device comprises a first gate-all-around field-effect transistor (GAAFET) and a first fin field-effect transistor (FinFET) disposed over the semiconductor substrate. The first GAAFET comprises: (1) a first pair of first source/drain regions disposed over the first semiconductor fin; and (2) a first nanostructure stack disposed over and vertical spaced from the first semiconductor fin, wherein the first nanostructure stack comprises a first plurality of semiconductor nanostructures that extend laterally between the first source/drain regions of the first pair, and wherein the first plurality of semiconductor nanostructures have a first width. The first FinFET comprises: (1) a second pair of second source/drain regions disposed over the second semiconductor fin; and (2) a first upper portion of the second semiconductor fin that extends laterally between the second source/drain regions of the second pair, wherein the second semiconductor fin has a second width.

In some embodiments, the present application provides method for forming an integrated chip (IC). The method comprises receiving a workpiece comprising a semiconductor substrate, an isolation structure disposed over the semiconductor substrate, a first semiconductor fin projecting vertically through the isolation structure, a second semiconductor fin spaced from the first semiconductor fin and projecting vertically thorough the isolation structure, and a first stack of semiconductor layers disposed directly over the second semiconductor fin, wherein the first stack of semiconductor layers comprises a plurality of first semiconductor layers and a plurality of second semiconductor layers that are different than the first semiconductor layers. A dummy gate structure is formed over the isolation structure, the first semiconductor fin, the second semiconductor fin, and the first stack of semiconductor layers. A second stack of semiconductor layers is formed by removing portions of the first semiconductor layers and portions of the second semiconductor layers that are disposed on opposite sides of the dummy gate structure. A pair of first source/drain regions are formed directly over the first semiconductor fin and on the opposite sides of the dummy gate structure. A pair of second source/drain regions are formed directly over the second semiconductor fin and on the opposite sides of the dummy gate structure. The dummy gate structure is removed from between the first source/drain regions and the second source/drain regions. A nanostructure stack comprising a plurality of semiconductor nanostructures is formed directly over the second semiconductor fin by selectively removing the second semiconductor layers of the second stack of semiconductor layers. A gate structure is formed between the first source/drain regions and the second source/drain regions, wherein the gate structure is formed over the isolation structure, over the first semiconductor fin, over the second semiconductor fin, and around the plurality of semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), the method comprising:

forming a first stack of semiconductor layers over a base semiconductor substrate, wherein the first stack of semiconductor layers has a first portion overlying a first portion of the base semiconductor substrate and a second portion overlying a second portion of the base semiconductor substrate;

removing the first portion of the first stack of semiconductor layers to expose the first portion of the base semiconductor substrate;

forming a semiconductor structure over the first portion of the base semiconductor substrate and along a side of the second portion of the first stack of semiconductor layers, wherein forming the semiconductor structure comprises epitaxially growing the semiconductor structure from the first portion of the base semiconductor substrate;

forming a fin field-effect transistor (FinFET) over the first portion of the base semiconductor substrate, wherein forming the FinFET comprises:
    etching the semiconductor structure and the first portion of the base semiconductor substrate to form a first semiconductor fin; and forming a gate-all-around field-effect transistor (GAAFET) over the second portion of the base semiconductor substrate, wherein forming the GAAFET comprises:
    etching the second portion of the first stack of semiconductor layers and the second portion of the base semiconductor substrate to form a second semiconductor fin laterally spaced from the first semiconductor fin.

2. The method of claim 1, wherein:

forming the FinFET further comprises forming a pair of first source/drain regions on the first semiconductor fin; and forming the GAAFET further comprises forming a pair of second source/drain regions on the second semiconductor fin.

3. The method of claim 2, wherein forming the FinFET and forming the GAAFET further comprises:

forming a gate structure that extends laterally in a first direction over both the first semiconductor fin and the second semiconductor fin, wherein the gate structure extends laterally in the first direction between the first source/drain regions and between the second source/drain regions.

4. The method of claim 3, wherein forming the GAAFET further comprises:

after the second source/drain regions are formed, forming a plurality of nanostructures that extend laterally between the second source/drain regions in a second direction that is perpendicular to the first direction.

5. The method of claim 4, wherein forming the gate structure comprises:

depositing a gate dielectric layer on the first semiconductor fin, the second semiconductor fin, and on the plurality of nanostructures; and depositing a gate electrode layer over the gate dielectric layer and around the plurality of nanostructures.

6. The method of claim 1, wherein forming the first stack of semiconductor layers over the base semiconductor substrate comprises:

forming a plurality of first semiconductor layers and a plurality of second semiconductor layers over the base semiconductor substrate, wherein the plurality of first semiconductor layers and the plurality of second semiconductor layers are formed vertically stacked in an alternating manner, wherein the base semiconductor substrate and the semiconductor structure both have a first lattice orientation, and wherein the plurality of second semiconductor layers have a second lattice orientation different than the first lattice orientation.

7. The method of claim 1, wherein forming the first stack of semiconductor layers over the base semiconductor substrate comprises:
forming a plurality of first semiconductor layers and a plurality of second semiconductor layers over the base semiconductor substrate, wherein the plurality of first semiconductor layers and the plurality of second semiconductor layers are formed vertically stacked in an alternating manner, wherein the base semiconductor substrate has a first lattice orientation, wherein the plurality of second semiconductor layers have the first lattice orientation, and wherein the semiconductor structure has a second lattice orientation different than the first lattice orientation.

8. A method for forming an integrated chip (IC), the method comprising:
forming a first stack of semiconductor layers over a base semiconductor substrate, wherein the first stack of semiconductor layers are formed with a first portion overlying a first portion of the base semiconductor substrate and a second portion overlying a second portion of the base semiconductor substrate;
removing the first portion of the first stack of semiconductor layers;
forming a semiconductor structure over the first portion of the base semiconductor substrate;
forming a first semiconductor fin by etching the semiconductor structure and the first portion of the base semiconductor substrate;
forming a second stack of semiconductor layers and a second semiconductor fin by etching the second portion of the first stack of semiconductor layers and the second portion of the base semiconductor substrate, wherein the second stack of semiconductor layers overlies the second semiconductor fin;
etching the second stack of semiconductor layers to form a third stack of semiconductor layers over the second semiconductor fin;
forming a first pair of source/drain regions on opposite sides of the first semiconductor fin; and
forming a second pair of source/drain regions on opposite sides of the third stack of semiconductor layers.

9. The method of claim 8, wherein:
the base semiconductor substrate has a first lattice orientation;
the semiconductor structure is formed with the first lattice orientation;
the first stack of semiconductor layers comprises one or more first semiconductor layers and one or more second semiconductor layers; and
the one or more second semiconductor layers are formed with a second lattice orientation different than the first lattice orientation.

10. The method of claim 8, wherein the semiconductor structure is formed via an epitaxial process.

11. The method of claim 10, wherein:
removing the first portion of the first stack of semiconductor layers exposes a first upper surface of the base semiconductor substrate; and
the epitaxial process comprises growing the semiconductor structure from the first upper surface of the base semiconductor substrate.

12. The method of claim 11, wherein the first upper surface of the base semiconductor substrate is disposed vertically between a second upper surface of the base semiconductor substrate and a lower surface of the base semiconductor substrate.

13. The method of claim 8, wherein forming the first stack of semiconductor layers comprises forming alternating layers of a first semiconductor material and a second semiconductor material over the base semiconductor substrate, and wherein the semiconductor layers of the first stack of semiconductor layers extend continuously laterally over both the first portion of the base semiconductor substrate and the second portion of the base semiconductor substrate.

14. The method of claim 13, wherein forming the first stack of semiconductor layers comprises epitaxially growing a first layer of the alternating layers from the base semiconductor substrate, wherein the first layer of the alternating layers has the first semiconductor material, and wherein the first semiconductor material has a different chemical composition than the base semiconductor substrate.

15. The method of claim 8, wherein:
the first semiconductor fin is formed with a first width; and
the second semiconductor fin is formed with a second width different than the first width.

16. The method of claim 8, further comprising:
performing a planarization process on the semiconductor structure to co-planarize an uppermost surface of the semiconductor structure and an uppermost surface of the second portion of the first stack of semiconductor layers.

17. The method of claim 8, wherein the semiconductor structure is formed after the first portion of the first stack of semiconductor layers is removed.

18. A method for forming an integrated chip (IC), the method comprising:
receiving a workpiece comprising a semiconductor substrate, an isolation structure disposed over the semiconductor substrate, a first semiconductor fin projecting vertically through the isolation structure, a second semiconductor fin spaced from the first semiconductor fin and projecting vertically thorough the isolation structure, and a first stack of semiconductor layers disposed directly over the second semiconductor fin, wherein the first stack of semiconductor layers comprises a plurality of first semiconductor layers and a plurality of second semiconductor layers that are different than the first semiconductor layers;
forming a dummy gate structure over the isolation structure, the first semiconductor fin, the second semiconductor fin, and the first stack of semiconductor layers, wherein the dummy gate structure is continuous from directly over the first semiconductor fin to directly over the second semiconductor fin;
forming a second stack of semiconductor layers by removing portions of the first semiconductor layers and portions of the second semiconductor layers that are disposed on opposite sides of the dummy gate structure;
forming a pair of first source/drain regions over the first semiconductor fin and on the opposite sides of the dummy gate structure;
forming a pair of second source/drain regions over the second semiconductor fin and on the opposite sides of the dummy gate structure;

removing the dummy gate structure from between the first source/drain regions and the second source/drain regions;

forming a nanostructure stack comprising a plurality of semiconductor nanostructures directly over the second semiconductor fin by selectively removing the second semiconductor layers of the second stack of semiconductor layers; and forming a gate structure between the first source/drain regions and the second source/drain regions, wherein the gate structure is formed over the isolation structure, over the first semiconductor fin, over the second semiconductor fin, and around the plurality of semiconductor nanostructures.

19. The method of claim 18, wherein:

the semiconductor substrate has a first lattice orientation;

the second semiconductor fin has the first lattice orientation; and the plurality of first semiconductor layers have the first lattice orientation; and the first semiconductor fin has a second lattice orientation different than the first lattice orientation.

20. The method of claim 18, wherein forming the gate structure comprises:

depositing a gate dielectric layer lining the isolation structure, the first semiconductor fin, the second semiconductor fin, and the plurality of semiconductor nanostructures.

\* \* \* \* \*